US012751040B2

(12) United States Patent
Chou et al.

(10) Patent No.: US 12,751,040 B2
(45) Date of Patent: Sep. 29, 2026

(54) CONTACT PLUG STRUCTURE OF SEMICONDUCTOR DEVICE AND METHOD OF FORMING SAME

(71) Applicant: Taiwan Semiconductor Manufacturing Co., Ltd., Hsinchu (TW)

(72) Inventors: Pei-Yu Chou, Hsinchu (TW); Jr-Hung Li, Chupei (TW); Tze-Liang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 519 days.

(21) Appl. No.: 18/366,469

(22) Filed: Aug. 7, 2023

(65) Prior Publication Data

US 2023/0387228 A1 Nov. 30, 2023

Related U.S. Application Data

(62) Division of application No. 17/193,626, filed on Mar. 5, 2021, now Pat. No. 11,894,435.

(Continued)

(51) Int. Cl.

*H10W 10/17* (2026.01)
*H10D 30/62* (2025.01)

(Continued)

(52) U.S. Cl.

CPC ..... *H10D 30/6219* (2025.01); *H10D 30/6211* (2025.01); *H10D 64/01* (2025.01);

(Continued)

(58) Field of Classification Search

CPC .......... H10D 30/6219; H10D 30/6211; H10D 64/01; H10D 84/0158; H10D 30/024;

(Continued)

(56) References Cited

U.S. PATENT DOCUMENTS 9,105,490 B2 8/2015 Wang et al.
9,236,267 B2 1/2016 De et al.

(Continued)

FOREIGN PATENT DOCUMENTS

CN 101661936 A 3/2010
CN 107154383 A 9/2017

(Continued)

*Primary Examiner* — Theresa T Doan

(74) *Attorney, Agent, or Firm* — Slater Matsil, LLP

(57) ABSTRACT

A semiconductor device a method of forming the same are provided. A semiconductor device includes a gate stack over a substrate. A first dielectric layer is over the gate stack. The first dielectric layer includes a first material. A second dielectric layer is over the first dielectric layer. The second dielectric layer includes a second material different from the first material. A first conductive feature is adjacent the gate stack. A second conductive feature is over and in physical contact with a topmost surface of the first conductive feature. A bottommost surface of the second conductive feature is in physical contact with a topmost surface of the second dielectric layer.

20 Claims, 62 Drawing Sheets

Related U.S. Application Data

(60) Provisional application No. 63/091,971, filed on Oct. 15, 2020.

(51) Int. Cl.
*H10D 64/01* (2025.01)
*H10W 20/00* (2026.01)
*H10W 20/20* (2026.01)

(52) U.S. Cl.
CPC ....... *H10W 20/069* (2026.01); *H10W 20/075* (2026.01); *H10W 20/20* (2026.01)

(58) Field of Classification Search
CPC .... H10D 30/62; H10D 84/038; H10D 84/834; H10D 84/0186; H10D 84/0193; H10D 84/853; H10D 84/013; H10D 84/0135; H10D 84/0149; H10W 20/069; H10W 20/075; H10W 20/20; H01L 23/485; H01L 21/28518; H01L 21/76816; H01L 21/76895; H01L 23/5226; H01L 21/76897; H01L 21/76832
USPC .......................................................... 257/288
See application file for complete search history.

(56) References Cited

U.S. PATENT DOCUMENTS

| | | | |
|---|---|---|---|
| 9,236,300 B2 | 1/2016 | Liaw | |
| 9,391,204 B1 | 7/2016 | Cheng et al. | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,741,671 B2 | 8/2020 | Lo et al. | |
| 2010/0052075 A1 | 3/2010 | Yeh et al. | |
| 2015/0364326 A1 | 12/2015 | Xie et al. | |
| 2016/0284705 A1 | 9/2016 | Chung | |
| 2016/0308008 A1 | 10/2016 | Yeo et al. | |
| 2017/0256568 A1 | 9/2017 | Shen et al. | |
| 2018/0175165 A1 | 6/2018 | Lim et al. | |
| 2018/0350662 A1 | 12/2018 | You et al. | |
| 2019/0148226 A1 | 5/2019 | Yim et al. | |
| 2019/0165132 A1 | 5/2019 | Lo et al. | |
| 2020/0035796 A1 | 1/2020 | Lee et al. | |
| 2020/0335336 A1* | 10/2020 | Leobandung | H01L 21/76834 |

FOREIGN PATENT DOCUMENTS

| | | | |
|---|---|---|---|
| CN | 107275281 | A | 10/2017 |
| KR | 20010042223 | A | 5/2001 |
| KR | 20080064309 | A | 7/2008 |
| KR | 20160044406 | A | 4/2016 |
| KR | 20160122909 | A | 10/2016 |
| KR | 20170112941 | A | 10/2017 |
| KR | 20180069673 | A | 6/2018 |
| KR | 20190056163 | A | 5/2019 |
| KR | 20190064376 | A | 6/2019 |
| WO | 9949508 | A1 | 9/1999 |

* cited by examiner

CONTACT PLUG STRUCTURE OF SEMICONDUCTOR DEVICE AND METHOD OF FORMING SAME

PRIORITY CLAIM AND CROSS-REFERENCE

This application is a divisional of U.S. patent application Ser. No. 17/193,626, filed on Mar. 5, 2021, now U.S. Pat. No. 11,894,435 issued Feb. 6, 2024, which claims the benefit of U.S. Provisional Application No. 63/091,971, filed on Oct. 15, 2020, each application is hereby incorporated herein by reference

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
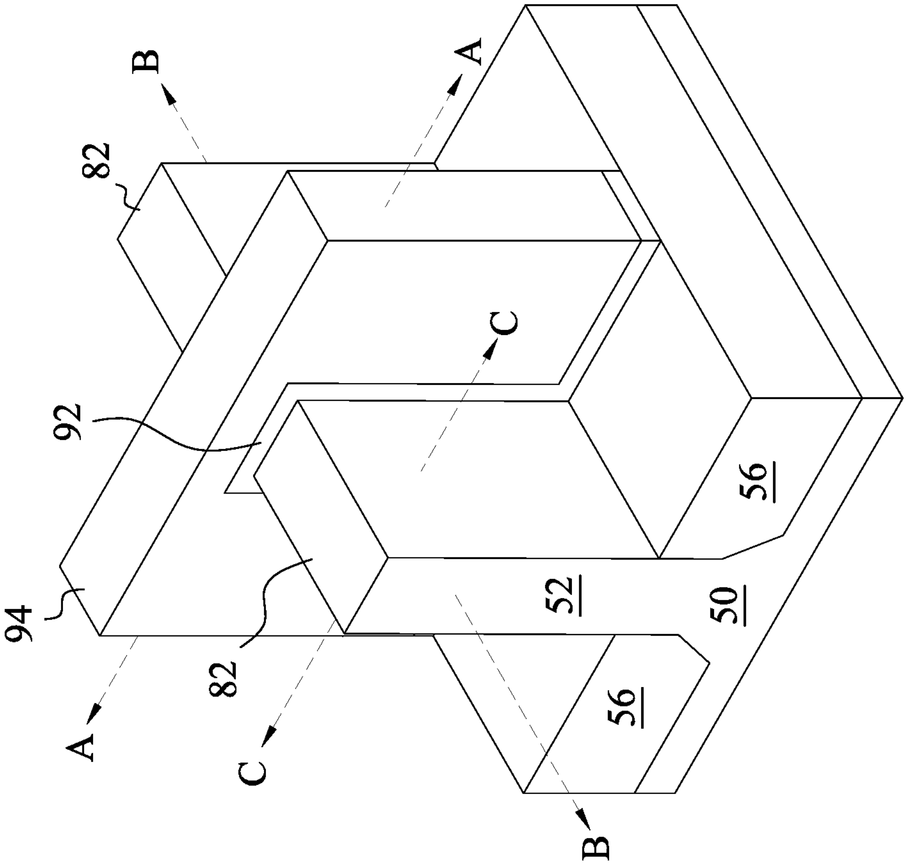
FIG. 1 illustrates an example of a FinFET in a three-dimensional view in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a contact plug structure of a semiconductor device and a method of forming the same. Various embodiments presented herein are discussed in the context of a fin field effect transistor (FinFET) device formed using a gate-last process. In other embodiments, a gate-first process may be used. Various embodiments may be applied, however, to dies comprising other types of transistors (e.g., planar transistors, gate-all-around (GAA) transistors, or the like) in lieu of or in combination with the FinFETs. In some embodiments, a plurality of dielectric layers comprising different dielectric materials are formed over gate stacks of a semiconductor device. The plurality of dielectric layers allow for forming source/drain contact plugs, such that a leakage between the source/drain contact plugs and adjacent gate stacks are reduced. By using the plurality of dielectric layers during the formation of source/drain contact plugs, various embodiments discussed herein allow for improving electrical performance of a semiconductor device, choosing different schemes for the plurality of dielectric layers based on different application requirements for a semiconductor device, and enlarging etch and lithography process windows for forming the source/drain contact plugs.

FIG. 1 illustrates an example of a FinFET in a three-dimensional view in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and the gate electrode 94. FIG. 1 further illustrates reference cross-sections that are used in later figures. Cross-section A-A is along a longitudinal axis of the gate electrode 94 and in a direction, for example, perpendicular to a direction of a current flow between the source/drain regions 82 of the FinFET. Cross-section B-B is perpendicular to cross-section A-A and is along a longitudinal axis of the fin 52 and in a direction of, for example, the current flow between the source/drain regions 82 of the FinFET. Cross-section C-C is parallel to cross-section A-A and extends through the source/drain region 82 of the FinFET. Subsequent figures refer to these reference cross-sections for clarity.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15A, 15B, 16A, 16B, 17A, 17B, 18A, 18B, 19A, 19B, 20A, 20B, 21A, 21B, 21C, 22A, 22B, 22C, 23A, 23B, 23C, 24A, 24B, 24C, 25A, 25B, 25C, 26A, 26B, 27A, 27B, 28A, 28B, 29A, and 29B are top and cross-sectional views of intermediate stages in the manufacturing of a FinFET device 1000 in accordance with some embodiments. FIGS. 2 through 7 illustrate cross-sectional views along the reference cross-section A-A illustrated in FIG. 1, except for multiple fins/FinFETs. FIGS. 8A-29A are illustrated along the reference cross-section A-A illustrated in FIG. 1, except for multiple fins/FinFETs. FIGS. 8B-29B and 14C are illustrated along the reference cross-section B-B illustrated in FIG. 1, except for multiple gates. FIGS. 10C and 10D are illustrated along the reference cross-section C-C illustrated in FIG. 1, except for multiple fins/FinFETs. FIGS. 21C-25C illustrate top views.

Figure 2:
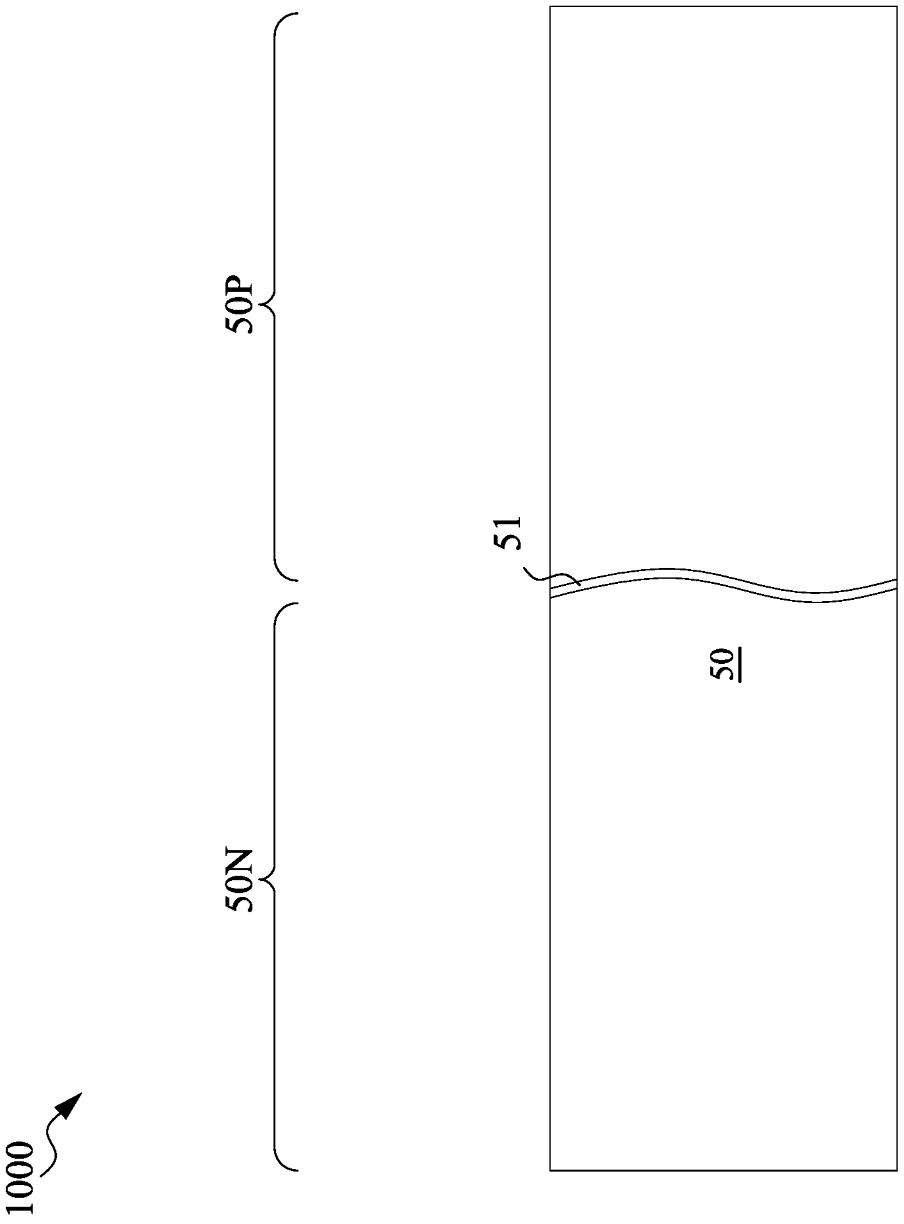
FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15A, 15B, 16A, 16B, 17A, 17B, 18A, 18B, 19A, 19B, 20A, 20B, 21A, 21B, 21C, 22A, 22B, 22C, 23A, 23B, 23C, 24A, 24B, 24C, 25A, 25B, 25C, 26A, 26B, 27A, 27B, 28A, 28B, 29A, and 29B are top and cross-sectional views of intermediate stages in the manufacturing of a FinFET device in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by a divider 51), and any number of device features (e.g., other active devices, doped regions, isolation structures, etc.) may be disposed between the region 50N and the region 50P.

Figure 3:
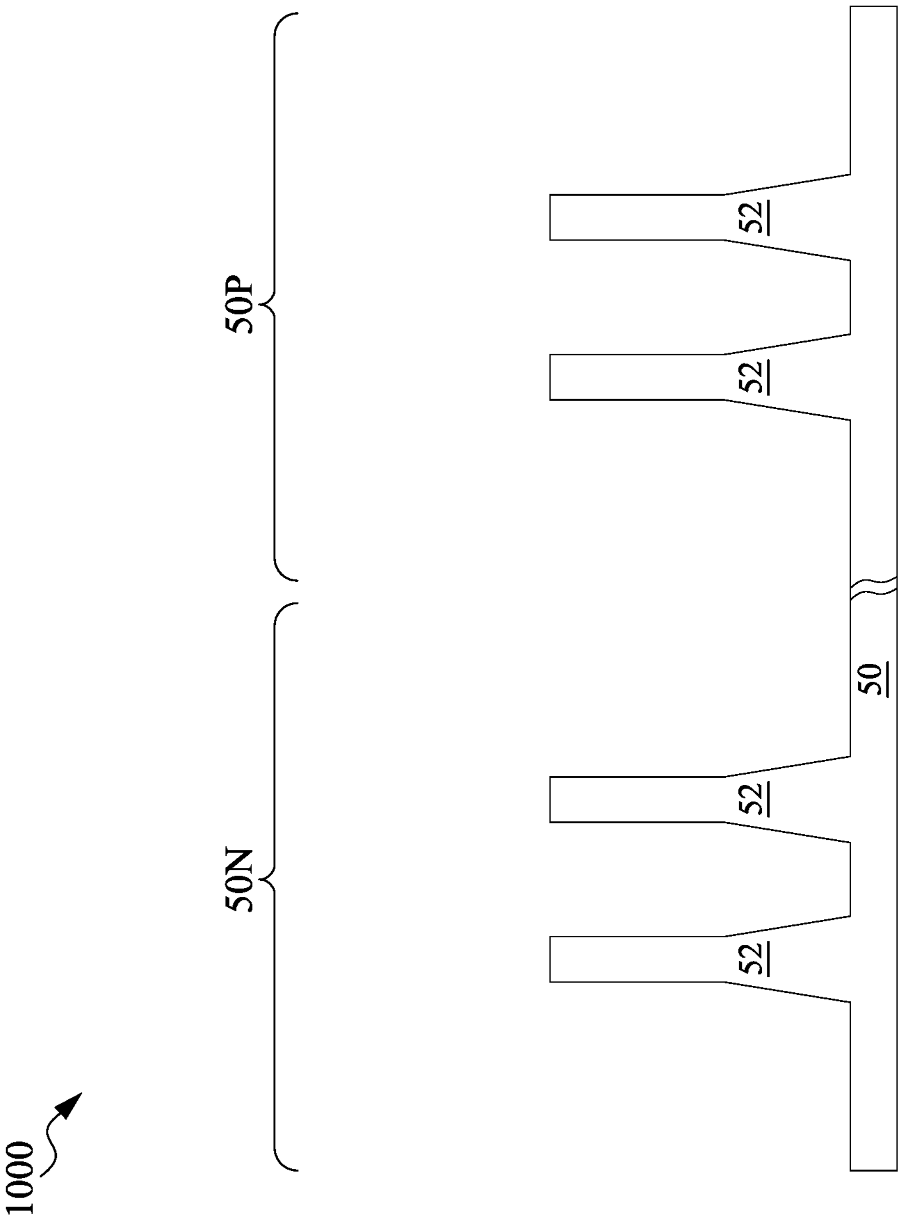

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), a combination thereof, or the like. The etch process may be anisotropic.

The fins 52 may be formed by any suitable method. For example, the fins 52 may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 50 and patterned using a photolithography process. Spacers are formed alongside the patterned sacrificial layer using a self-aligned process. The sacrificial layer is then removed, and the remaining spacers may then be used as a mask to form the fins 52.

Figure 4:
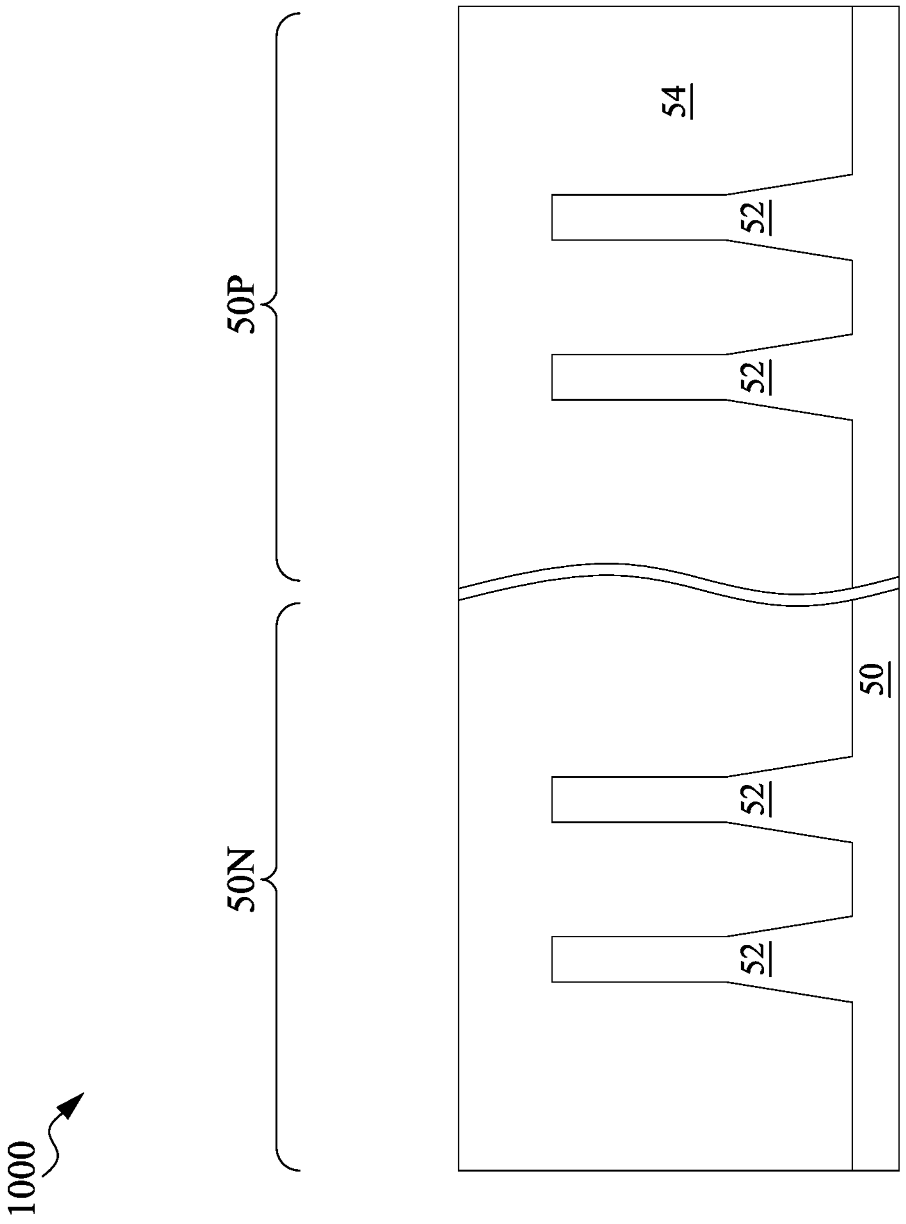

In FIG. 4, an insulation material 54 is formed over the substrate 50 and between neighboring fins 52. The insulation material 54 may be an oxide, such as silicon oxide, a nitride, a combination thereof, or the like, and may be formed by a high density plasma chemical vapor deposition (HDP-CVD), a flowable CVD (FCVD) (e.g., a CVD-based material deposition in a remote plasma system and post curing to make it convert to another material, such as an oxide), a combination thereof, or the like. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments, a liner (not shown) may first be formed along surfaces of the substrate 50 and the fins 52. Thereafter, a fill material, such as those discussed above may be formed over the liner.

Figure 5:
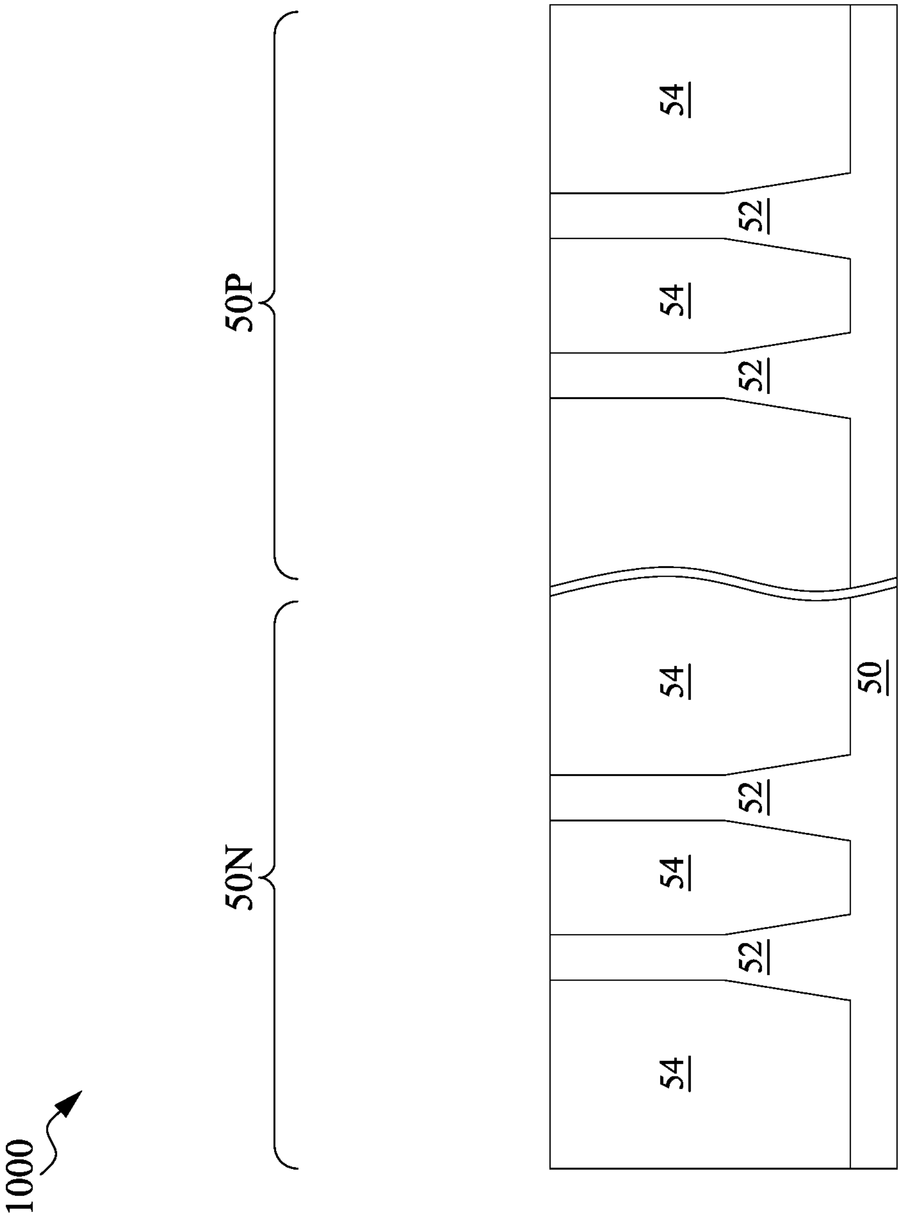

In FIG. 5, a removal process is applied to the insulation material 54 to remove excess portions of the insulation material 54 over the fins 52. In some embodiments, a planarization process, such as a chemical mechanical polish (CMP) process, an etch back process, a combination thereof, or the like, may be utilized. The planarization process exposes the fins 52, such that top surfaces of the fins 52 and the top surface of the insulation material 54 are substantially coplanar or level (within process variations of the planarization process) after the planarization process is completed.

Figure 6:
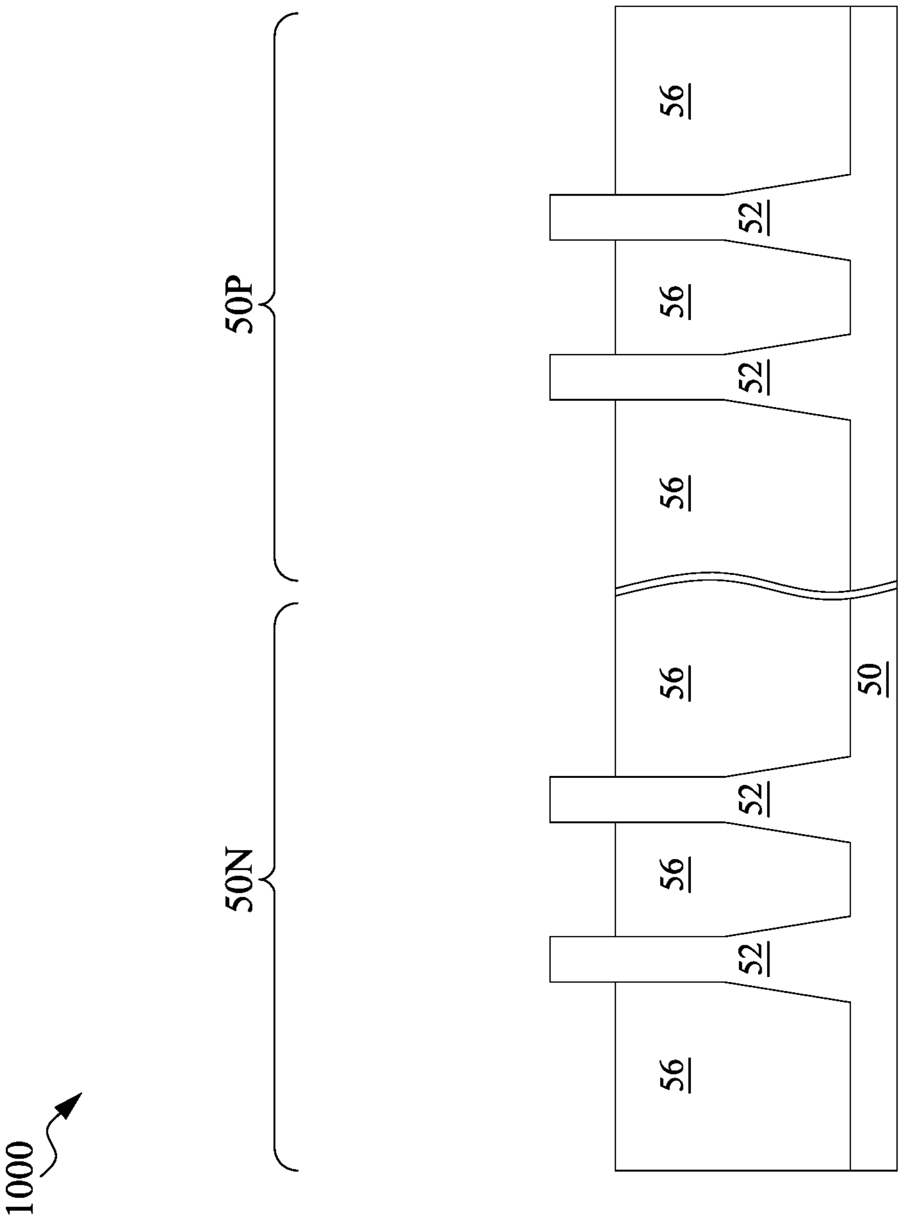

In FIG. 6, the insulation material 54 (see FIG. 5) is recessed to form shallow trench isolation (STI) regions 56. The insulation material 54 is recessed such that upper portions of fins 52 in the regions 50N and 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 5*o*, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins. For example, the fins 52 in FIG. 5 can be recessed, and a material different from the fins 52 may be epitaxially grown over the recessed fins 52. In such embodiments, the fins comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins. In some embodiments where homoepitaxial or heteroepitaxial structures are epitaxially grown, the epitaxially grown materials may be in situ doped during growth, which may obviate prior and subsequent implantations, although in situ and implantation doping may be used together.

Still further, it may be advantageous to epitaxially grow a material in the region 50N different from a material in the region 50P. In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P. In the embodiments with different well types, the different implant steps for the region 50N and the region 50P may be achieved using a photoresist or other masks (not shown). For example, a first photoresist may be formed over the fins 52 and the STI regions 56 in both the region 50N and the region 50P. The first photoresist is patterned to expose the region 50P of the substrate 50. The first photoresist can be formed by using a spin-on technique and can be patterned using acceptable photolithography techniques. Once the first photoresist is patterned, an n-type impurity implantation is performed in the region 50P, while the remaining portion of the first photoresist acts as a mask to substantially prevent n-type impurities from being implanted into the region 50N. The n-type impurities may be phosphorus, arsenic, antimony, or the like, implanted in the region 50P to a dose of equal to or less than $10^{15}$ $cm^{-2}$, such as between about $10^{12}$ $cm^{-2}$ and about $10^{15}$ $cm^{-2}$. In some embodiments, the n-type impurities may be implanted at an implantation energy of about 1 keV to about 10 keV. After the implantation, the first photoresist is removed, such as by an acceptable ashing process followed by a wet clean process.

Following the implantation of the region 50P, a second photoresist is formed over the fins 52 and the STI regions 56 in both the region 50P and the region 50N. The second photoresist is patterned to expose the region 50N of the substrate 50. The second photoresist can be formed by using a spin-on technique and can be patterned using acceptable photolithography techniques. Once the second photoresist is patterned, a p-type impurity implantation may be performed in the region 50N, while the remaining portion of the second photoresist acts as a mask to substantially prevent p-type impurities from being implanted into the region 50P. The p-type impurities may be boron, $BF_2$, indium, or the like, implanted in the region 50N to a dose of equal to or less than $10^{15}$ $cm^{-2}$, such as between about $10^{12}$ $cm^{-2}$ and about $10^{15}$ $cm^{-2}$. In some embodiments, the p-type impurities may be implanted at an implantation energy of about 1 keV to about 10 keV. After the implantation, the second photoresist may be removed, such as by an acceptable ashing process followed by a wet clean process.

After performing the implantations of the region 50N and the region 50P, an anneal process may be performed to activate the p-type and/or n-type impurities that were implanted. In some embodiments, the grown materials of epitaxial fins may be in situ doped during growth, which may obviate the implantations, although in situ doping and implantation doping may be used together.

Figure 7:
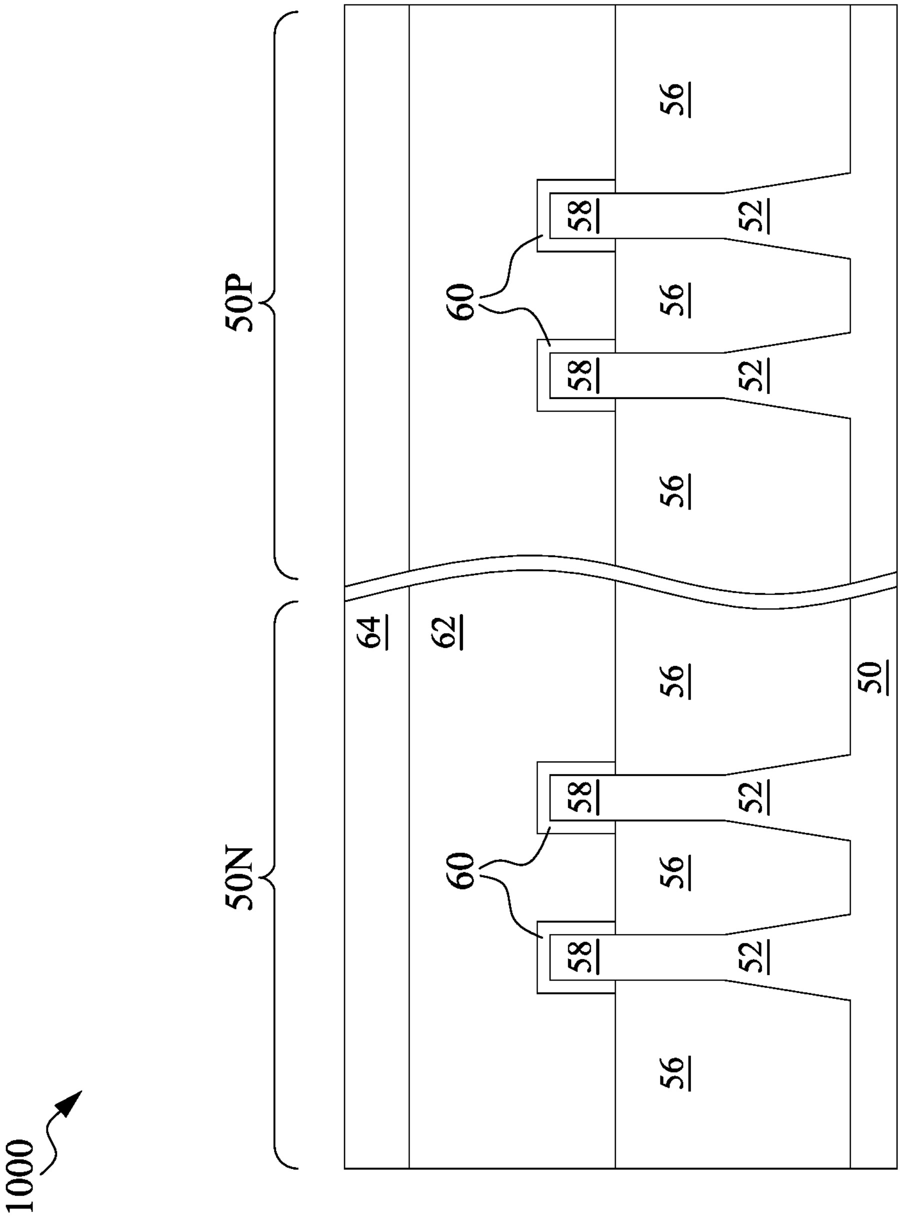

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized using, for example, a CMP process. The mask layer 64 may be deposited over the dummy gate layer 62. The dummy gate layer 62 may be a conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity than materials of the STI regions 56. The mask layer 64 may include, for example, one or more layers of silicon oxide, SiN, SiON, a combination thereof, or the like. In some embodiments, the mask layer 64 may comprise a layer of silicon nitride and a layer of silicon oxide over the layer of silicon nitride. In some embodiments, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8B, 9A, 9B, 10A, 10B, 10C, 10D, 11A, 11B, 12A, 12B, 13A, 13B, 14A, 14B, 14C, 15A, 15B, 16A, 16B, 17A, 17B, 18A, 18B, 19A, 19B, 20A, 20B, 21A, 21B, 21C, 22A, 22B, 22C, 23A, 23B, 23C, 24A, 24B, 24C, 25A, 25B, 25C, 26A, 26B, 27A, 27B, 28A, 28B, 29A, and 29B illustrate various additional steps in the manufacturing of a FinFET device in accordance with some embodiments. FIGS. 8B, 9A, 9B, 10A, 10B, 10C, 10D, 11A, 11B, 12A, 12B, 13A, 13B, 14A, 14B, 14C, 15A, 15B, 16A, 16B, 17A, 17B, 18A, 18B, 19A, 19B, 20A, 20B, 21A, 21B, 21C, 22A, 22B, 22C, 23A, 23B, 23C, 24A, 24B, 24C, 25A, 25B, 25C, 26A, 26B, 27A, 27B, 28A, 28B, 29A, and 29B illustrate features in either of the region 50N and the region 50P. For example, the structures illustrated in FIGS. 8B, 9A, 9B, 10A, 10B, 10C, 10D, 11A, 11B, 12A, 12B, 13A, 13B, 14A, 14B, 14C, 15A, 15B, 16A, 16B, 17A, 17B, 18A, 18B, 19A, 19B, 20A, 20B, 21A, 21B, 21C, 22A, 22B, 22C, 23A, 23B, 23C, 24A, 24B, 24C, 25A, 25B, 25C, 26A, 26B, 27A, 27B, 28A, 28B, 29A, and 29B may be applicable to both the region 50N and the region 50P. Differences (if any) in the structures of the region 50N and the region 50P are described in the text accompanying each figure.

Figure 8B:
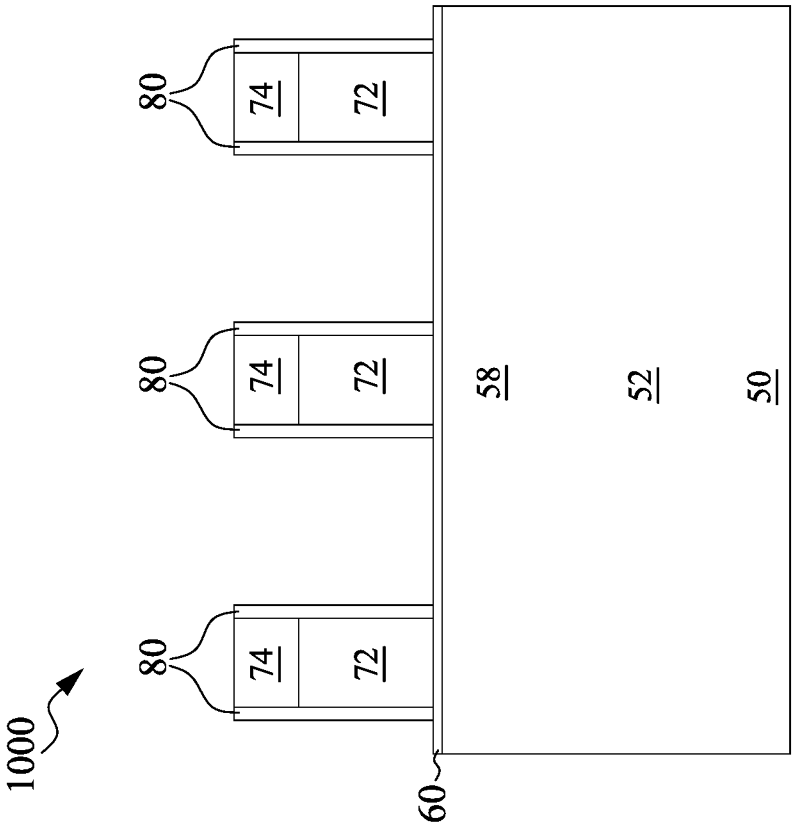
Figure 8A:
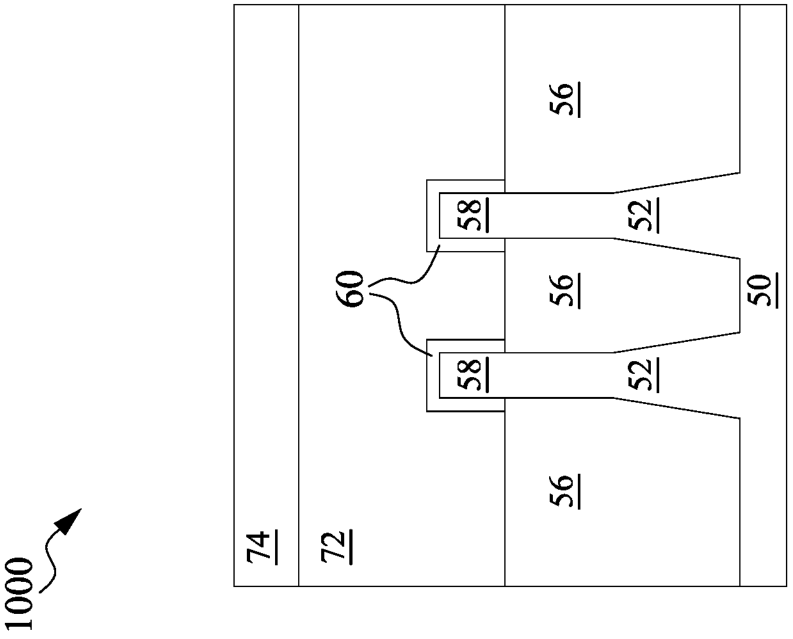

In FIGS. 8A and 8B, the mask layer 64 (see FIG. 7) may be patterned using acceptable photolithography and etching techniques to form masks 74. In some embodiments, the etching techniques may include one or more anisotropic etch processes, such as a reactive ion etch (RIE), neutral beam etch (NBE), a combination thereof, or the like. Subsequently, the pattern of the masks 74 may be transferred to the dummy gate layer 62 (see FIG. 7) to form dummy gates 72. In some embodiments, the pattern of the masks 74 may also be transferred to the dummy dielectric layer 60 by an acceptable etching technique. The dummy gates 72 cover channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective one of the fins 52. As described below in greater detail, the dummy gates 72 are sacrificial gates and are subsequently replaced by replacement gates. Accordingly, dummy gates 72 may also be referred to as sacrificial gates. In other embodiments, some of the dummy gates 72 are not replaced and remain in the final structure of the FinFET device 1000.

Further in FIGS. 8A and 8B, gate seal spacers 80 may be formed on exposed surfaces of the dummy gates 72, the masks 74, and/or the fins 52. A thermal oxidation or a deposition followed by an anisotropic etch may form the gate seal spacers 80. The gate seal spacers 80 may comprise silicon oxide, silicon nitride, SiCN, SiOC, SiOCN, a combination thereof, or the like. After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P, while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a dose of impurities of from about $10^{12}$ $cm^{-2}$ to about $10^{16}$ $cm^{-2}$. In some embodiments, the suitable impurities may be implanted at an implantation energy of about 1 keV to about 10 keV. An anneal may be used to activate the implanted impurities.

Figure 9B:
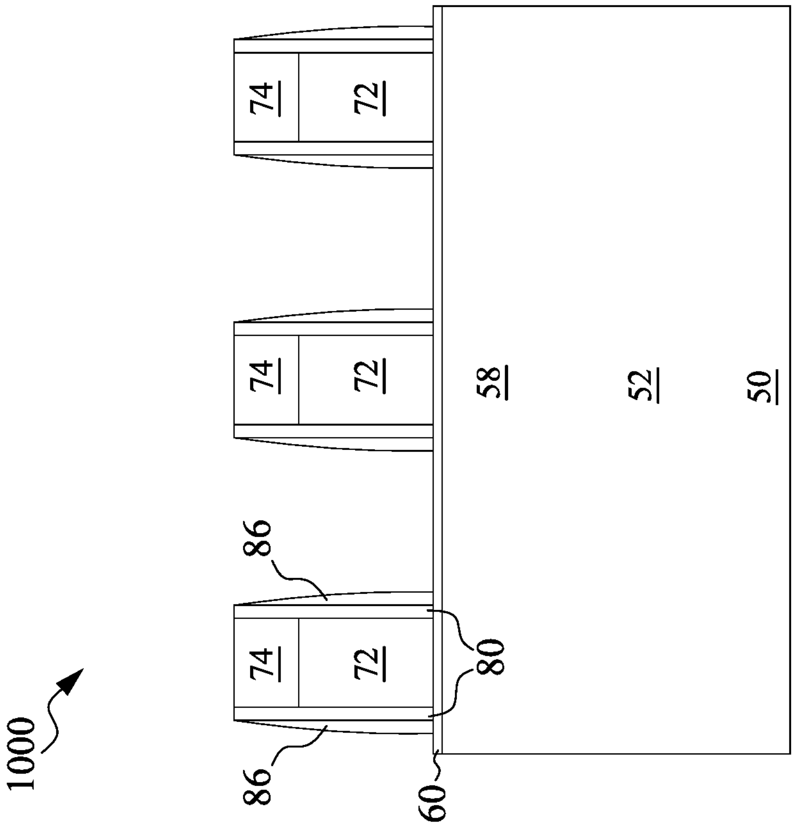
Figure 9A:
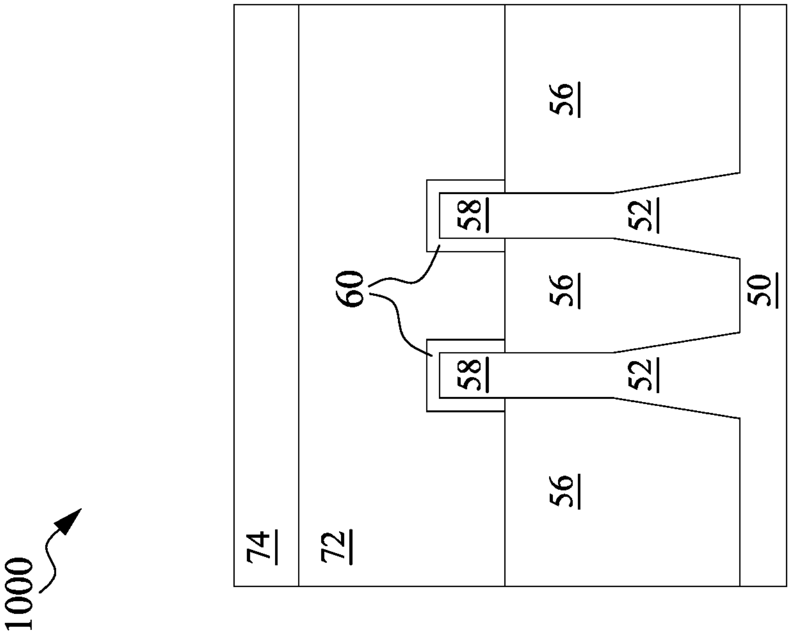

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may comprise silicon oxide, silicon nitride, SiCN, SiOC, SiOCN, a combination thereof, or the like. In some embodiments, the gate spacers 86 may comprise a plurality of layers (not shown), such that the layers comprise different materials.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
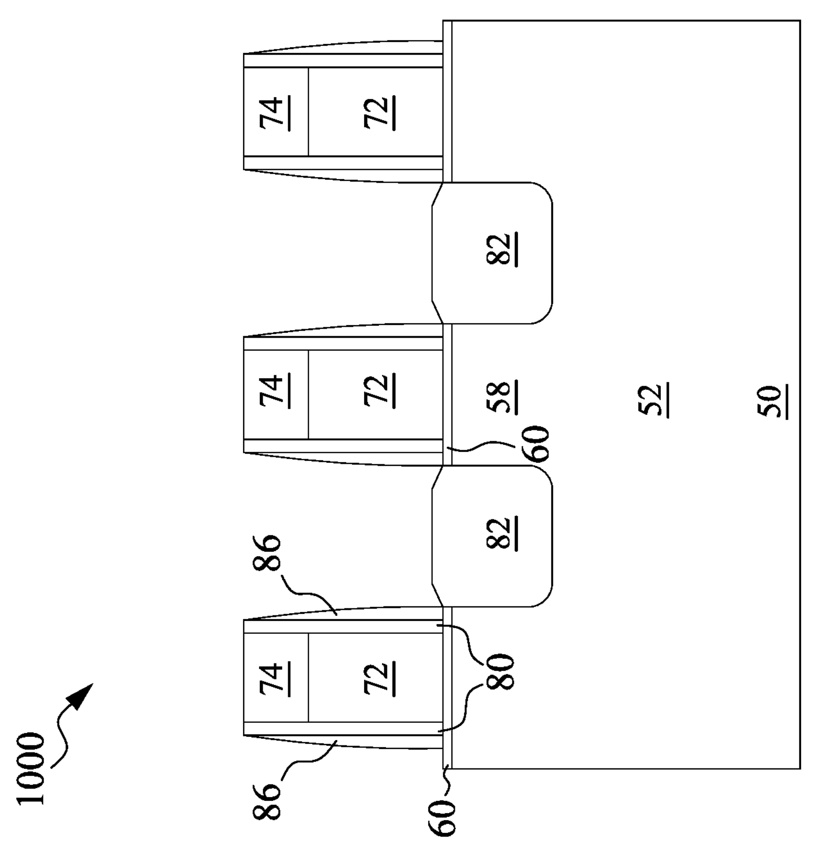
Figure 10A:
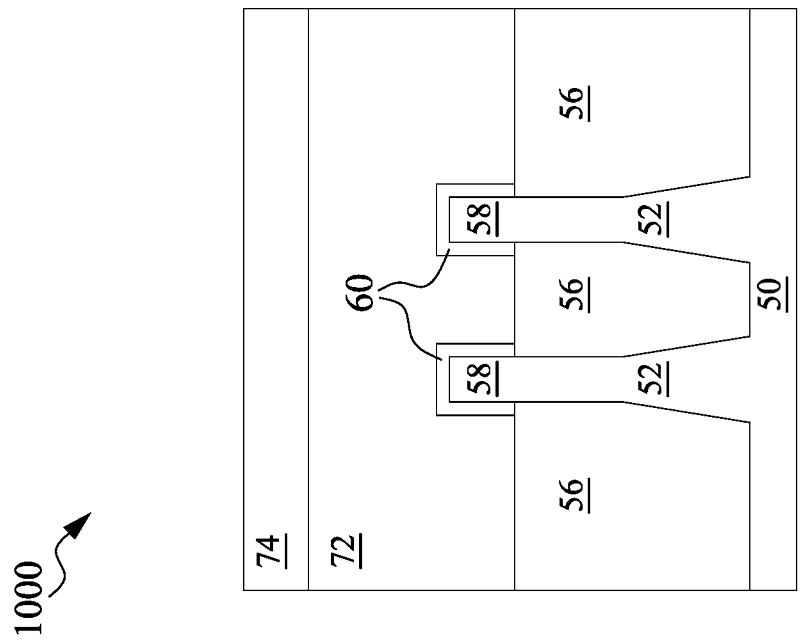
Figure 10D:
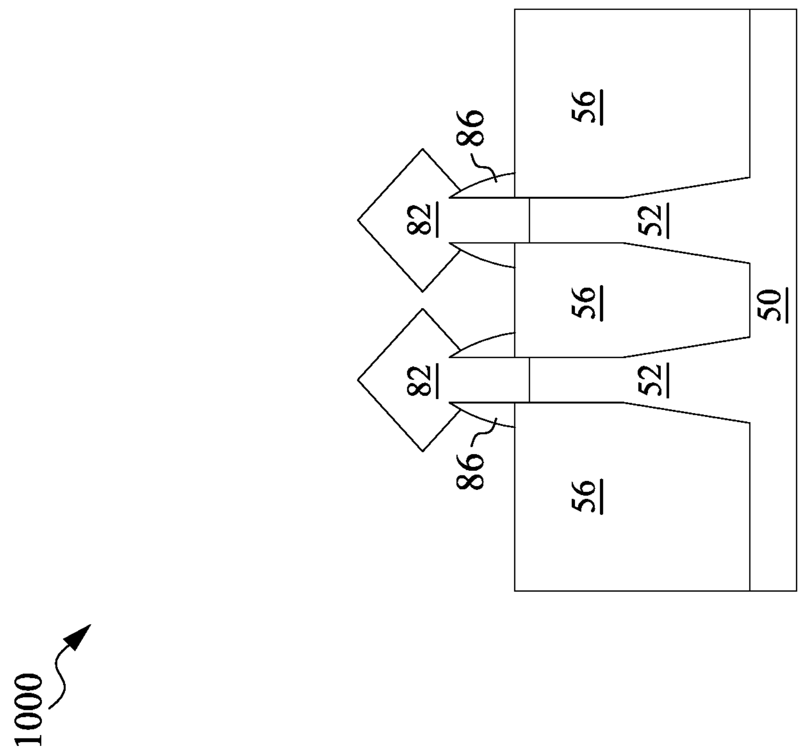
Figure 10C:
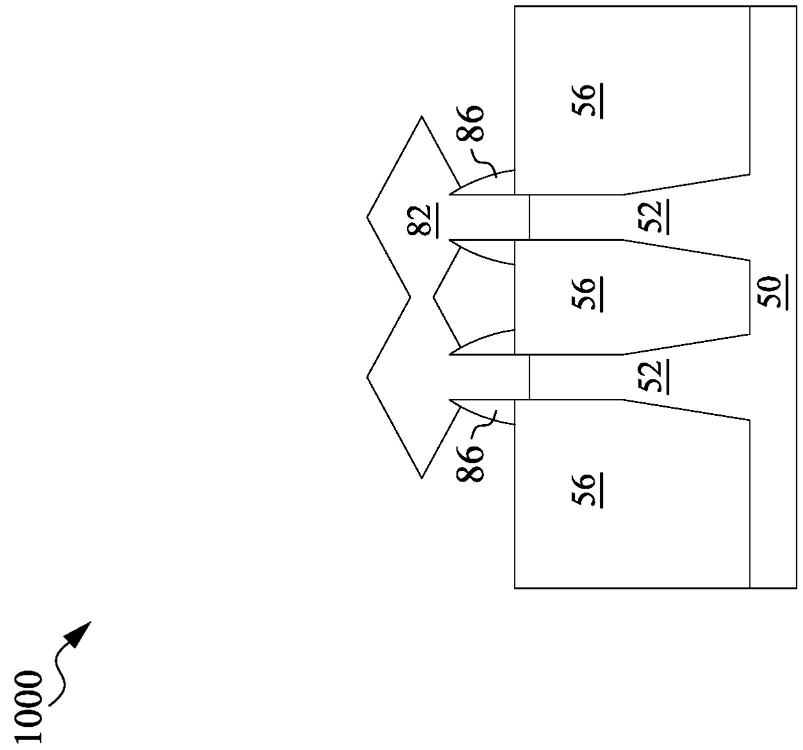

In FIGS. 10A and 10B, epitaxial source/drain regions 82 are formed in the fins 52 to exert stress in the respective channel regions 58, thereby improving device performance. The epitaxial source/drain regions 82 are formed in the fins 52 such that each dummy gate 72 is disposed between respective neighboring pairs of the epitaxial source/drain regions 82. In some embodiments, the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the FinFET device 1000.

The epitaxial source/drain regions 82 in the region 50N may be formed by masking the region 50P and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, a combination thereof, or the like. The epitaxial source/drain regions 82 in the region 50N may have surfaces raised from respective surfaces of the fins 52 and may have facets.

The epitaxial source/drain regions 82 in the region 50P may be formed by masking the region 50N and etching source/drain regions of the fins 52 in the region 50P to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, a combination thereof, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions 82 may have an impurity concentration of between about $10^{19}$ $cm^{-3}$ and about $10^{21}$ $cm^{-3}$. The n-type and/or p-type impurities for the epitaxial source/drain regions 82 may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions 82 have facets which expand laterally outward beyond sidewalls of the fins 52. In some embodiments, these facets cause adjacent epitaxial source/drain regions 82 of a same FinFET to merge as illustrated by FIG. 10C. In other embodiments, adjacent epitaxial source/drain regions 82 remain separated after the epitaxy process is completed as illustrated by FIG. 10D. In the embodiments illustrated in FIGS. 10C and 10D, the gate spacers 86 are formed covering a portion of the sidewalls of the fins 52 that extend above the STI regions 56 thereby blocking the epitaxial growth. In other embodiments, the spacer etch used to form the gate spacers 86 may be adjusted to remove the spacer material from the sidewalls of the fins 52 to allow the epitaxially grown region to extend to the surface of the STI region 56.

Figure 11B:
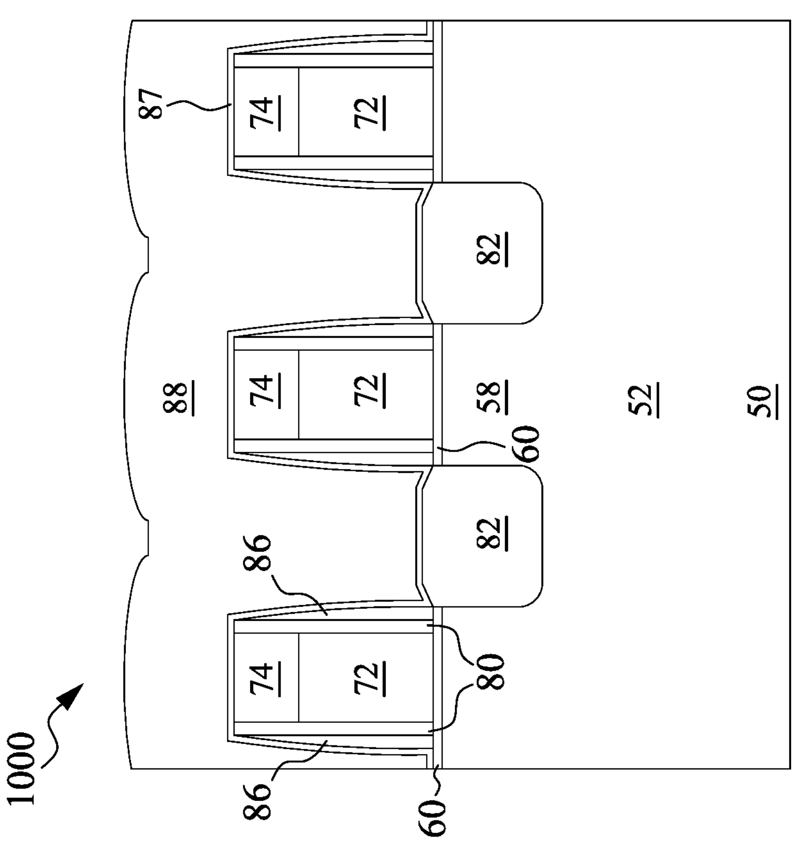
Figure 11A:
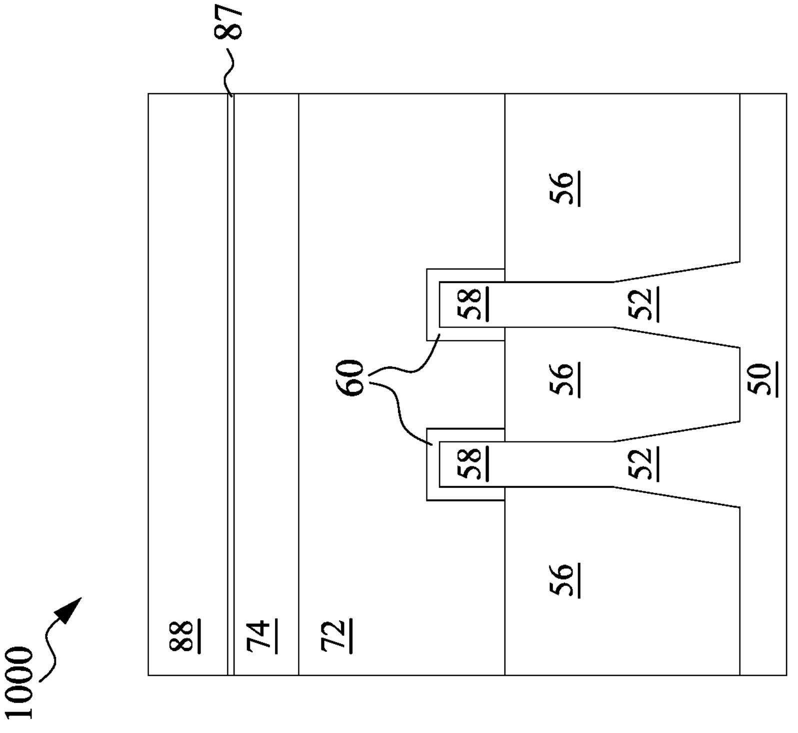

In FIGS. 11A and 11B, an ILD 88 is deposited over the structure illustrated in FIGS. 10A and 10B. The ILD 88 may be formed of a dielectric material, and may be deposited by any suitable method, such as CVD, plasma-enhanced CVD (PECVD), FCVD, a combination thereof, or the like. Dielectric materials may include Phospho-Silicate Glass (PSG), Boro-Silicate Glass (BSG), Boron-Doped Phospho-Silicate Glass (BPSG), undoped Silicate Glass (USG), a combination thereof, or the like. Other insulation materials formed by any acceptable process may be also used. In some embodiments, a contact etch stop layer (CESL) 87 is disposed between the ILD 88 and the epitaxial source/drain regions 82, the masks 74, and the gate spacers 86. The CESL 87 may comprise a dielectric material, such as, silicon nitride, silicon oxide, silicon oxynitride, a combination thereof, or the like, having a different etch rate than the material of the overlying ILD 88.

Figure 12A:
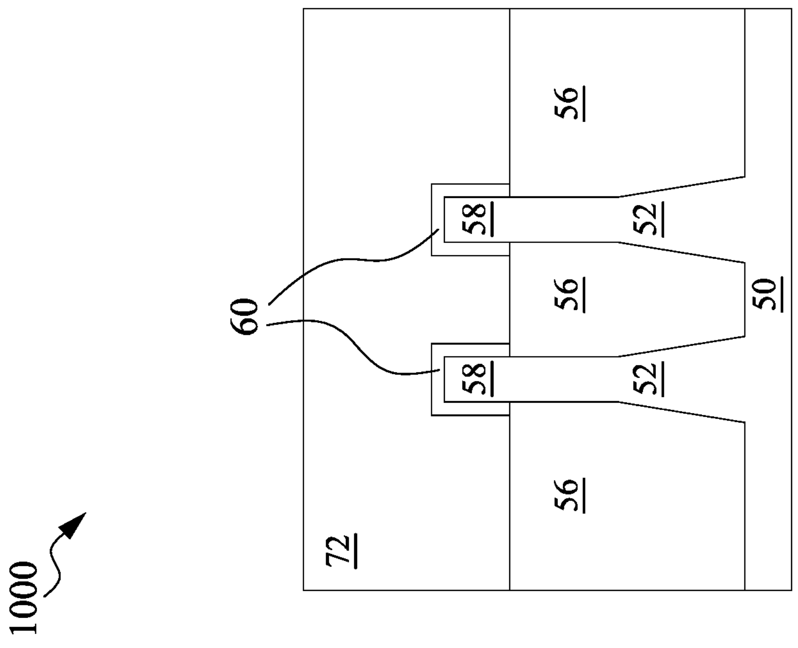
Figure 12B:
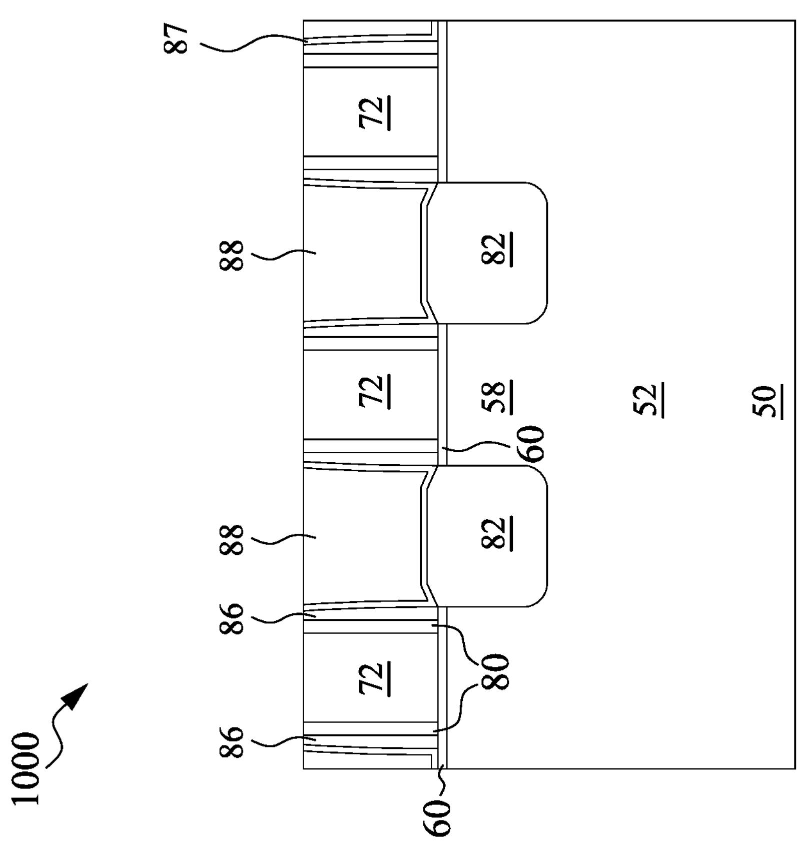

In FIGS. 12A and 12B, a planarization process, such as a CMP process, may be performed to level the top surface of the ILD 88 with the top surfaces of the dummy gates 72 or the masks 74 (see FIGS. 11A and 11B). The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the ILD 88 are substantially coplanar or level with each other within process variations of the planarization process. Accordingly, the top surfaces of the dummy gates 72 are exposed through the ILD 88. In some embodiments, the masks 74 may remain, in which case the planarization process levels the top surface of the ILD 88 with the top surfaces of the masks 74.

Figure 13B:
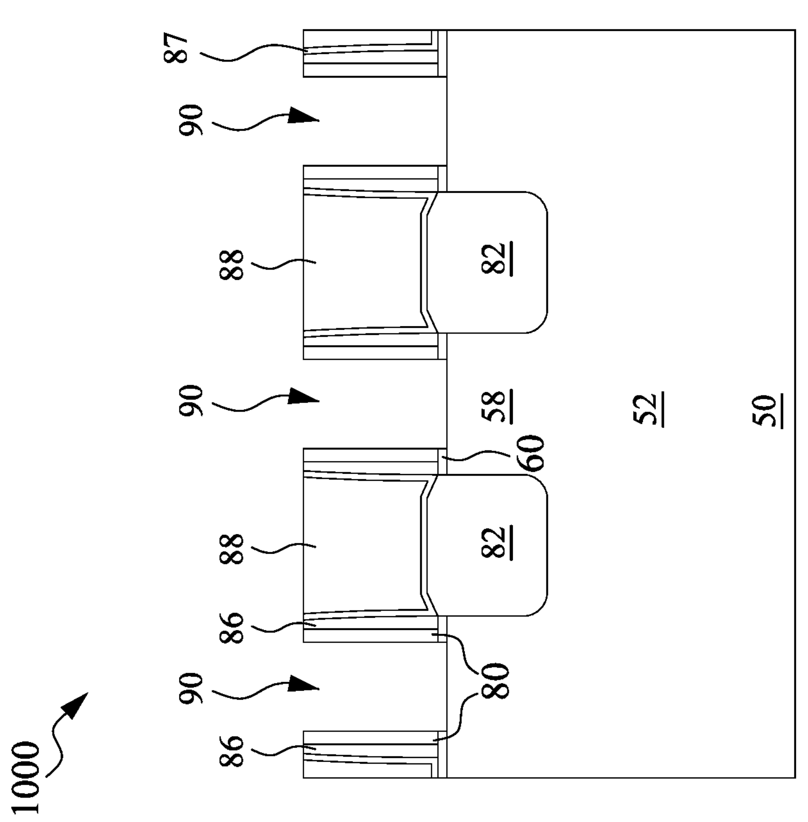
Figure 13A:
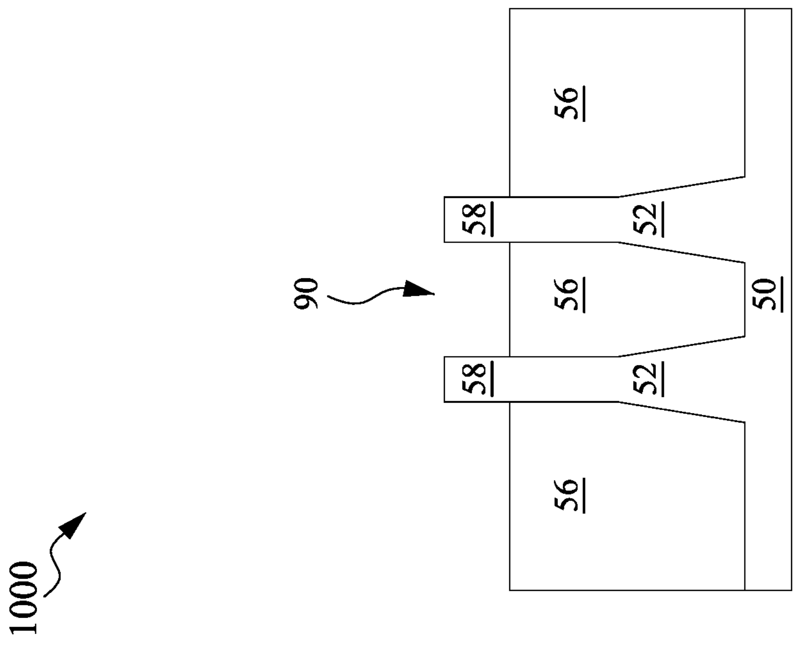

In FIGS. 13A and 13B, the dummy gates 72, and the masks 74, if present, are removed in an etching step(s), so that openings 90 are formed. In some embodiments, portions of the dummy dielectric layer **6*o* in the openings 90 may also be removed. In other embodiments, only the dummy gates 72 are removed and the dummy dielectric layer 60 remains and is exposed by the openings 90. In some embodiments, the dummy dielectric layer 60 is removed from the openings 90 in a first region of a die (e.g., a core logic region) and remains in openings 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the ILD 88 or the gate spacers 86. Each opening 90 exposes a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72**.

Figure 14B:
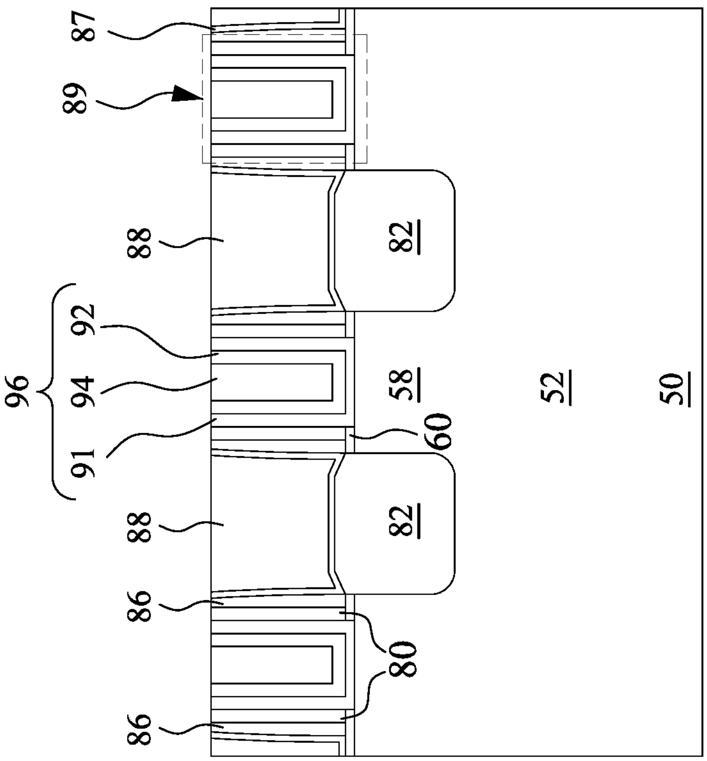
Figure 14A:
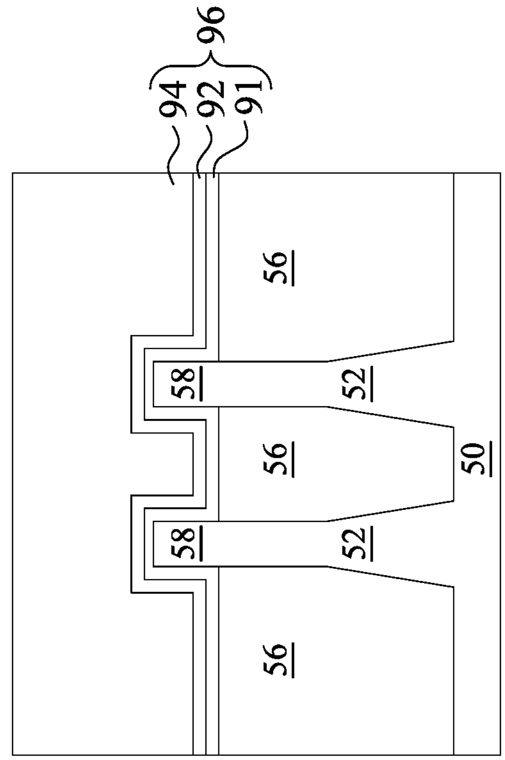
Figure 14C:
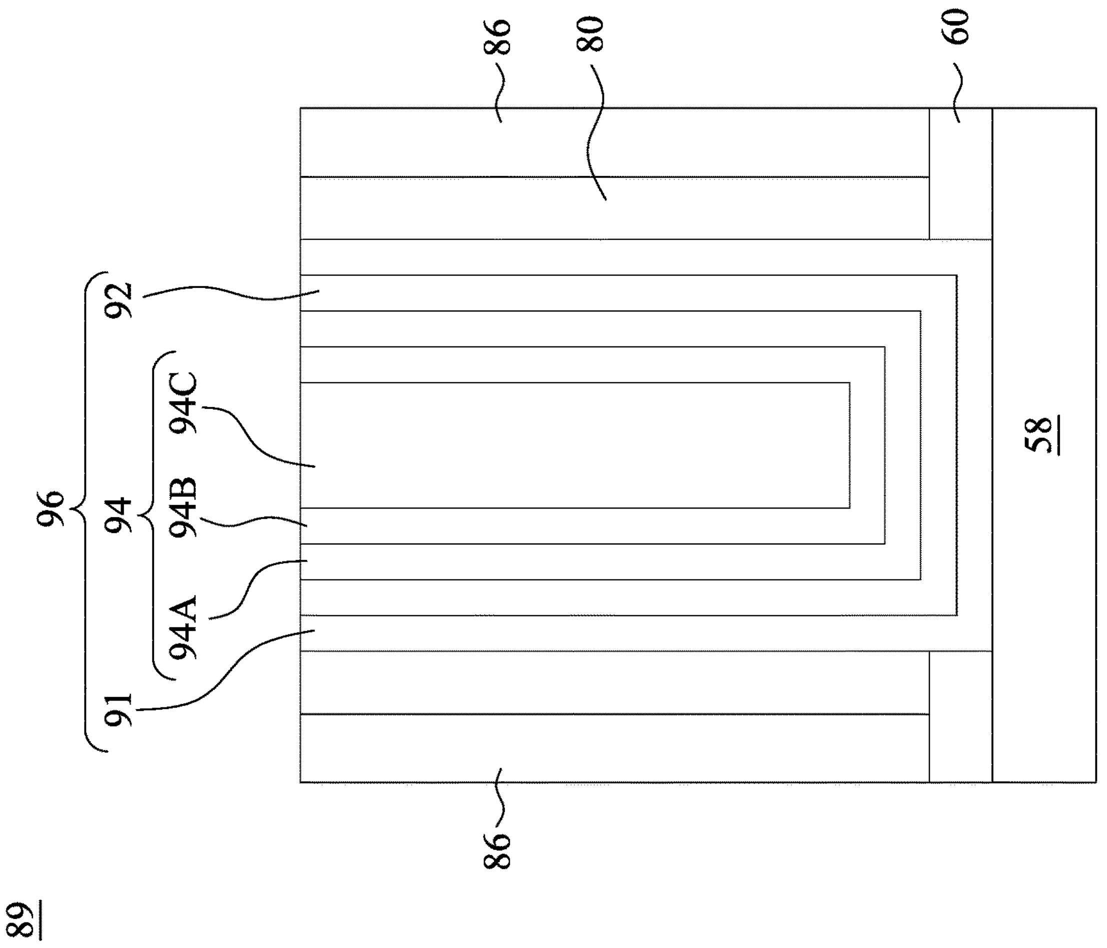

In FIGS. 14A and 14B, interfacial layers 91, gate dielectric layers 92 and gate electrodes 94 are formed in the openings 90 (see FIGS. 13A and 13B) to form gate stacks 96. The gate stacks 96 may be also referred to as replacement gate stacks. FIG. 14C illustrates a detailed view of a region 89 of FIG. 14B. In some embodiments, the interfacial layers 91 are formed in the openings 90 (see FIGS. 13A and 13B). The interfacial layers 91 may comprise silicon oxide and may be formed using a chemical deposition process, such as ALD, CVD, or the like, or using an oxidation process. In some embodiments where the interfacial layers 91 are formed using a deposition process, the interfacial layers 91 extend along exposed surfaces of the fins 52, the isolation regions 56, and the gate seal spacers 80. In some embodiments where the interfacial layers 91 are formed using an oxidation process, the interfacial layers 91 extend along exposed surfaces of the fins 52, and do not extend along exposed surfaces of the isolation regions 56 and the gate seal spacers 80. In some embodiments, the interfacial layers 91 have a thickness less than about 20 Å.

In some embodiments, the gate dielectric layers 92 are deposited in the openings 90 over the interfacial layers 91. The gate dielectric layers 92 may also be formed on the top surface of the ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, a combination thereof, or the like.

Further in FIGS. 14A and 14B, the gate electrodes 94 are deposited over the gate dielectric layers 92 and fill the remaining portions of the openings 90 (see FIGS. 13A and 13B). Although a single layer gate electrode 94 is illustrated in FIG. 14B, the gate electrode 94 may comprise any number of liner layers 94A, any number of work function tuning layers 94B, and a conductive fill layer 94C as illustrated by FIG. 14C. The liner layers 94A may include TiN, TiO, TaN, TaC, combinations thereof, multi-layers thereof, or the like, and may be formed using PVD, CVD, ALD, a combination thereof, or the like. In region 50N, the work function tuning layers 94B may include Ti, Ag, Al, TiAl, TiAlN, TiAlC, TaC, TaCN, TaSiN, TaAlC, Mn, Zr, combinations thereof, multi-layers thereof, or the like, and may be formed using PVD, CVD, ALD, a combination thereof, or the like. In region 50P, the work function tuning layers 94B may include TiN, WN, TaN, Ru, Co, combinations thereof, multi-layers thereof, or the like, and may be formed using PVD, CVD, ALD, a combination thereof, or the like. In some embodiments, the conductive fill layer 94C may comprise Co, Ru, Al, Ag, Au, W, Ni, Ti, Cu, Mn, Pd, Re, Ir, Pt, Zr, alloys thereof, combinations thereof, multi-layers thereof, or the like, and may be formed using PVD, CVD, ALD, plating, a combination thereof, or the like.

After the filling of the openings 90 (see FIGS. 13A and 13B), a planarization process, such as a CMP, may be performed to remove the excess portions of the gate dielectric layers 92, the gate electrodes 94, and/or the interfacial layers 91, which excess portions are over the top surface of the ILD 88. The remaining portions of the gate electrodes 94, the gate dielectric layers 92, and the interfacial layers 91 thus form the gate stacks 96 of the FinFET device 1000. The gate stacks 96 may extend along sidewalls of the channel regions 58 of the fins 52.

The formation of the gate dielectric layers 92 in the region 50N and the region 50P may occur simultaneously such that the gate dielectric layers 92 in each region are formed of the same materials. In other embodiments, the gate dielectric layers 92 in each region may be formed by distinct processes such that the gate dielectric layers 92 in different regions may be formed of different materials. The formation of the conductive fill layers 94C in the region 50N and the region 50P may occur simultaneously such that the conductive fill layers 94C in each region are formed of the same materials. In other embodiments, the conductive fill layers 94C in each region may be formed by distinct processes such that the conductive fill layers 94C in different regions may be formed of different materials. Various masking steps may be used to mask and expose appropriate regions when using distinct processes.

Figure 15B:
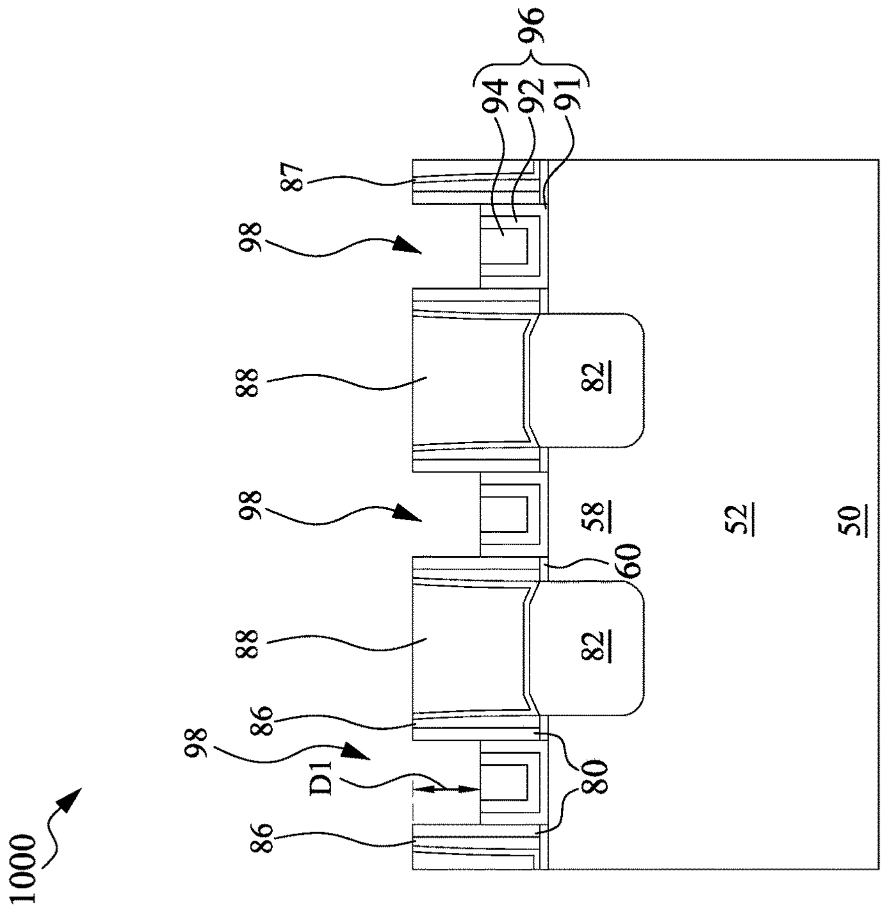
Figure 15A:
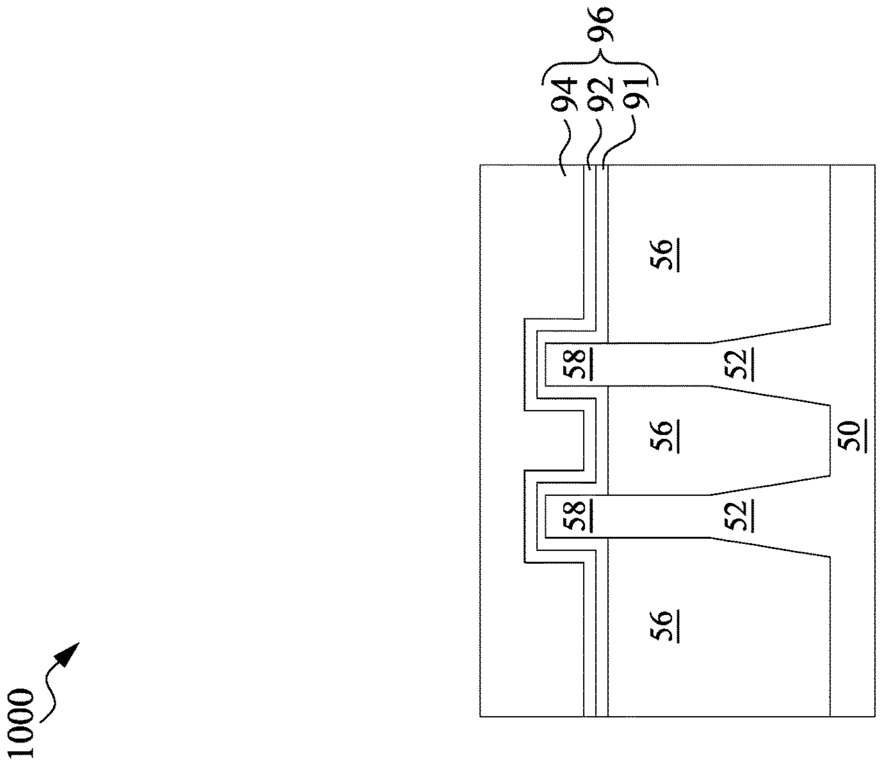

In FIGS. 15A and 15B, the gate stacks 96 are recessed below the top surface of the ILD 88 to form recesses 98. In some embodiments, the gate stacks 96 are recessed below the top surface of the ILD 88 to a depth D1. In some embodiments, the depth D1 is between about 10 nm and about 100 nm. In some embodiments, the gate stacks 96 are recessed using one or more etch processes. The one or more etch processes may comprise one or more dry etch processes, one or more wet etch processes, combinations thereof, or the like. The one or more etch processes may comprise anisotropic etch processes. In some embodiments, the one or more etch processes may be performed using etchants, such as $Cl_2$, HCl, $F_2$, HF, $CF_4$, $SiCl_4$, $CH_xF_y$, Ar, $N_2$, $O_2$, $BCl_3$, $NF_3$, a combination thereof, or the like.

Figure 16B:
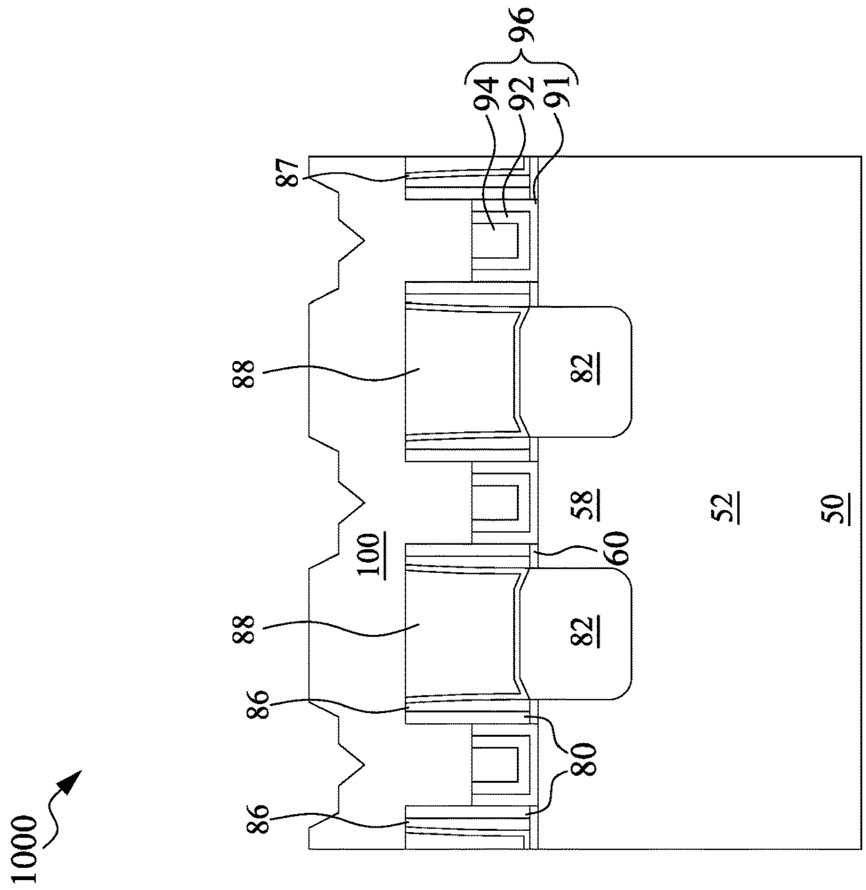
Figure 16A:
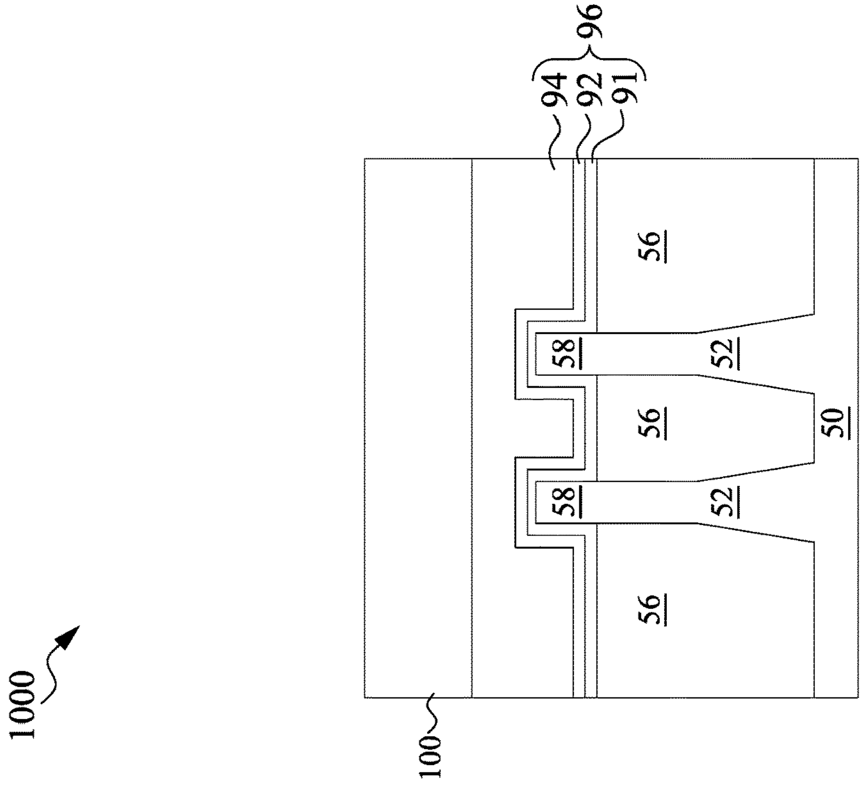

In FIGS. 16A and 16B, a dielectric layer 100 is formed in the recesses 98 (see FIGS. 15A and 15B) and over the ILD 88. In some embodiments, the dielectric layer 100 overfills the recesses 98 (see FIGS. 15A and 15B). In some embodiments, the dielectric layer 100 comprises materials that do not comprise oxygen. In some embodiments, the dielectric layer 100 comprises silicon nitride (SiN), silicon carbide (SiC), silicon carbonitride (SiCN), a combination thereof, or the like, and may be formed using ALD, CVD, a combination thereof, or the like.

Figure 17B:
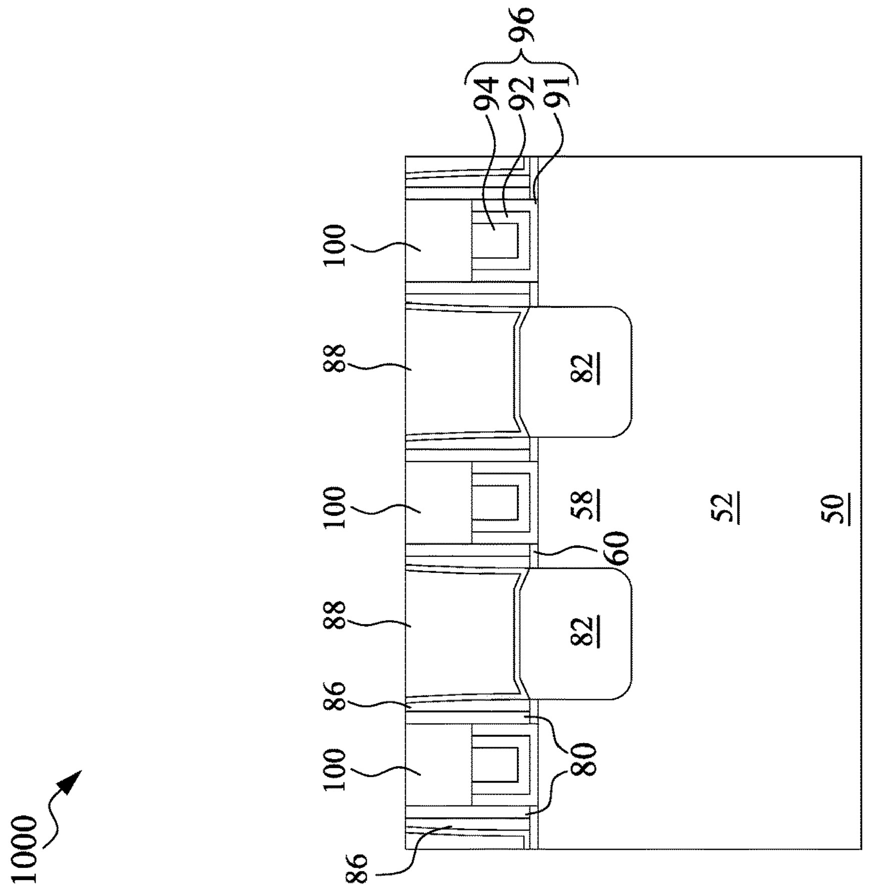
Figure 17A:
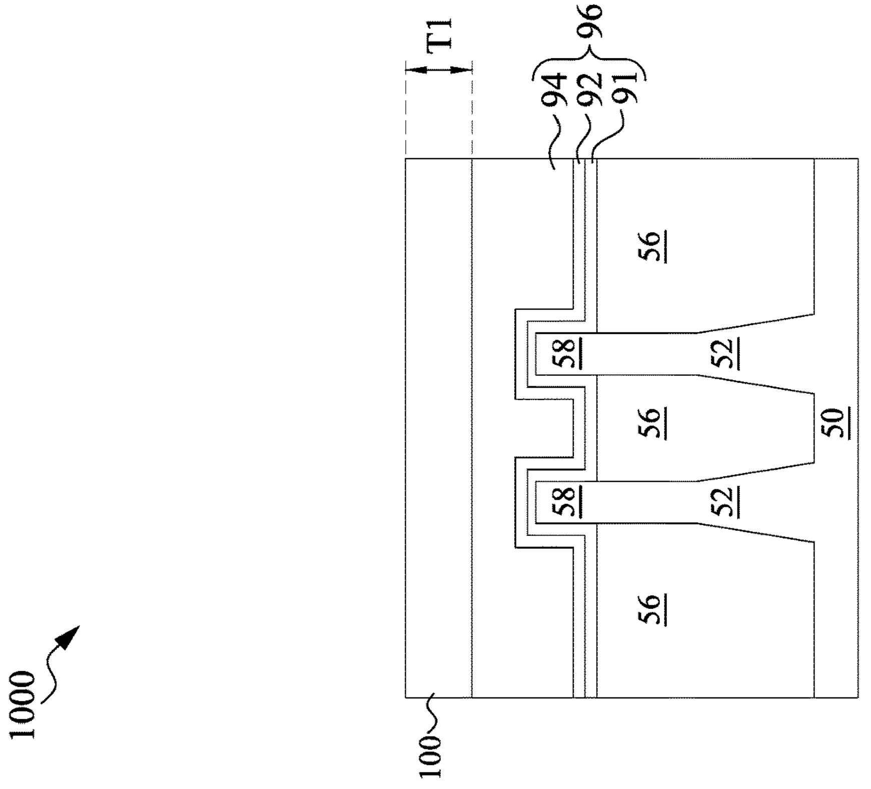

In FIGS. 17A and 17B, a planarization process is performed on the dielectric layer 100 to expose the top surface of the ILD 88. After the planarization process, a top surface of the dielectric layer 100 and the top surface of the ILD 88 are substantially level or coplanar within process variations of the planarization process. In some embodiments, the planarization process may comprise a CMP process, an etch back process, a grinding process, a combination thereof, or the like. After the planarization process, the dielectric layer 100 has a thickness T1. In some embodiments, the thickness T1 is between about 10 nm and about 100 nm.

Figure 18B:
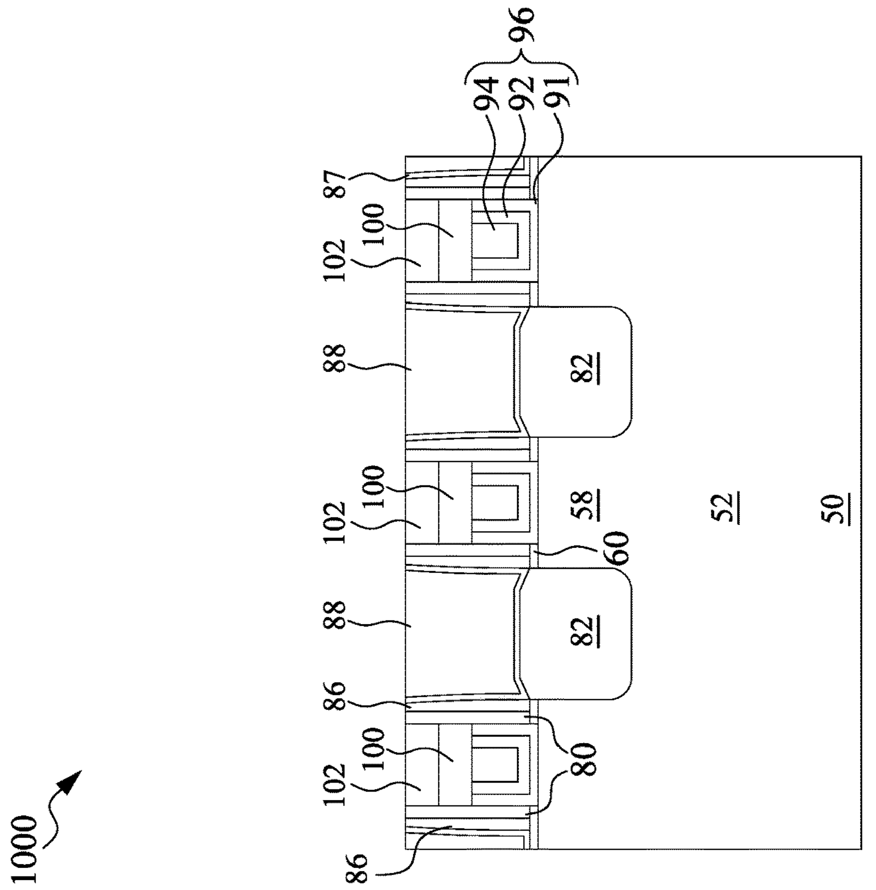
Figure 18A:
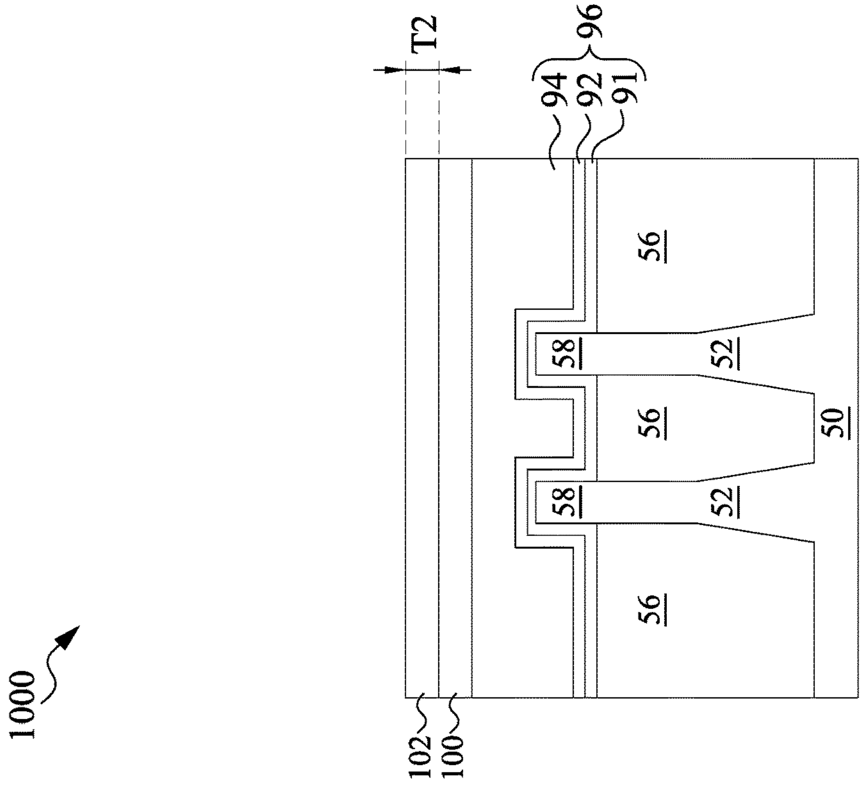

In FIGS. 18A and 18B, a dielectric layer 102 is formed over the dielectric layer 100 in the recesses 98 (see FIGS. 15A and 15B). In some embodiments, the dielectric layer 102 comprises oxygen-containing materials. In some embodiments, the dielectric layer 102 comprises silicon oxide (SiO), silicon oxycarbide (SiOC), a combination thereof, or the like. In some embodiments, the dielectric layer 102 is formed such that a top surface of the dielectric layer 102 and the top surface of the ILD 88 are substantially level or coplanar within process variations of the formation process. In some embodiments, the dielectric layer 102 has a thickness T2 between about 1 nm and about 97 nm. In some embodiments, a ratio of the thickness T2 over the thickness T1 (see FIG. 17A) is between about 0.01 and about 0.97. In some embodiments, the dielectric layer 102 may be formed using process steps described below with reference to FIGS. 47A, 47B, 48A, and 48B, and the detailed description is provided at that time. In other embodiments, the dielectric layer 102 may be formed using process steps described below with reference to FIGS. 49A, 49B, 50A, 50B, 51A, and 51B, and the detailed description is provided at that time. The dielectric layers 100 and 102 may be also referred to as cap layers or gate cap layers.

Figure 19B:
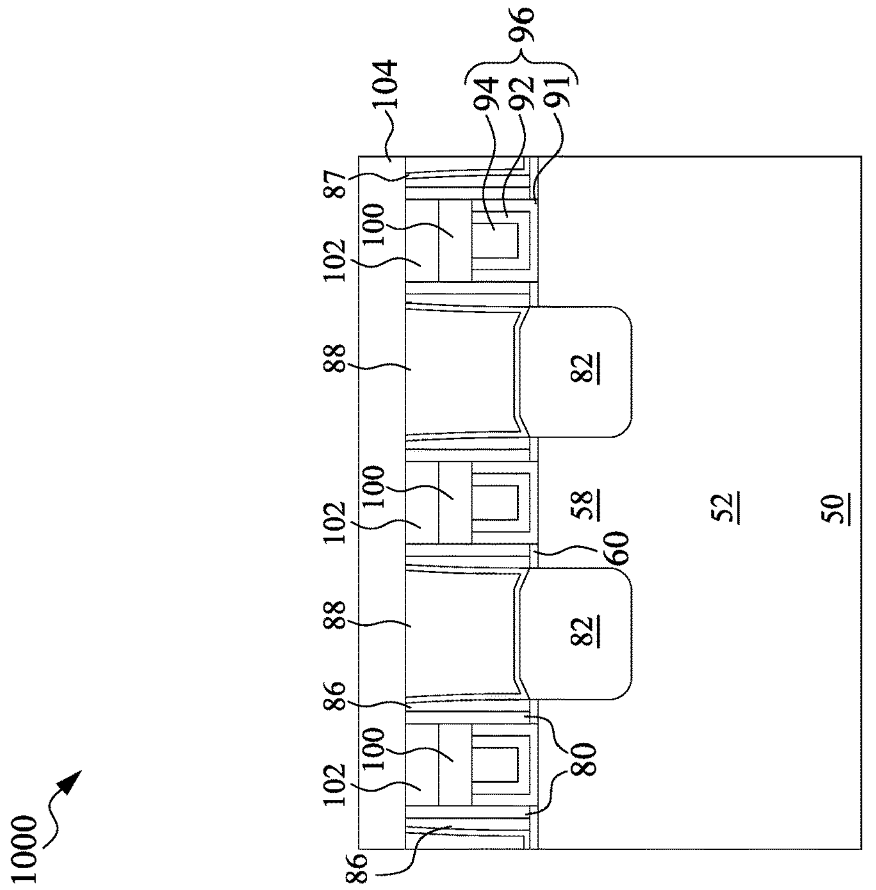
Figure 19A:
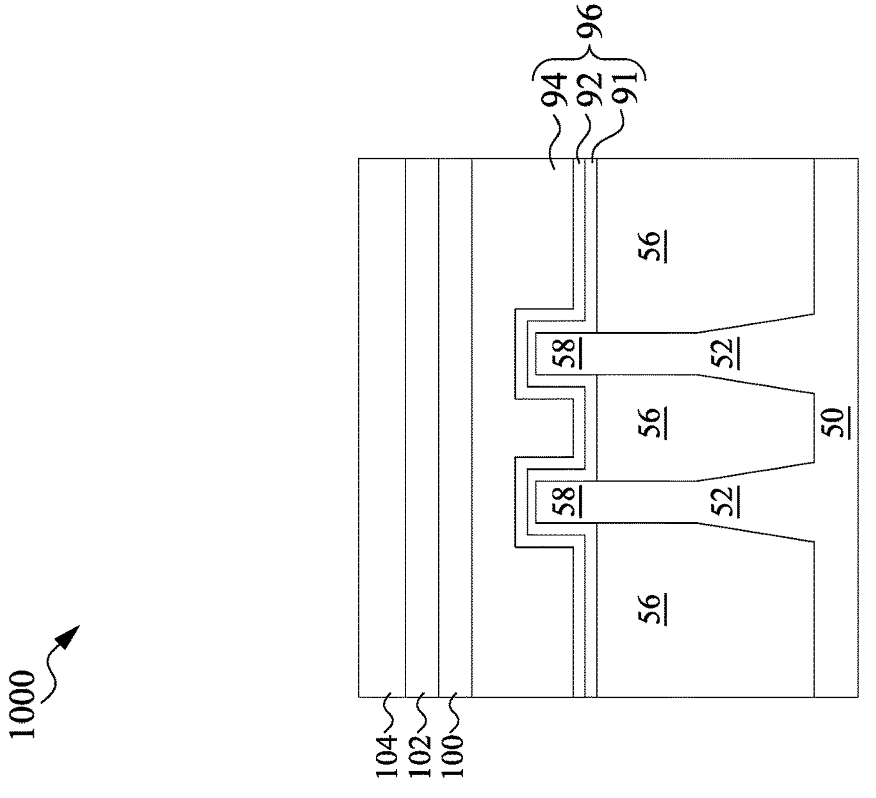

In FIGS. 19A and 19B, a dielectric layer 104 is formed over the dielectric layer 102 and the ILD 88. In some embodiments, the dielectric layer 104 comprises materials that do not comprise oxygen. In some embodiments, the dielectric layer 104 may be formed using similar materials and methods as the dielectric layer 100 described above with reference to FIGS. 16A and 16B, and the description is not repeated herein. In some embodiments, the dielectric layer 100 and the dielectric layer 104 comprise a same material. In other embodiments, the dielectric layer 100 and the dielectric layer 104 comprise different materials.

Figure 20B:
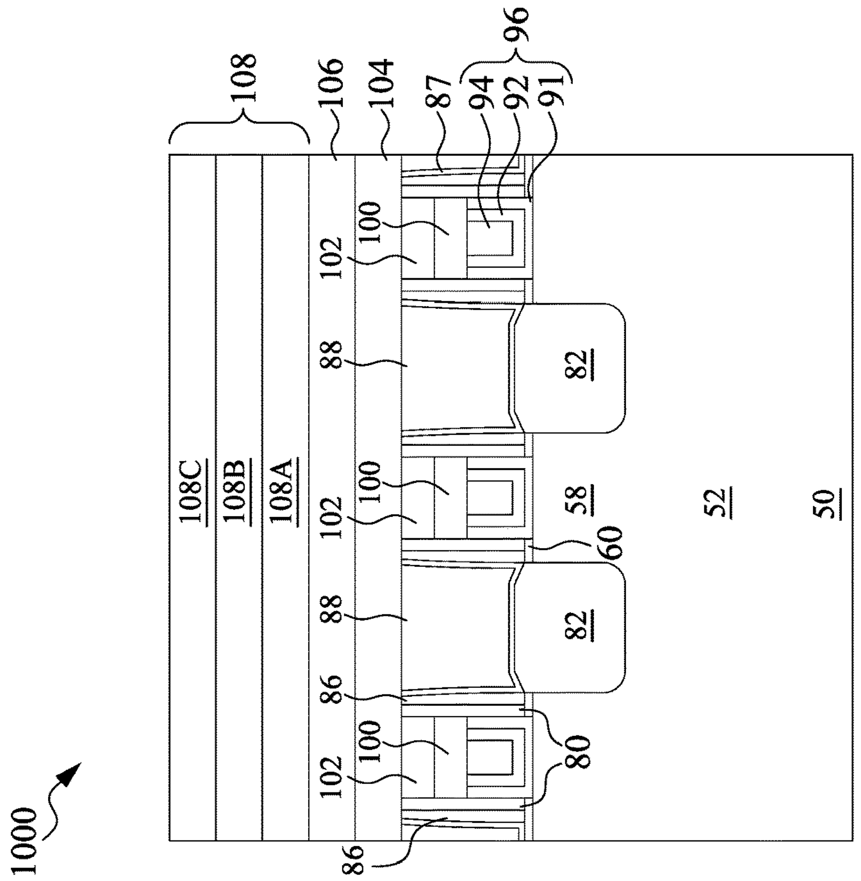
Figure 20A:
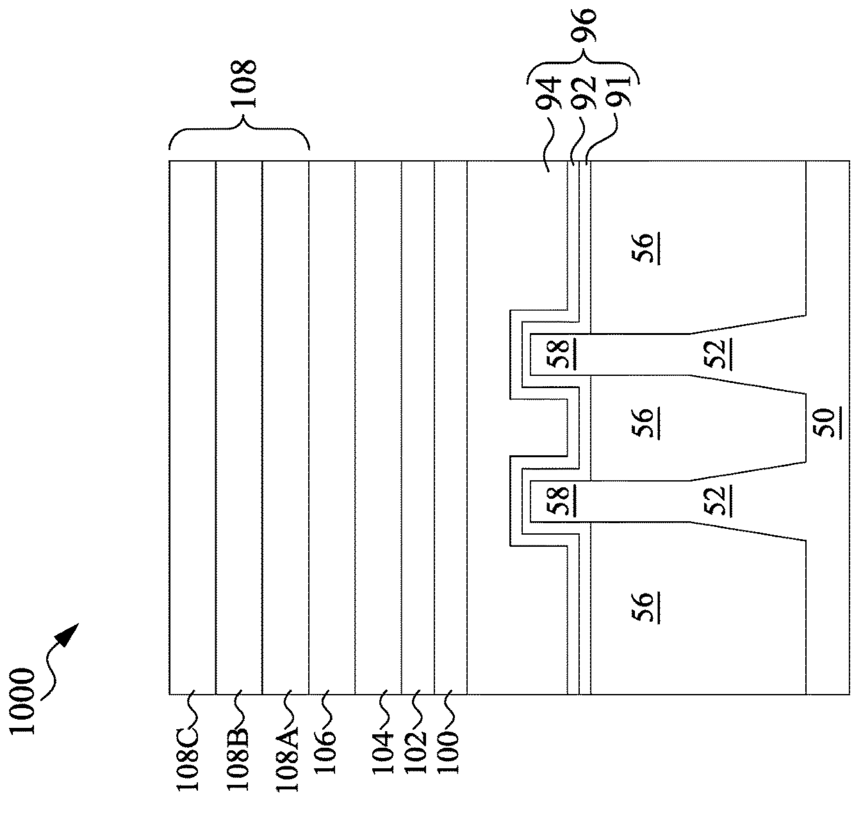

In FIGS. 20A and 20B, an ILD 106 is formed over the dielectric layer 104. In some embodiments, the ILD 106 may be formed using similar materials and methods as the ILD 88 described above with reference to FIGS. 11A and 11B, and the description is not repeated herein. In some embodiments, the ILD 88 and the ILD 106 comprise a same material. In other embodiments, the ILD 88 and the ILD 106 comprise different materials.

After forming the ILD 106, a mask stack 108 is formed over the ILD 106. In some embodiments, the mask stack 108 comprises a mask layer 108A, a mask layer 108B over the mask layer 108A, and a mask layer 108C over the mask layer 108B. The mask layer 108A may comprise a metal nitride (such as TiN, MoN, WN, or the like), a metal carbide (such as WC, WBC, or the like), a boron-containing material (such as BSi, BC, BN, BCN, or the like), a combination thereof, or the like and may be formed using ALD, CVD, a combination thereof, or the like. The mask layer 108A may also be referred to as a metal hard mask layer. The mask layer 108B may comprise $SiO_x$, SiN, SiCN, SiOC, a combination thereof, or the like, and may be formed using ALD, CVD, a combination thereof, or the like. The mask layer 108B may also be referred to as a dielectric hard mask layer or an oxide hard mask layer. The mask layer 108C may comprise amorphous silicon (a-Si), a boron-containing material (such as BSi, BC, BN, BCN, or the like), a combination thereof, or the like, and may be formed using ALD, CVD, a combination thereof, or the like. As described below in greater detail, the mask stack 108 is used to pattern the ILDs 88 and 106, and the dielectric layer 104 to form openings for subsequently formed conductive features that provide electrical connections to the epitaxial source/drain regions 82.

Figure 21A:
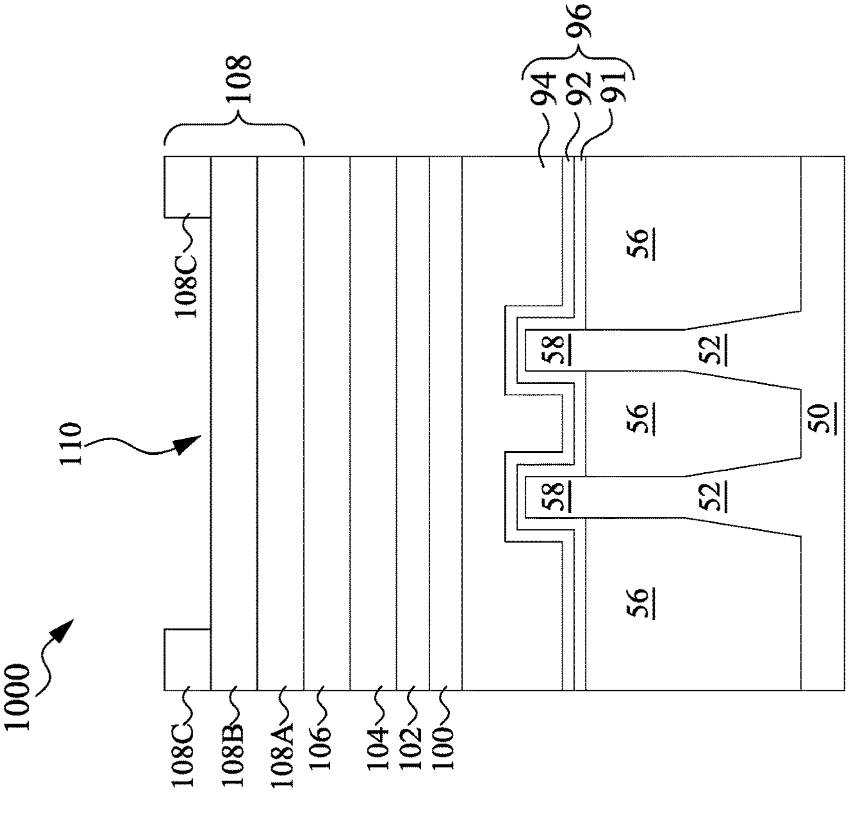
Figure 21B:
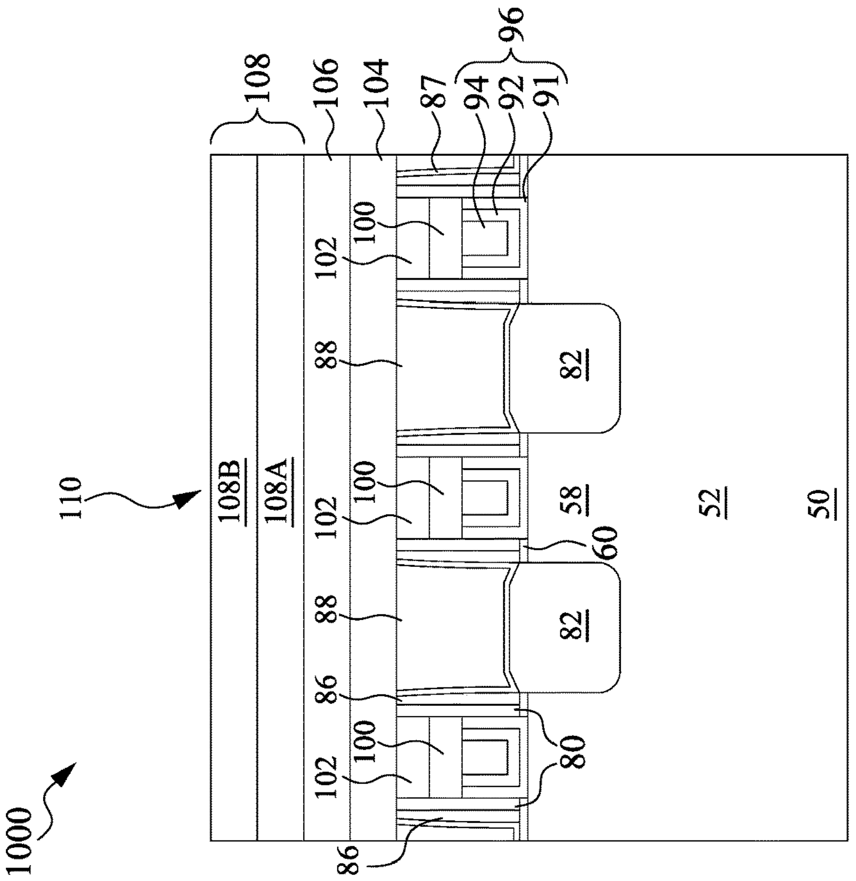
Figure 21C:
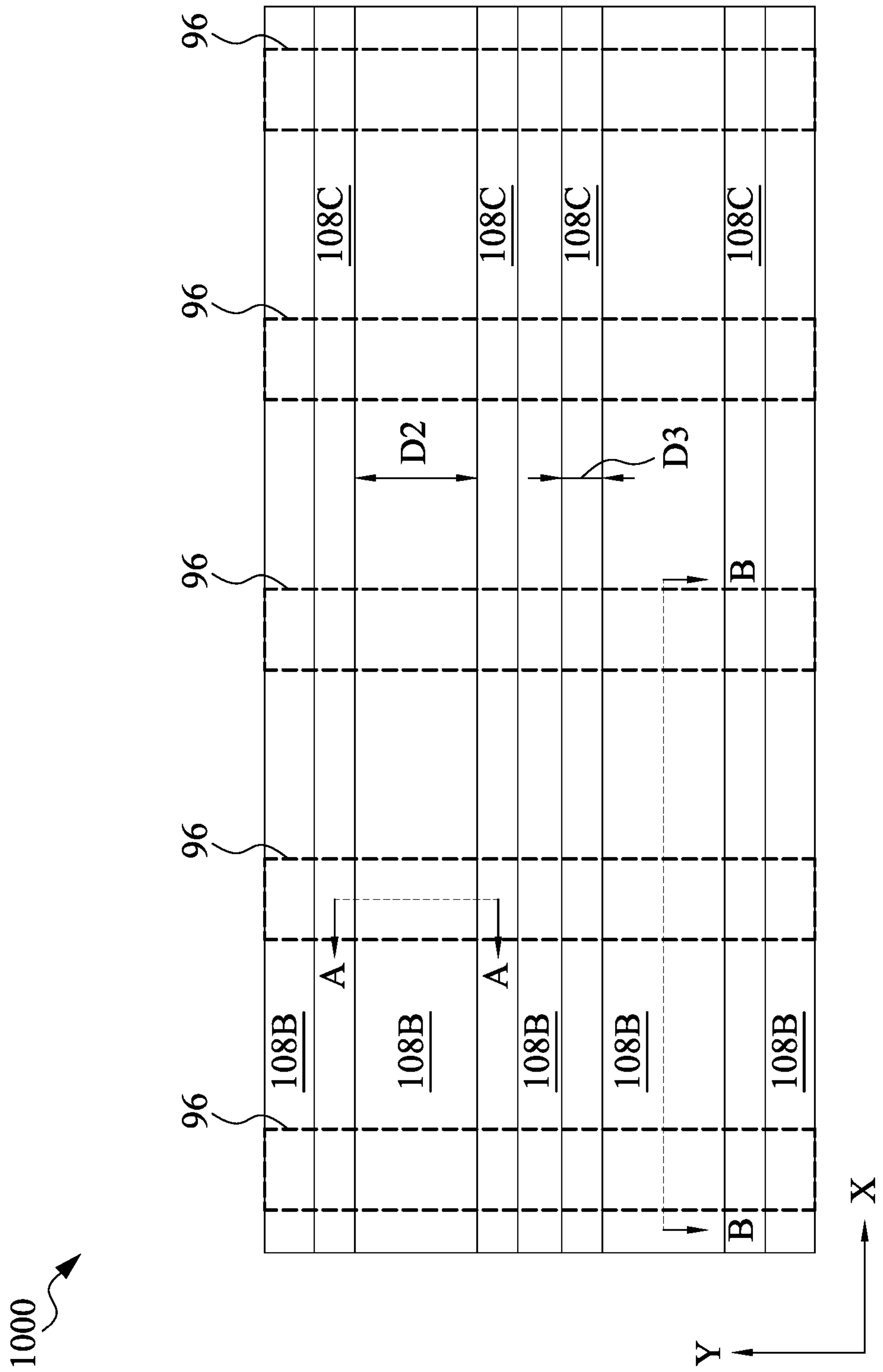

FIGS. 21A, 21B, and 21C illustrate a patterning process of the mask layer 108C. FIG. 21C illustrates a top view, FIG. 21A illustrates a cross-sectional view along a line AA in FIG. 21C, and FIG. 21B illustrates a cross-sectional view along a line BB in FIG. 21C. The patterning process forms a plurality of openings 110 in the mask layer 108C. The openings 110 expose portions of the mask layer 108B. In some embodiments, the patterning process may comprise suitable photolithography and etch processes. The suitable etch process may comprise a dry etch process, a wet etch process, a combination thereof, or the like. The suitable etch process may be anisotropic. In some embodiments, the suitable etch process may be performed using etchants, such as $Cl_2$, HCl, $F_2$, HF, $CF_4$, $SiCl_4$, $CH_xF_y$, Ar, $N_2$, $O_2$, $BCl_3$, $NF_3$, a combination thereof, or the like.

In some embodiments, the patterned mask layer 108C comprises a plurality of elongated portions extending along a first direction (such as the X direction) and spaced apart in a second direction (such as the Y direction) perpendicular to the first direction in the top view illustrated in FIG. 21C. In some embodiments, the plurality of elongated portions have a non-uniform pitch. In other embodiments, the plurality of elongated portions have a uniform pitch. In some embodiments, a distance between adjacent elongated portions along the second direction (such as the Y direction) sets a width of the subsequently formed conductive features that provide electrical connections to the epitaxial source/drain regions 82. In some embodiments when the plurality of elongated portions of the patterned mask layer 108C have a non-uniform pitch, the plurality of elongated portions have a first spacing D2 and a second spacing D3 different from the first spacing D2. In some embodiments, the first spacing D2 is between about 10 nm and about 1000 nm. In some embodiments, the second spacing D3 is between about 10 nm and about 1000 nm. Values of the first spacing D2 and the second spacing D3 may vary based on design layout requirements of the FinFET device 1000.

Figure 22B:
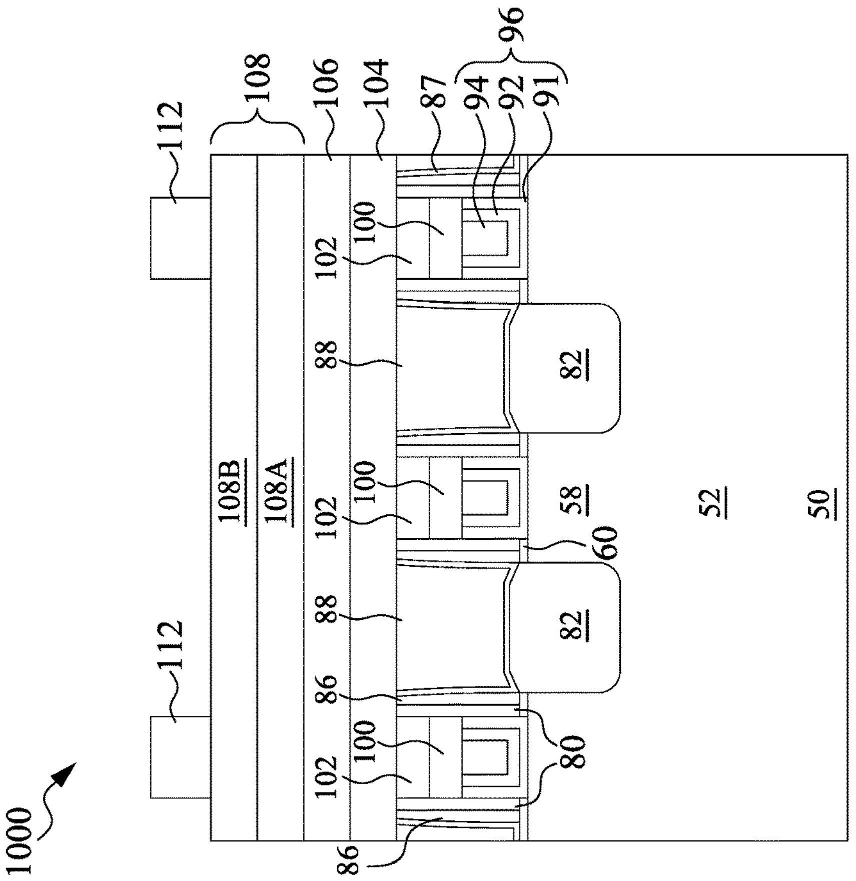
Figure 22A:
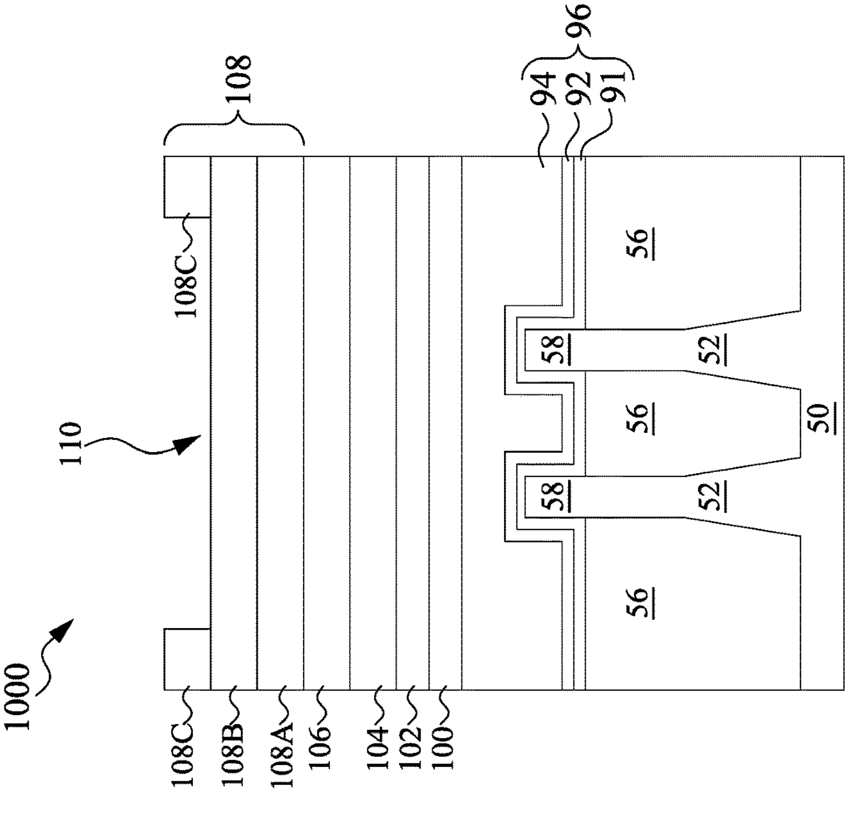
Figure 22C:
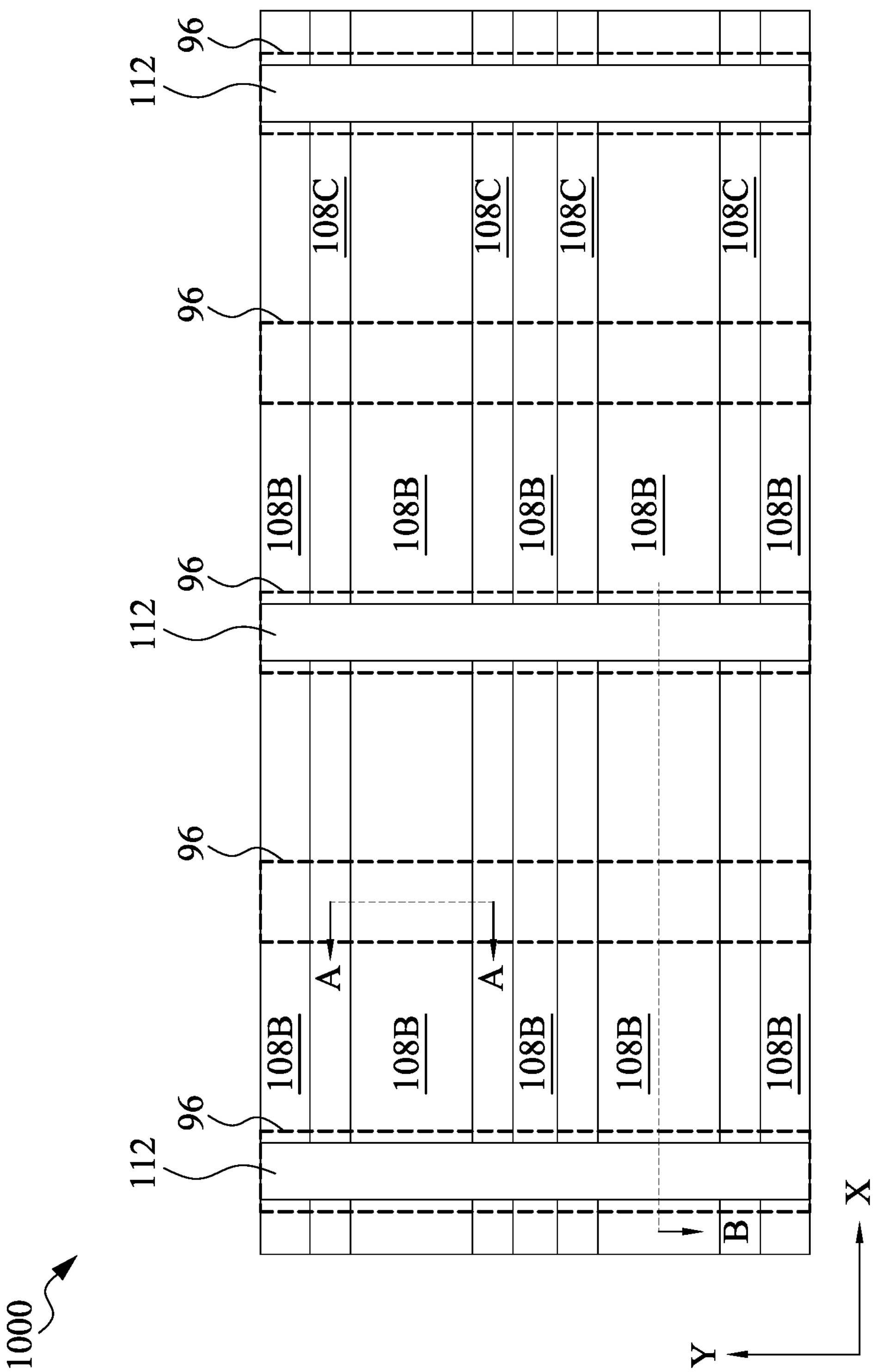

FIGS. 22A, 22B, and 22C illustrate a formation of a patterned mask 112 over the mask layer 108B and the patterned mask layer 108C. FIG. 22C illustrates a top view, FIG. 22A illustrates a cross-sectional view along a line AA in FIG. 22C, and FIG. 22B illustrates a cross-sectional view along a line BB in FIG. 22C. In some embodiments, the patterned mask 112 is formed by blanket depositing and patterning a suitable material (such as, for example, a photoresist material) over the mask layer 108B and the patterned mask layer 108C.

In some embodiments, the patterned mask 112 comprises a plurality of elongated portions extending along a first direction (such as the Y direction) and spaced apart in a second direction (such as the X direction) perpendicular to the first direction in the top view illustrated in FIG. 22C. Each of the elongated portions extends over and along a respective gate stack 96. In some embodiments, one or more gate stacks 96 are interposed between adjacent elongated portions patterned mask 112 in the top view illustrated in FIG. 22C. In the illustrated embodiment, a width of each of the elongated portions of the patterned mask 112 is less than a width of a respective gate stack 96. In other embodiments, the width of each of the elongated portions of the patterned mask 112 may be greater than or equal to the width of the respective gate stack 96.

Figure 23A:
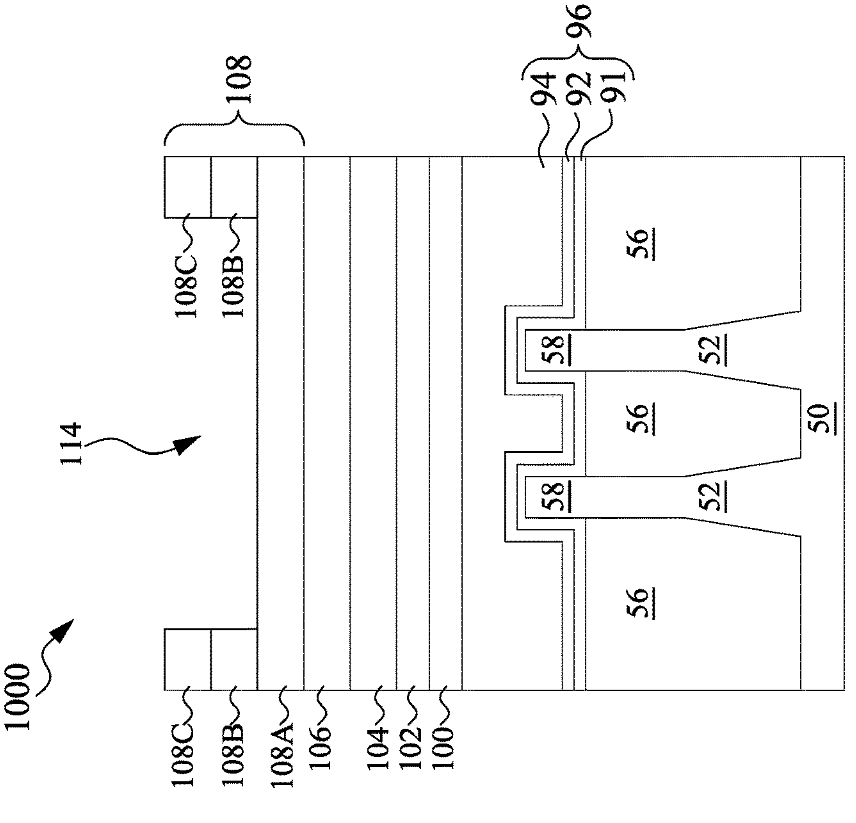
Figure 23B:
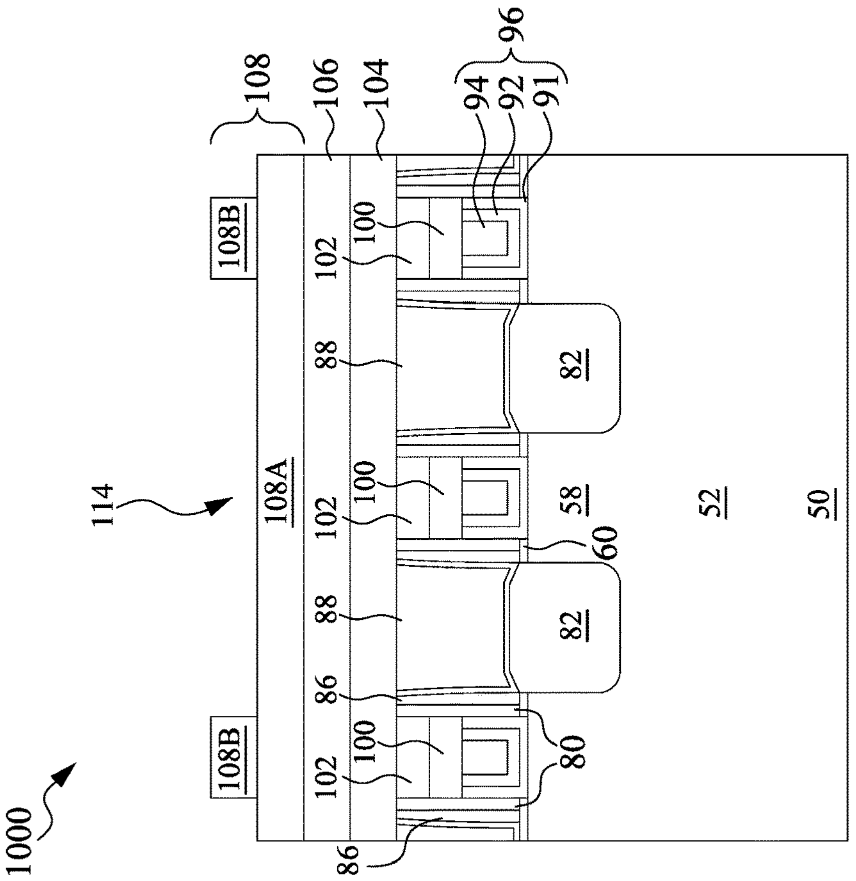
Figure 23C:
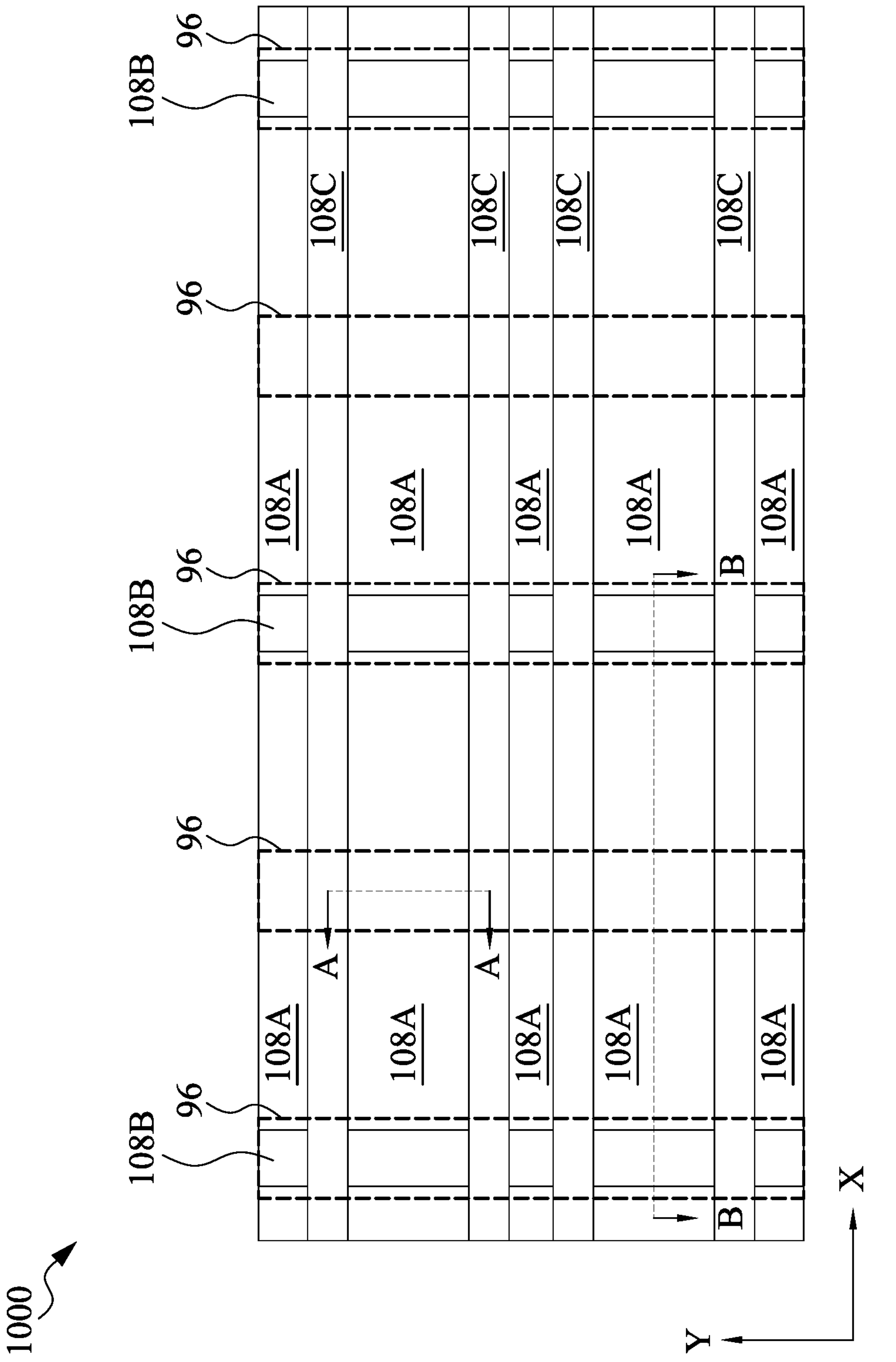

FIGS. 23A, 23B, and 23C illustrate a patterning process of the mask layer 108B. FIG. 23C illustrates a top view, FIG. 23A illustrates a cross-sectional view along a line AA in FIG. 23C, and FIG. 23B illustrates a cross-sectional view along a line BB in FIG. 23C. The patterning process forms a plurality of openings 114 in the mask layer 108B. The openings 114 expose portions of the mask layer 108A. In some embodiments, the patterning process may comprise a suitable etch process while using the patterned mask layer 108C and the patterned mask 112 (see FIGS. 22A, 22B, and 22C) as a combined etch mask. The suitable etch process may comprise a dry etch process, a wet etch process, a combination thereof, or the like. The suitable etch process may be anisotropic. In some embodiments, the suitable etch process may be performed using etchants, such as $Cl_2$, HBr, $N_2$, $O_2$, $H_2$, $CF_4$, $CHF_3$, Ar, a combination thereof, or the like. After completing the patterning process of the mask layer 108B, the patterned mask 112 (see FIGS. 22A, 22B, and 22C) is removed. In some embodiments when the patterned mask 112 comprises a photoresist material, the patterned mask 112 is removed by an acceptable ashing process followed by a wet clean process.

Figure 24B:
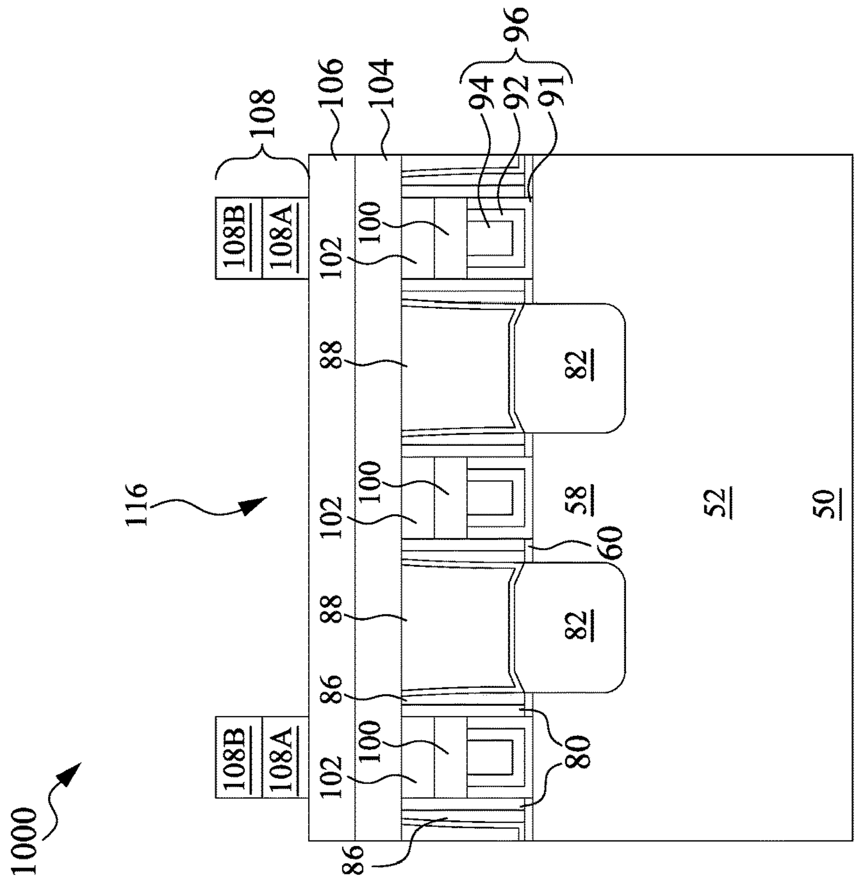
Figure 24A:
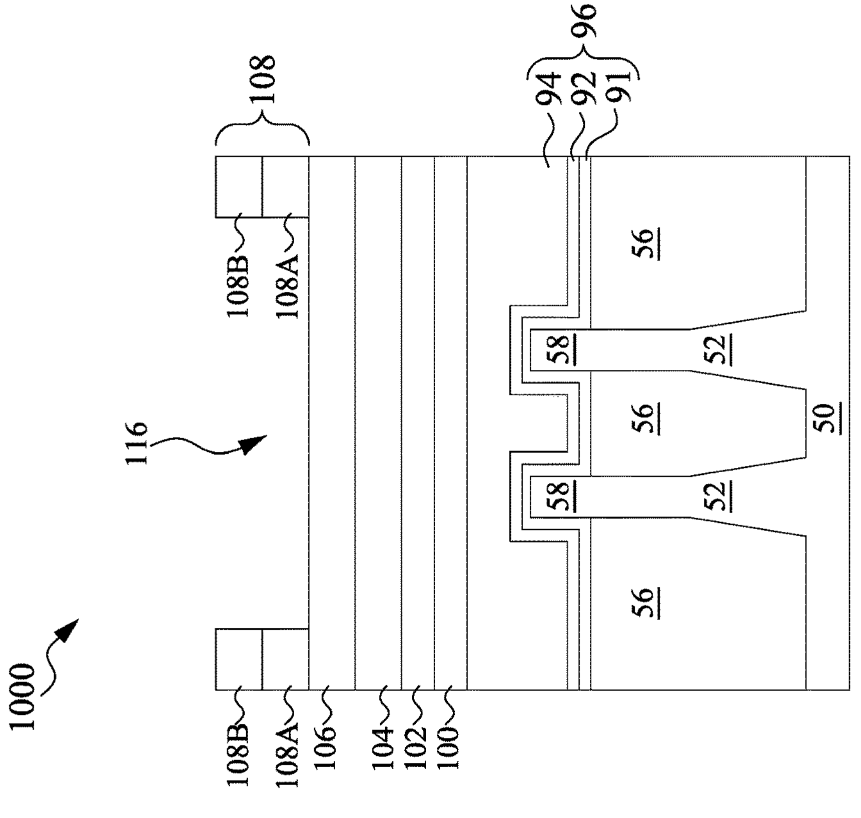
Figure 24C:
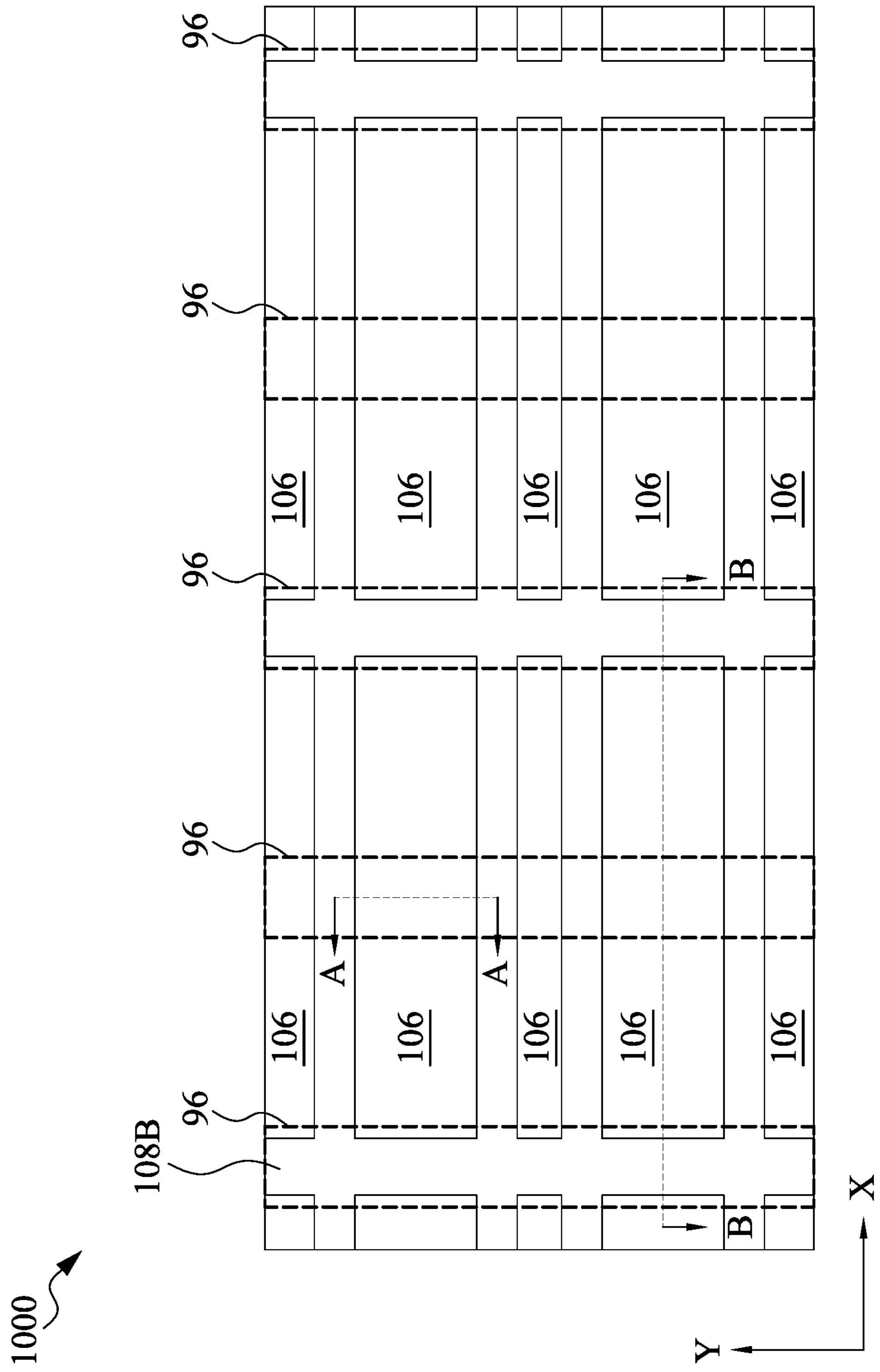

FIGS. 24A, 24B, and 24C illustrate a patterning process of the mask layer 108A. FIG. 24C illustrates a top view, FIG. 24A illustrates a cross-sectional view along a line AA in FIG. 24C, and FIG. 24B illustrates a cross-sectional view along a line BB in FIG. 24C. The patterning process forms a plurality of openings 116 in the mask layer 108A. The openings 116 expose portions of the ILD 106. In some embodiments, the patterning process may comprise a suitable etch process while using the patterned mask layer 108B and patterned mask layer 108C (see FIGS. 23A, 23B, and 23C) as a combined etch mask. The suitable etch process may comprise a dry etch process, a wet etch process, a combination thereof, or the like. The suitable etch process may be anisotropic. In some embodiments, the suitable etch process may be performed using etchants, such as $CF_4$, $CHF_3$, He, $H_2$, $NF_3$, Ar, $N_2$, a combination thereof, or the like.

After completing the patterning process of the mask layer 108A, the patterned mask layer 108C (see FIGS. 23A, 23B, and 23C) is removed. In some embodiments the patterned mask layer 108C is removed by a suitable etch process that is selective to a material of the patterned mask layer 108C. The suitable etch process may comprise a dry etch process, a wet etch process, a combination thereof, or the like. In some embodiments, the suitable etch process may be performed using etchants, such as $Cl_2$, HBr, $N_2$, $CF_4$, $CHF_3$, He, a combination thereof, or the like.

Figure 25B:
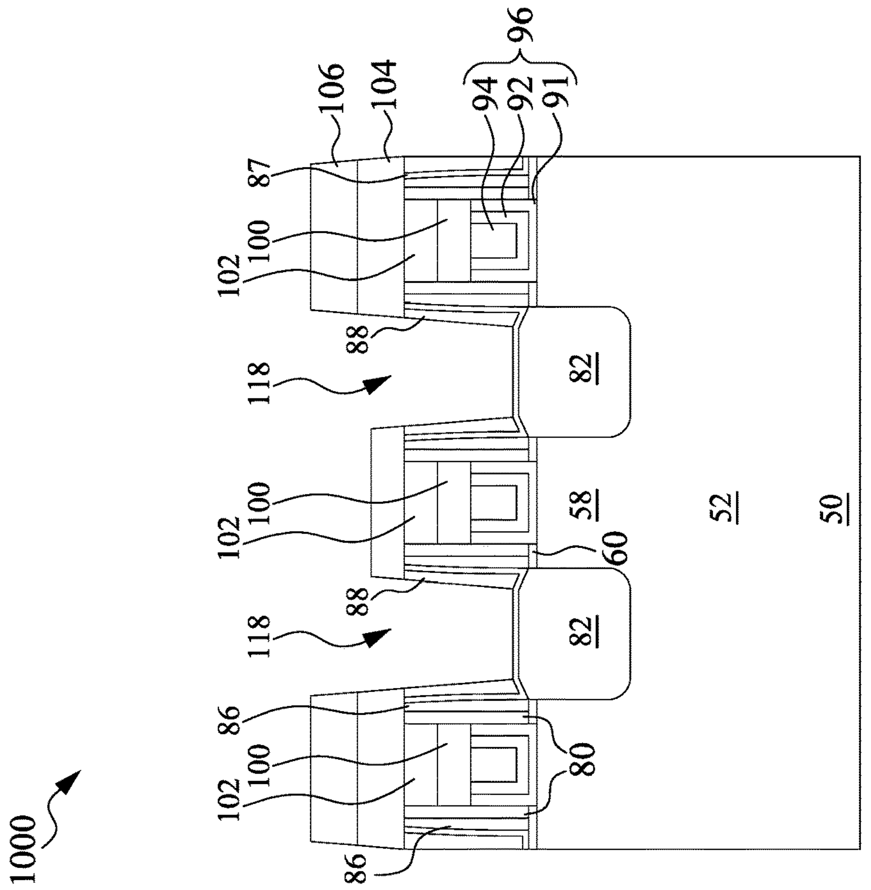
Figure 25A:
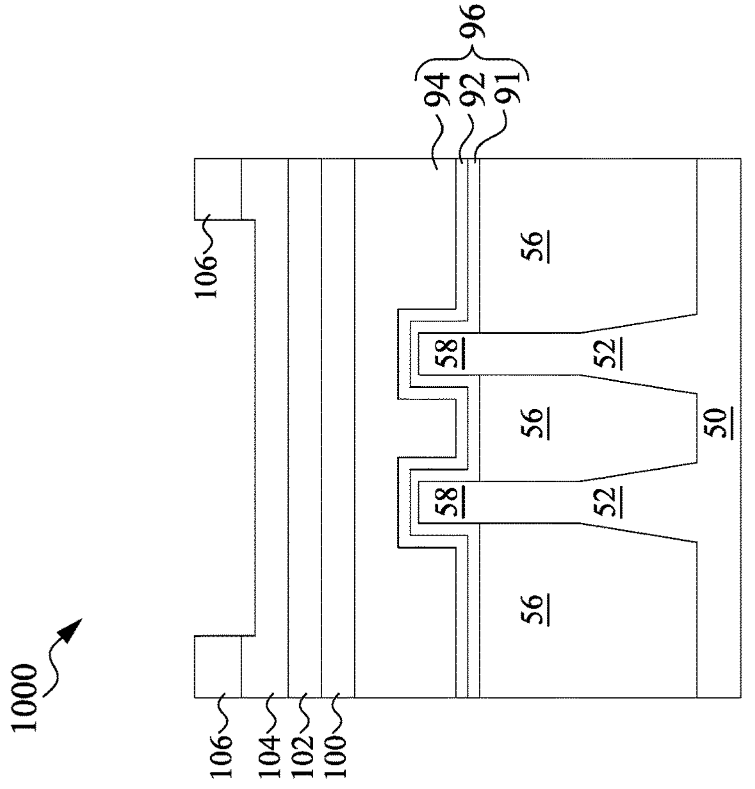
Figure 25C:
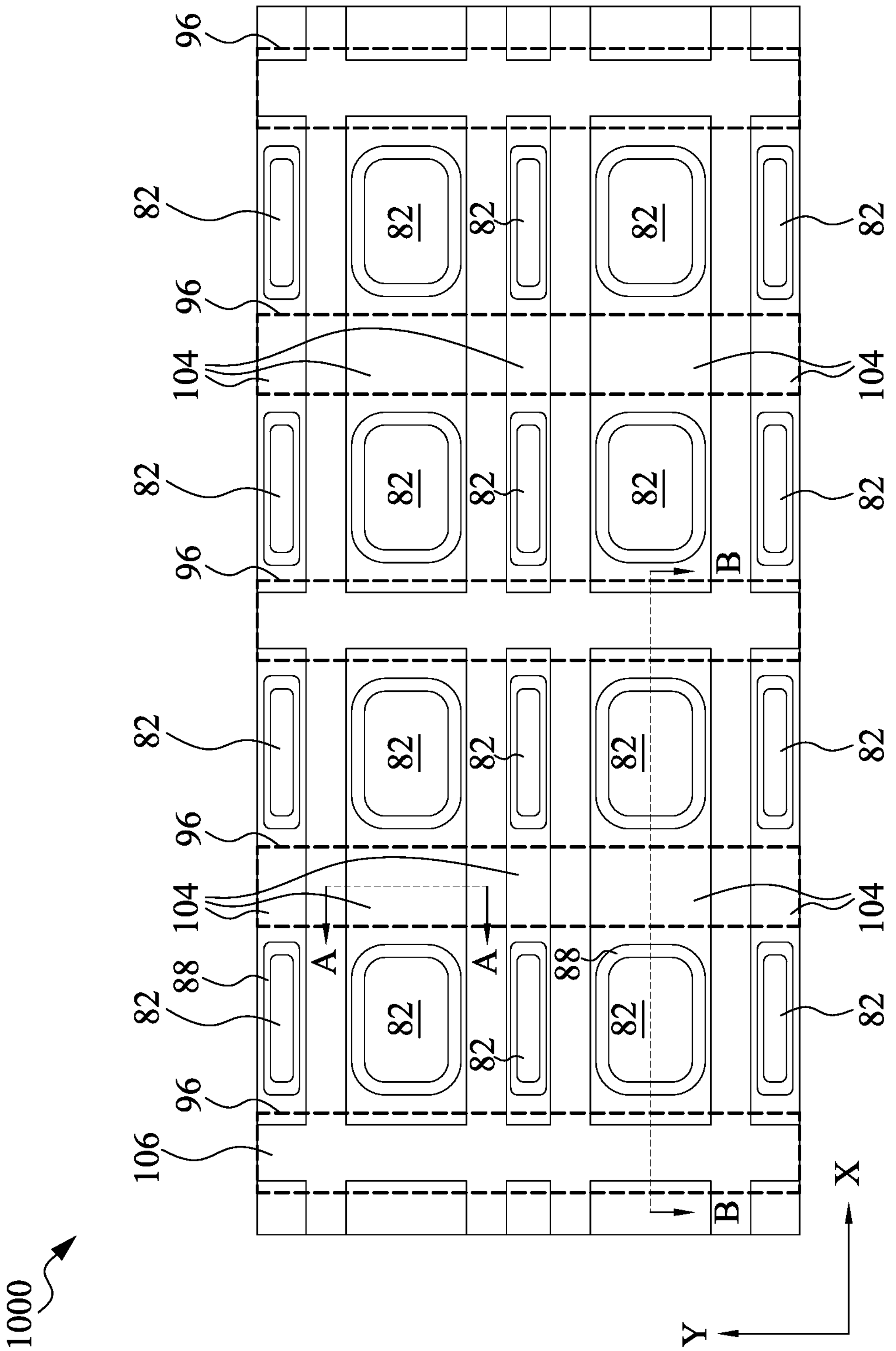

FIGS. 25A, 25B, and 25C illustrate a patterning process of the ILDs 88 and 106, the dielectric layer 104, and the CESL 87 to form openings 118. FIG. 25C illustrates a top view, FIG. 25A illustrates a cross-sectional view along a line AA in FIG. 25C, and FIG. 25B illustrates a cross-sectional view along a line BB in FIG. 25C. The openings 118 expose top surfaces of respective epitaxial source/drain regions 82. In some embodiments, the patterning process may comprise one or more suitable etch processes while using the patterned mask layers 108A and 108B (see FIGS. 24A, 24B, and 24C) as a combined etch mask. The one or more etch processes may comprise one or more dry etch processes, or the like. The etch processes may be anisotropic. In some embodiments, the one or more etch processes may be performed using etchants, such as $CF_4$, $CHF_3$, $CH_2F_2$, $C_4F_6$, $C_4F_8$, Ar, $O_2$, $N_2$, $H_2$, a combination thereof, or the like.

In some embodiments, the pattering process may fully remove the patterned mask layer 108B and may partially or fully remove the patterned mask layer 108A (see FIGS. 24A, 24B, and 24C). In some embodiments where the patterning process partially removes the patterned mask layer 108A, the remaining portion of patterned mask layer 108A is removed using, for example, a suitable etch process that is selective to a material of the patterned mask layer 108A. In some embodiments, the etch process comprises a dry etch process, a wet etch process, a combination thereof, or the like. In some embodiments, the suitable etch process may be performed using etchants, such as HCl, $H_2O_2$, a combination thereof, or the like.

Figure 26B:
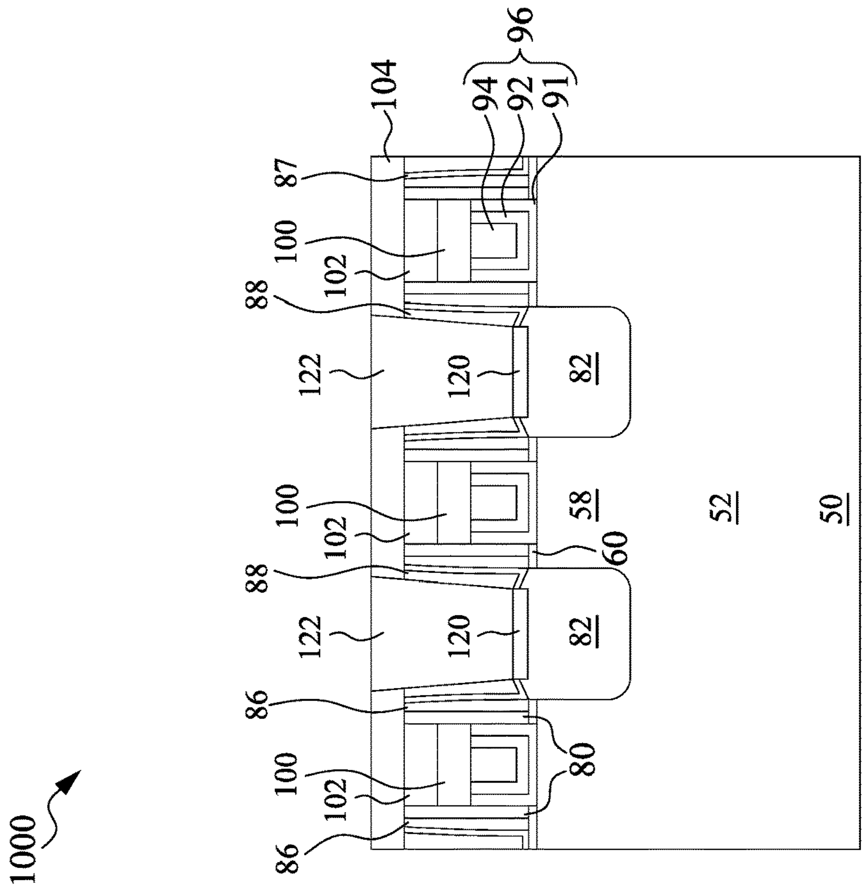
Figure 26A:
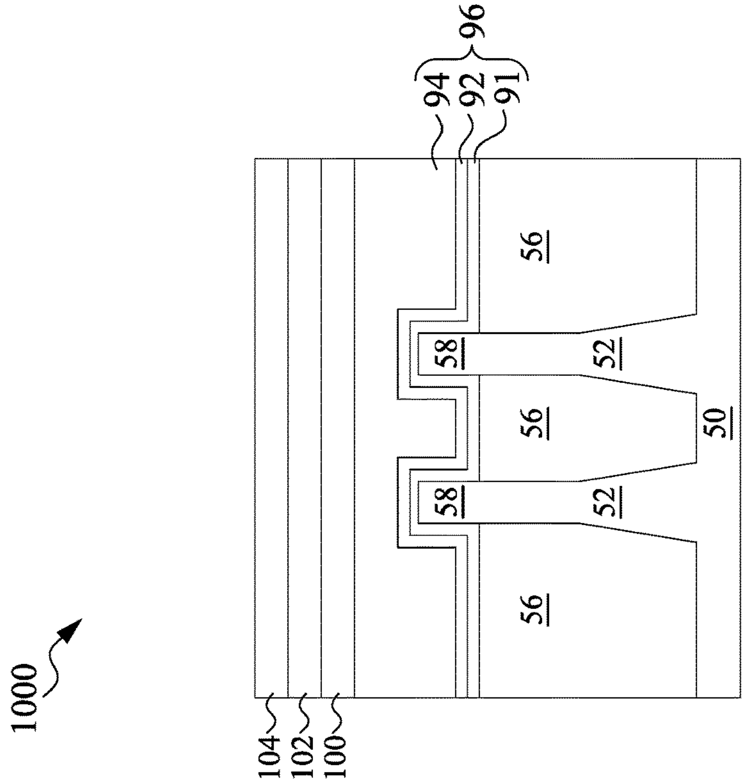

In FIGS. 26A and 26B, after forming the openings 118 (see FIGS. 25A, 25B, and 25C), silicide layers 120 are formed through the openings 118 over the epitaxial source/drain regions 82. In some embodiments, a metallic material is deposited in the openings 118. The metallic material may comprise Ti, Co, Ni, NiCo, Pt, NiPt, Ir, PtIr, Er, Yb, Pd, Rh, Nb, a combination thereof, or the like, and may be formed using PVD, sputtering, a combination thereof, or the like. Subsequently, an annealing process is performed to form the silicide layers 120. In some embodiments where the epitaxial source/drain regions 82 comprise silicon, the annealing process causes the metallic material to react with silicon to form a silicide of the metallic material at interfaces between the metallic material and the epitaxial source/drain regions 82. After forming the silicide layers 120, unreacted portions of the metallic material are removed using a suitable removal process, such as a suitable etch process, for example.

After forming the silicide layers 120, conductive features 122 are formed in the openings 118 (see FIGS. 25A, 25B, and 25C). The conductive features 122 provided electrical connections to respective epitaxial source/drain regions 82. In some embodiments, the conductive features 122 are formed by first forming a barrier layer (not individually shown) in the openings 118 and over the dielectric layer 104 and the ILD 106 (see FIGS. 25A, 25B, and 25C). The barrier layer may extend along a bottom and sidewalls of the openings 118. The barrier layer may comprise titanium, titanium nitride, tantalum, tantalum nitride, a combination thereof, a multilayer thereof, or the like, and may be formed by ALD, CVD, PVD, sputtering, a combination thereof, or the like. Subsequently, an adhesion layer (not individually shown) is formed over the barrier layer within the openings 118 and over the dielectric layer 104 and the ILD 106. The adhesion layer may comprise cobalt, ruthenium, an alloy thereof, a combination thereof, a multilayer thereof, or the like, and may be formed by ALD, CVD, PVD, sputtering, a combination thereof, or the like. After forming the adhesion layer, a seed layer (not individually shown) is formed over the adhesion layer within the openings 118 and over the dielectric layer 104 and the ILD 106. The seed layer may comprise copper, titanium, nickel, gold, manganese, a combination thereof, a multilayer thereof, or the like, and may be formed by ALD, CVD, PVD, sputtering, a combination thereof, or the like. Subsequently, a conductive fill material (not individually shown) is formed over the seed layer within the openings 118 and over the dielectric layer 104 and the ILD 106. In some embodiments, the conductive fill material overfills the openings 118. The conductive fill material may comprise copper, aluminum, tungsten, ruthenium, cobalt, combinations thereof, alloys thereof, multilayers thereof, or the like, and may be formed using, for example, by plating, ALD, CVD, PVD, or other suitable methods.

After forming the conductive fill material, a planarization process is performed to remove portions of the barrier layer, the adhesion layer, the seed layer, and the conductive fill material overfilling the openings 118 (see FIGS. 25A, 25B, and 25C). Remaining portions of the barrier layer, the adhesion layer, the seed layer, and the conductive fill material form the conductive features 122 in the openings 118. The planarization process may comprise a CMP process, an etch back process, a grinding process, combinations thereof, or the like. In some embodiments, the planarization process also removes the ILD 106 (see FIGS. 25A, 25B, and 25C) and a portion of the dielectric layer 104. After performing the planarization process, top surfaces of the conductive features 122 and a top surface of the dielectric layer 104 are substantially level or coplanar within process variations of the planarization process.

Figure 27B:
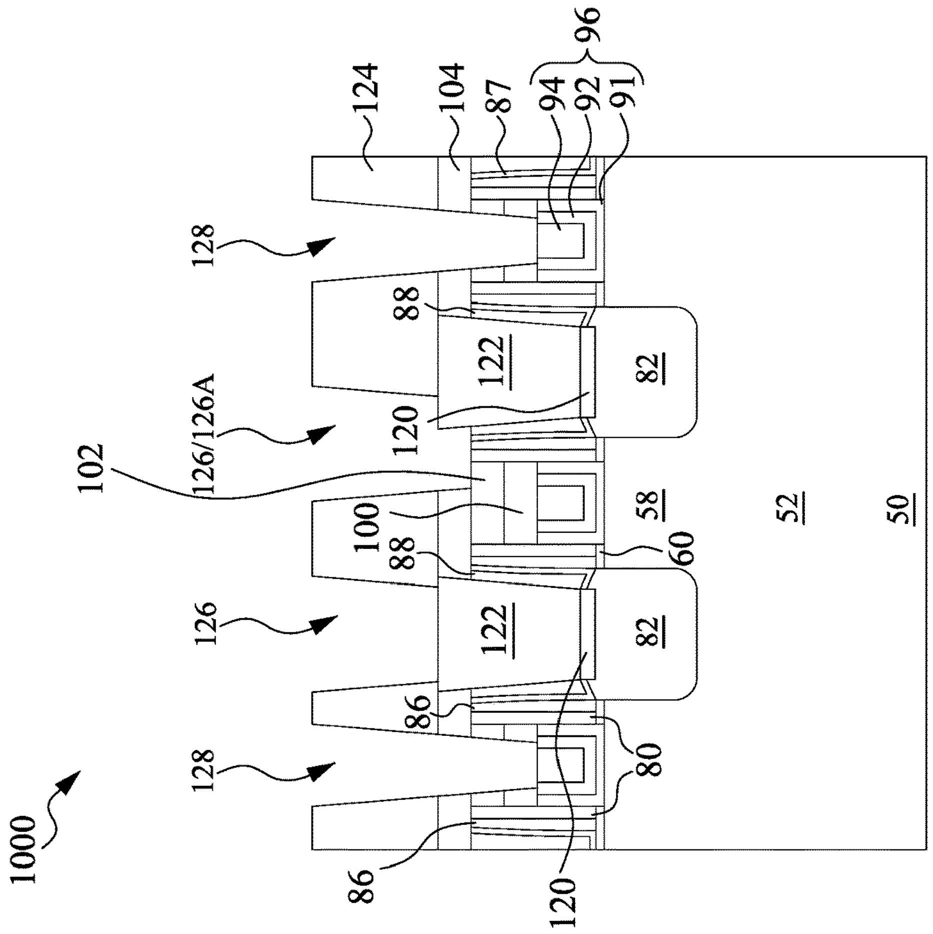
Figure 27A:
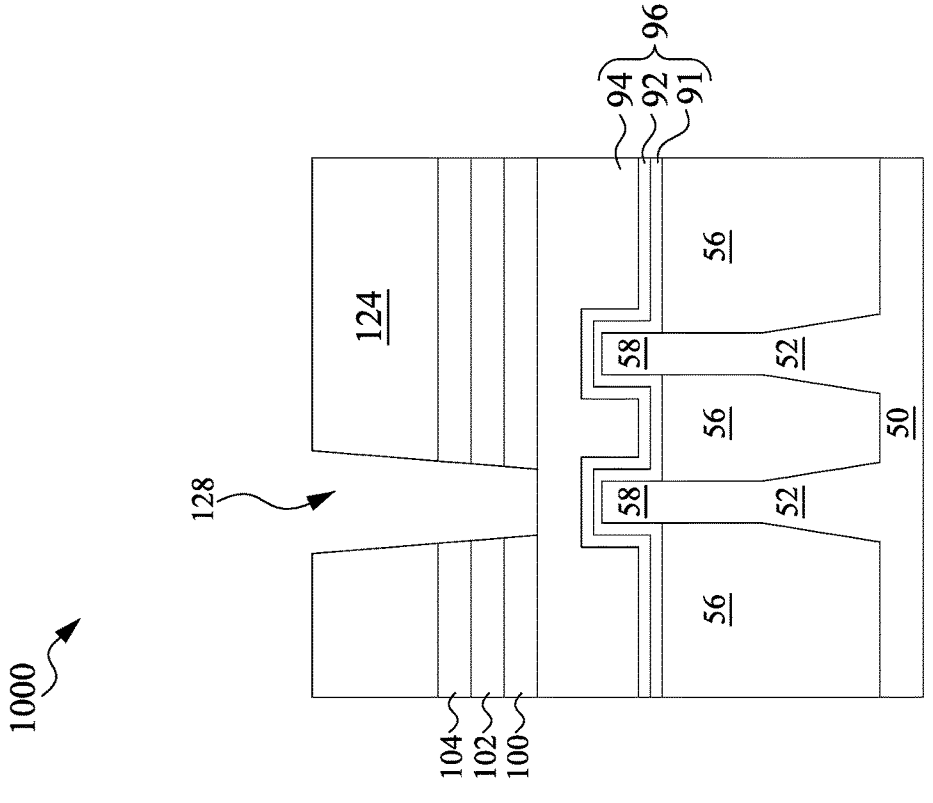

In FIGS. 27A and 27B, an ILD 124 is formed over the dielectric layer 104 and the conductive features 122. In some embodiments, the ILD 124 may be formed using similar materials and methods as the ILD 88 described above with reference to FIGS. 11A and 11B, and the description is not repeated herein. In some embodiments, the ILDs 124 and 88 comprise a same material. In other embodiments, the ILDs 124 and 88 comprise different materials. In some embodiments, the ILD 124 is patterned to form openings 126 in the ILD 124. The openings 126 expose respective conductive features 122. In some embodiments, the patterning process comprises suitable photolithography and etch processes. The suitable etch process may comprise one or more dry etch processes. The etch process may be anisotropic. In some embodiments, the suitable etch process is performed using etchant, such as $CF_4$, $CHF_3$, $CH_2F_2$, $C_4F_6$, $C_4F_8$, Ar, $O_2$, $N_2$, $H_2$, a combination thereof, or the like.

In some embodiments, some of the openings 126 (such as the opening 126A) may be laterally shifted with respect to the underlying conductive feature 122, such that a center axis of the opening 126A is laterally shifted with respect to a center axis of the underlying conductive feature 122. In some embodiments, due to the shift, the opening 126A extends below the top surface of the underlying conductive feature 122, extends through the dielectric layer 104 and exposes the dielectric layer 102. As described above in greater detail with reference to FIGS. 18A, 18B, 19A, and 19B, the dielectric layers 102 and 104 are formed of different materials. In some embodiments, a material of the dielectric layer 102 is chosen such that the dielectric layer 102 acts as an etch stop layer while forming the opening 126A. In such embodiments, the opening 126A does not extend below a top surface of the dielectric layer 102. Accordingly, leakage between a conductive feature that is subsequently formed in the opening 126A and an adjacent gate stack 96 is reduced. In some embodiments, a ratio of an etch rate of the dielectric layer 104 to an etch rate of the dielectric layer 102 for the etch process for forming the opening 126A is between about 2 and about 10.

Further in FIGS. 27A and 27B, the dielectric layers 100, 102 and 104, and the ILD 124 are patterned to form openings 128 in the dielectric layers 100, 102 and 104, and the ILD 124. The openings 128 expose respective gate stacks 96. In some embodiments, the patterning process comprises suitable photolithography and etch processes. The suitable etch process may comprise one or more dry etch processes. The etch process may be anisotropic. In some embodiments, the suitable etch process is performed using etchant, such as $CF_4$, $CHF_3$, $CH_2F_2$, $C_4F_6$, $C_4F_8$, Ar, $O_2$, $N_2$, $H_2$, a combination thereof, or the like. In some embodiments, the openings 128 are formed after forming the openings 126. In such embodiments, the openings 126 are protected by, for example, a mask while forming the openings 128. In other embodiments, the openings 128 are formed before forming the openings 126. In such embodiments, the openings 128 are protected by, for example, a mask while forming the openings 126.

Figure 28B:
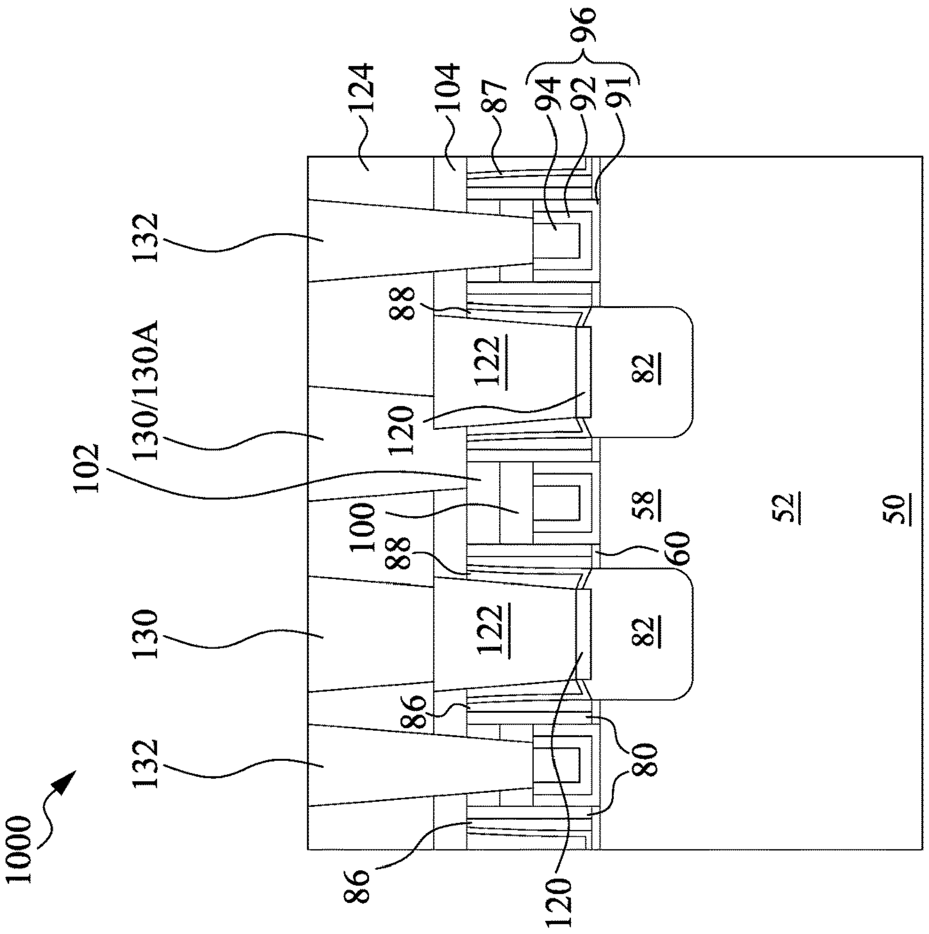
Figure 28A:
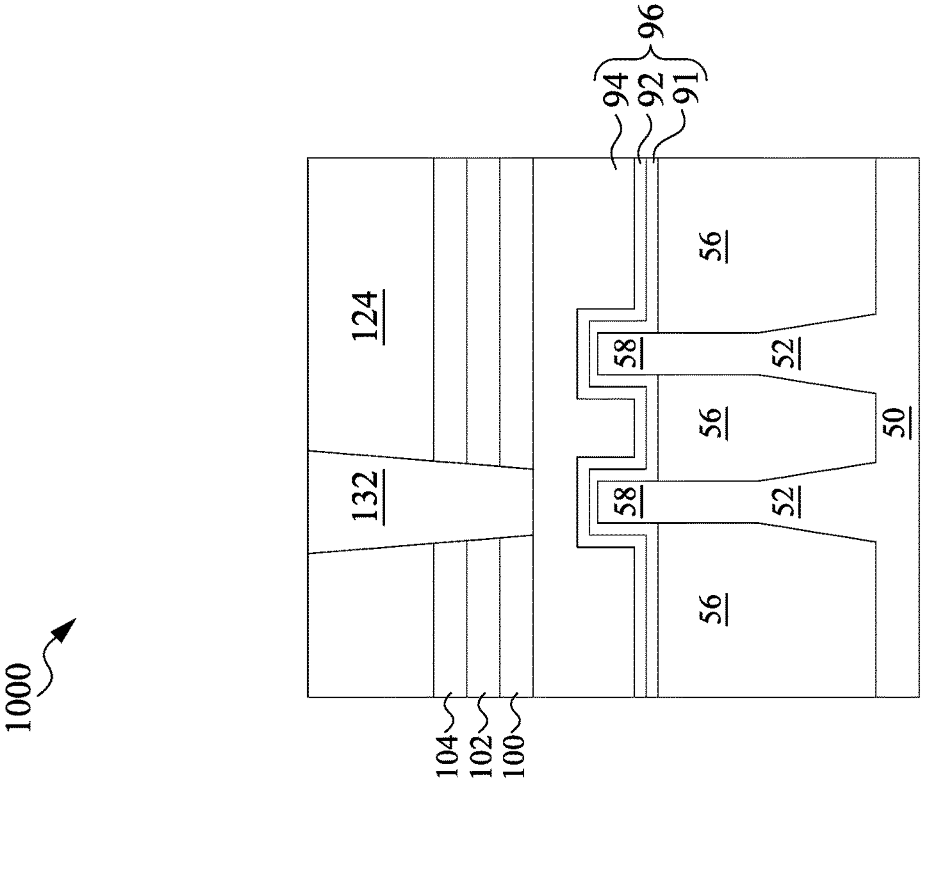

In FIGS. 28A and 28B, conductive features 130 are formed in the openings 126 (see FIGS. 27A and 27B) and conductive features 132 are formed in the openings 128 (see FIGS. 27A and 27B). The conductive features 130 and respective conductive features 122 provide electrical connections to respective epitaxial source/drain regions 82. Accordingly, a combination of a conductive feature 130 and a respective conductive feature 122 may be also referred to as a source/drain contact plug. The conductive features 132 provide electrical connections to respective gate stacks 96. Accordingly, the conductive feature 132 may be also referred to as gate contact plugs.

In some embodiments, the conductive features 130 and 130 may be formed using similar materials and methods as the conductive features 122 described above with reference to FIGS. 26A and 26B, and the description is not repeated herein. In some embodiments, a conductive fill material of the conductive features 130 is same as a conductive fill material of the conductive features 132. In other embodiments, the conductive fill material of the conductive features 130 is different from the conductive fill material of the conductive features 132. In some embodiments, the conductive fill material of the conductive features 130 and the conductive fill material of the conductive features 132 are same as the conductive fill material of the conductive features 122. In other embodiments, the conductive fill material of the conductive features 130 and the conductive fill material of the conductive features 132 are different from the conductive fill material of the conductive features 122. In some embodiments, top surfaces of the conductive features 130 and 132, and a top surface of the ILD 124 are substantially level or coplanar.

Further in FIGS. 28A and 28B, the conductive feature 130A that is formed in the opening 126A (see FIGS. 27A and 27B) is laterally shifted with respect to the underlying conductive feature 122, such that a center axis of the conductive feature 130A is laterally shifted with respect to a center axis of the underlying conductive feature 122. By forming the openings 126A as described above with references to FIGS. 27A and 27B, a bottommost surface of the conductive feature 130A does not extend below the top surface of the dielectric layer 102. Accordingly, leakage between a source/drain contact plug (comprising the conductive features 130A and 122) and the adjacent gate stack 96 is reduced.

Figure 29B:
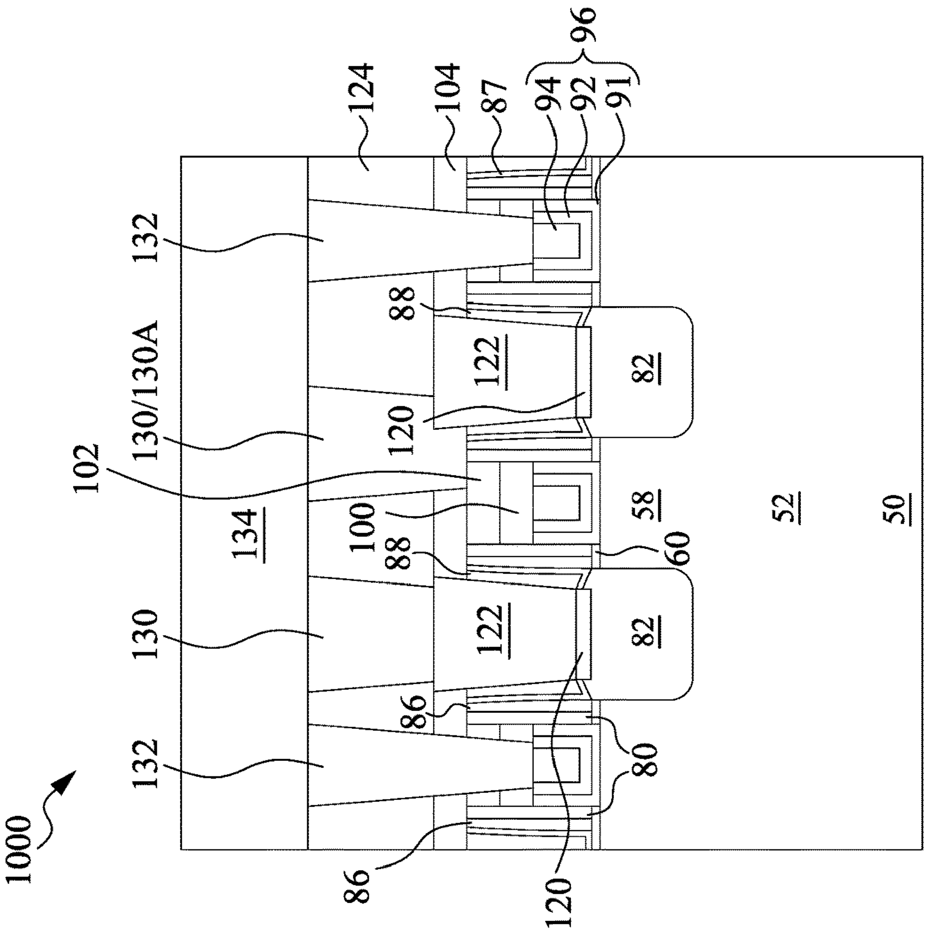
Figure 29A:
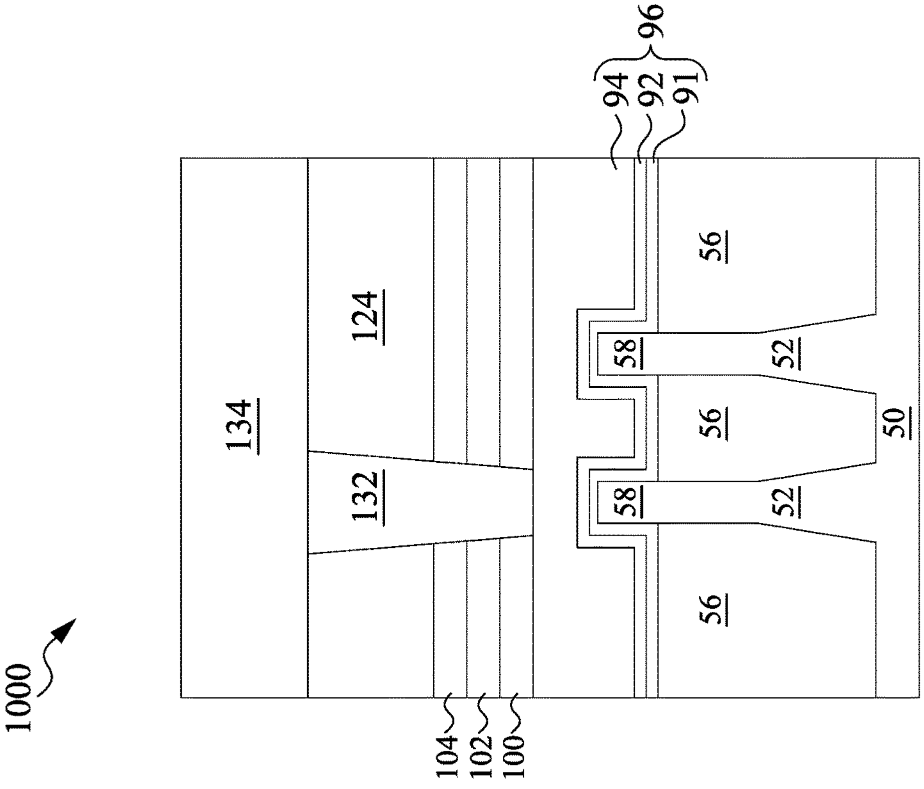

In FIGS. 29A and 29B, in some embodiments, an interconnect structure 134 is formed over the conductive features 130 and 132, and the ILD 124. In some embodiments, the interconnect structure 134 comprises a plurality of dielectric layers such as inter-metal dielectrics (IMDs) (not individually illustrated) and conductive features (not individually illustrated) within the IMDs. The IMDs may be formed using similar materials and methods as the ILD 88 described above with reference to FIGS. 11A and 11B, and the description is not repeated herein. The conductive features comprise conductive lines and conductive vias, and may be formed using a single damascene method, a dual damascene method, a combination thereof, or the like. The conductive features of the interconnect structure 134 are in electrical contact with the conductive connectors 130 and 132.

Figure 30B:
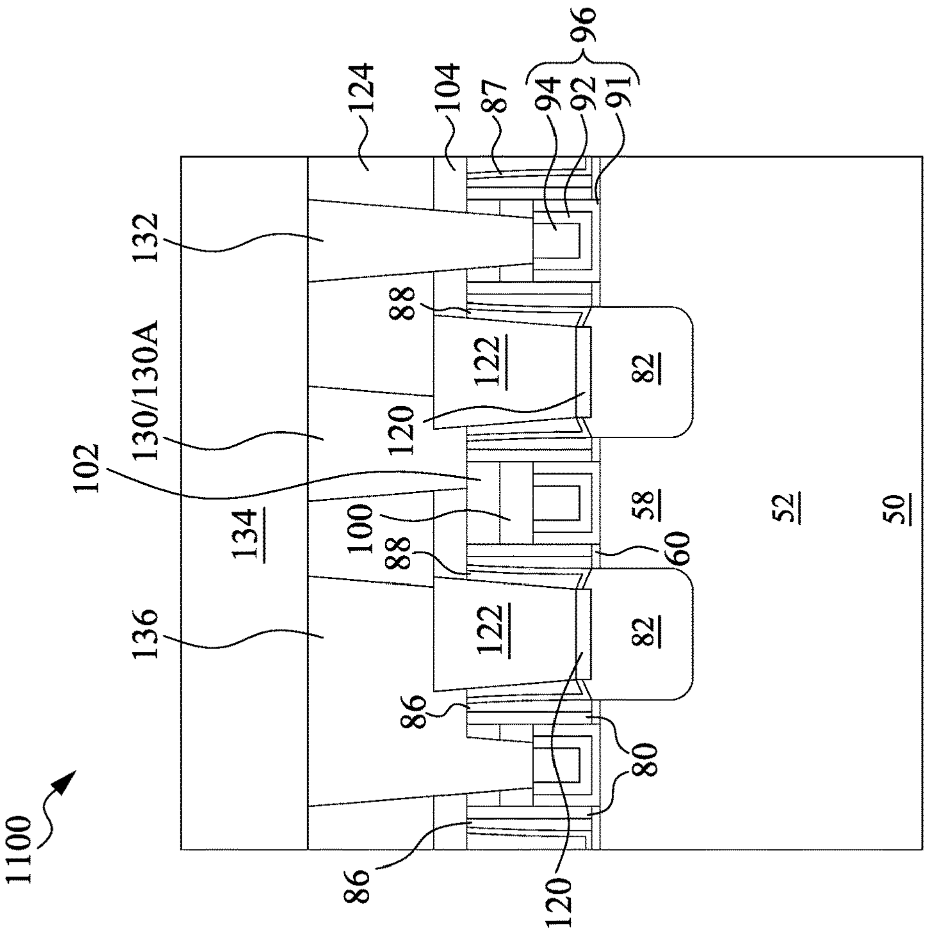
FIGS. 30A and 30B are cross-sectional views of a FinFET device in accordance with some embodiments.
Figure 30A:
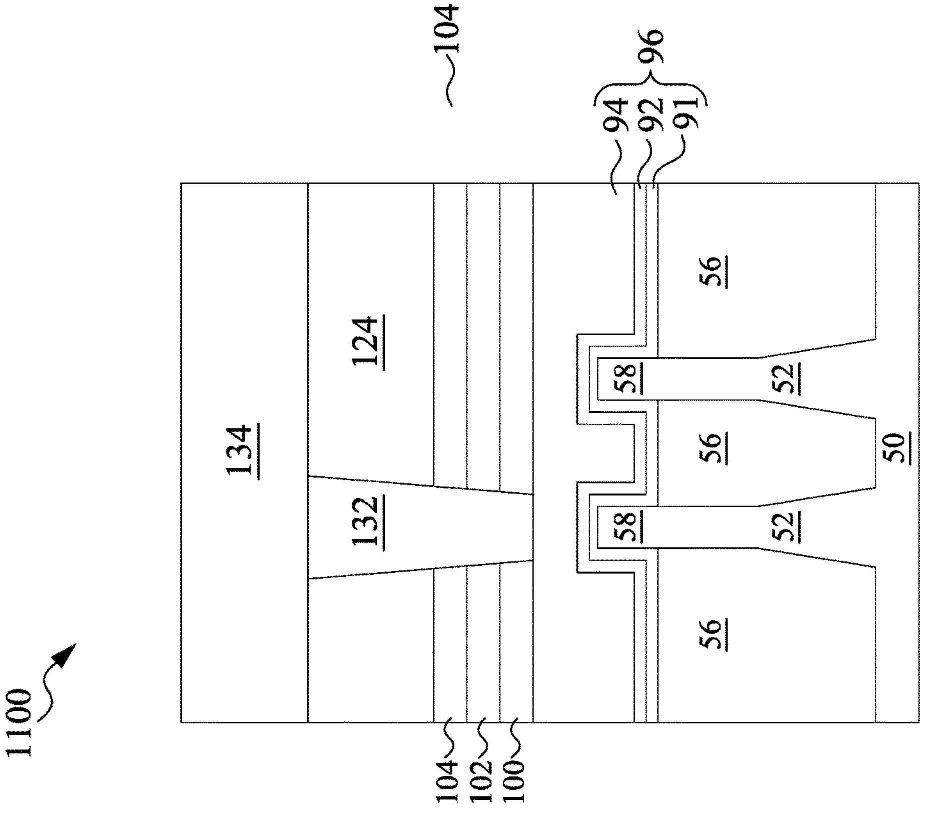

FIGS. 30A and 30B illustrate cross-sectional views of a FinFET device 1100 in accordance with some embodiments. FIG. 30A is illustrated along the reference cross-section A-A illustrated in FIG. 1, except for multiple fins/FinFETs. FIG. 30B is illustrated along the reference cross-section B-B illustrated in FIG. 1, except for multiple gates. In some embodiments, the FinFET device 1100 is similar to the FinFET device 1000 (see FIGS. 29A and 29B), with similar features being labeled by similar numerical references, and descriptions of the similar features are not repeated herein. In some embodiments, the FinFET device 1100 may be formed using process steps that are similar to the process steps described above with reference to FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15A, 15B, 16A, 16B, 17A, 17B, 18A, 18B, 19A, 19B, 20A, 20B, 21A, 21B, 21C, 22A, 22B, 22C, 23A, 23B, 23C, 24A, 24B, 24C, 25A, 25B, 25C, 26A, 26B, 27A, 27B, 28A, 28B, 29A, and 29B, and the description is not repeated herein. In contrast with the FinFET device 1000 where the conductive features 130 are electrically isolated from the conductive features 132 by the ILD 124, in the FinFET device 1100, some of the conductive features 130 and 132 may be formed such that at least one of the conductive features 130 is merged with at least one of the conductive features 132 to form a combined conductive feature 136. The conductive feature 136 electrically connects a gate stack 96 to a respective epitaxial source/drain region 82 though the conductive feature 122.

FIGS. 31A, 31B, 31C, 32A, 32B, 32C, 33A, 33B, 33C, 34A, 34B, 34C, 35A, 35B, 36A, and 36B are top and cross-sectional views of intermediate stages in the manufacturing of a FinFET device 1200 in accordance with some embodiments. FIGS. 31A-36A are illustrated along the reference cross-section A-A illustrated in FIG. 1, except for multiple fins/FinFETs. FIGS. 31B-36B are illustrated along the reference cross-section B-B illustrated in FIG. 1, except for multiple gates. FIGS. 31C-34C illustrate top views.

Figure 31B:
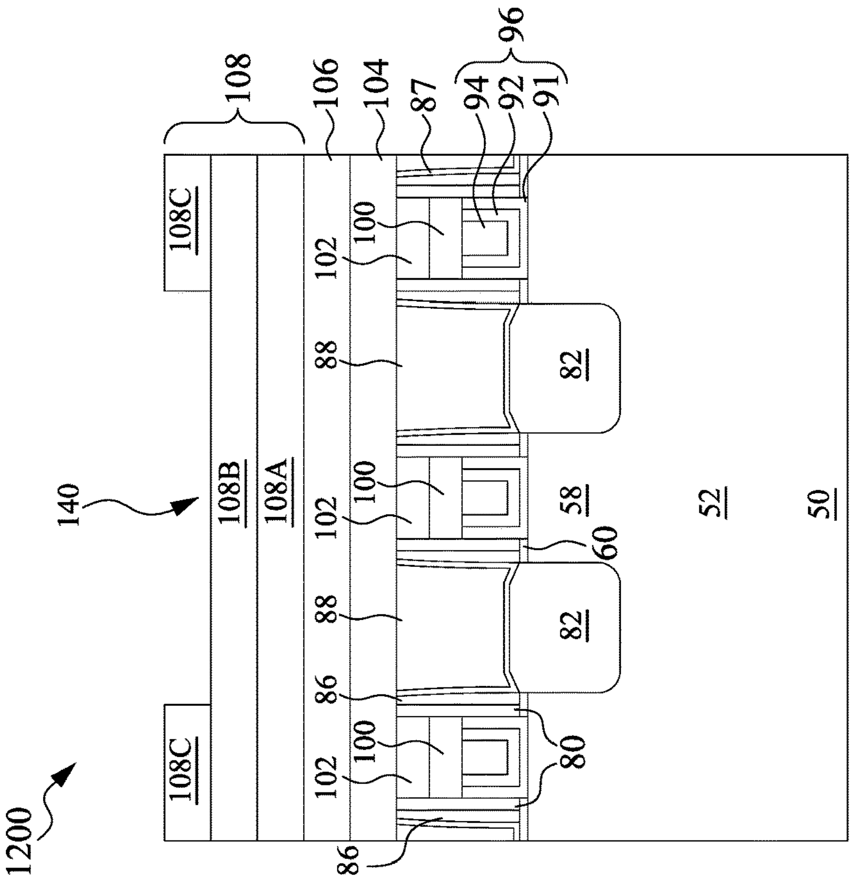
FIGS. 31A, 31B, 31C, 32A, 32B, 32C, 33A, 33B, 33C, 34A, 34B, 34C, 35A, 35B, 36A, and 36B are top and cross-sectional views of intermediate stages in the manufacturing of a FinFET device in accordance with some embodiments.
Figure 31A:
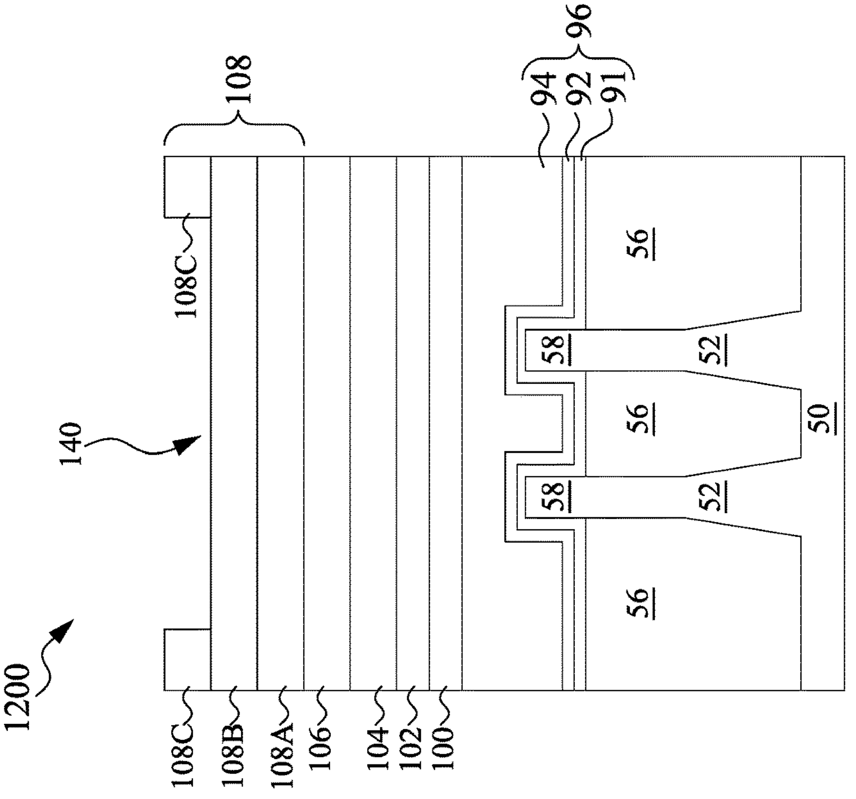
Figure 31C:
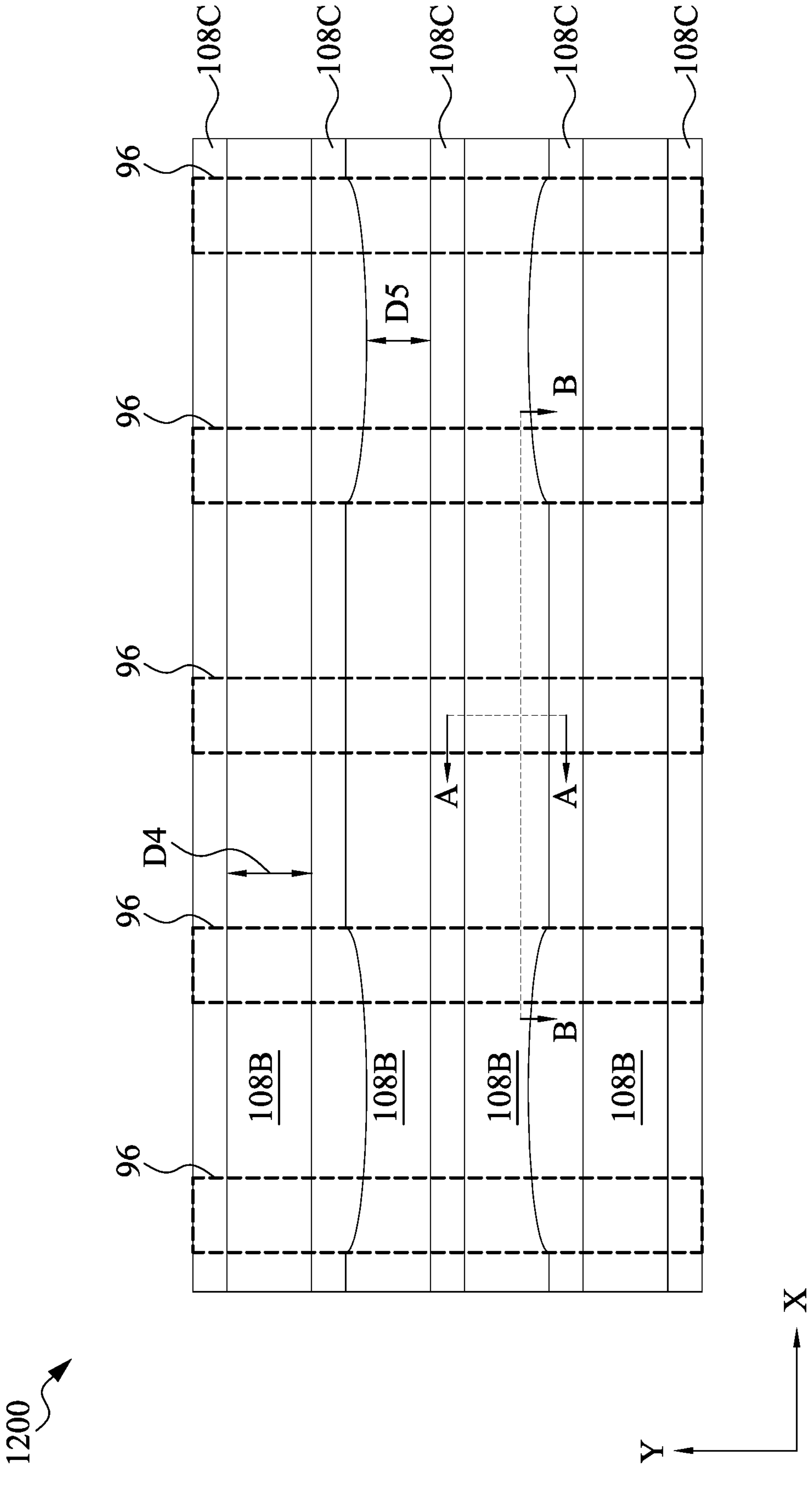

FIGS. 31A, 31B, and 31C illustrate a patterning process of the mask layer 108C after forming the mask stack 108 as described above with reference to FIGS. 20A and 20B. FIG. 31C illustrates a top view, FIG. 31A illustrates a cross-sectional view along a line AA in FIG. 31C, and FIG. 31B illustrates a cross-sectional view along a line BB in FIG. 31C. The patterning process forms a plurality of openings 140 in the mask layer 108C. The openings 140 expose portions of the mask layer 108B. In some embodiments, the mask layer 108C is patterned using process steps described above with references to FIGS. 21A, 21B, and 21C, and the description is not repeated herein.

In some embodiments, the patterned mask layer 108C comprises a plurality of elongated portions extending along a first direction (such as the X direction) and spaced apart in a second direction (such as the Y direction) perpendicular to the first direction in the top view illustrated in FIG. 31C. In some embodiments, the plurality of elongated portions have a non-uniform pitch. In other embodiments, the plurality of elongated portions have a uniform pitch. In some embodiments, a distance between adjacent elongated portions along the second direction (such as the Y direction) sets a width of the subsequently formed conductive features that provide electrical connections to the epitaxial source/drain regions 82. In the illustrated embodiments, a first group of the elongated portions of the patterned mask layer 108C has a uniform width, and a second group of the elongated portions of the patterned mask layer 108C has a non-uniform width. Each of the elongate portions in the second group comprise first portions of uniform widths and second portion of non-uniform widths arranged in an alternating manner along the first direction. In some embodiments, a distance D4 between an elongated portion having a uniform width and a uniform-width portion of an adjacent elongated portion having a non-uniform width is between about 10 nm and about 1000 nm. In some embodiments, a distance D5 between an elongated portion having a uniform width and a non-uniform-width portion of an adjacent elongated portion having a non-uniform width is between about 10 nm and about 1000 nm. Values of the distance D4 and the distance D5 may vary based on design layout requirements of the FinFET device 1200.

Figure 32B:
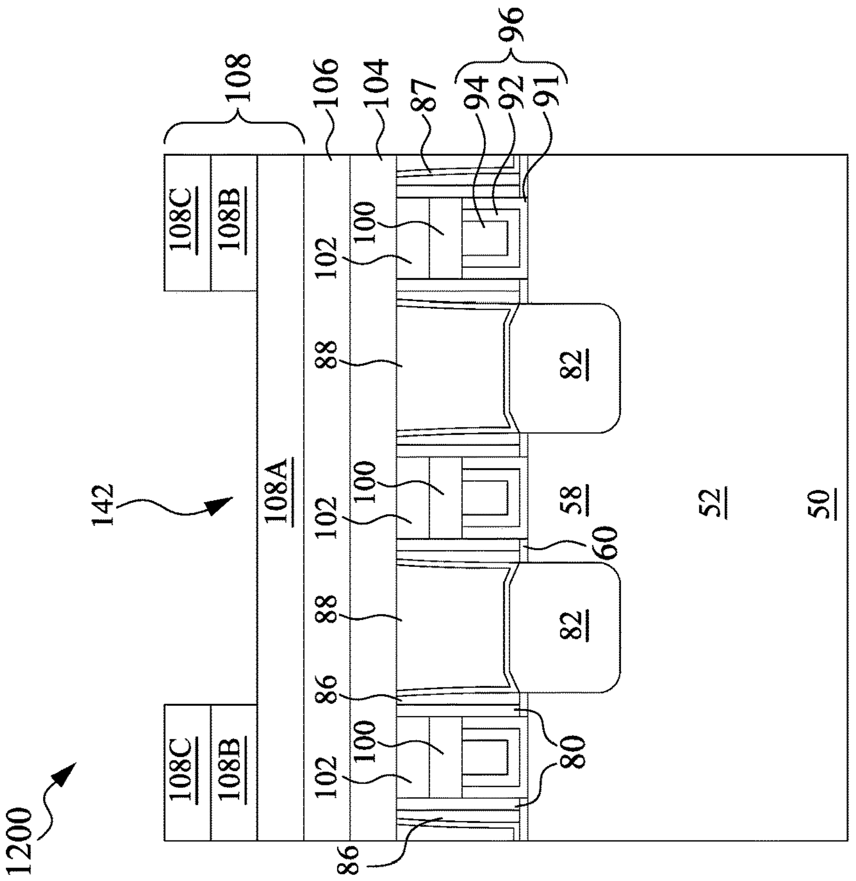
Figure 32A:
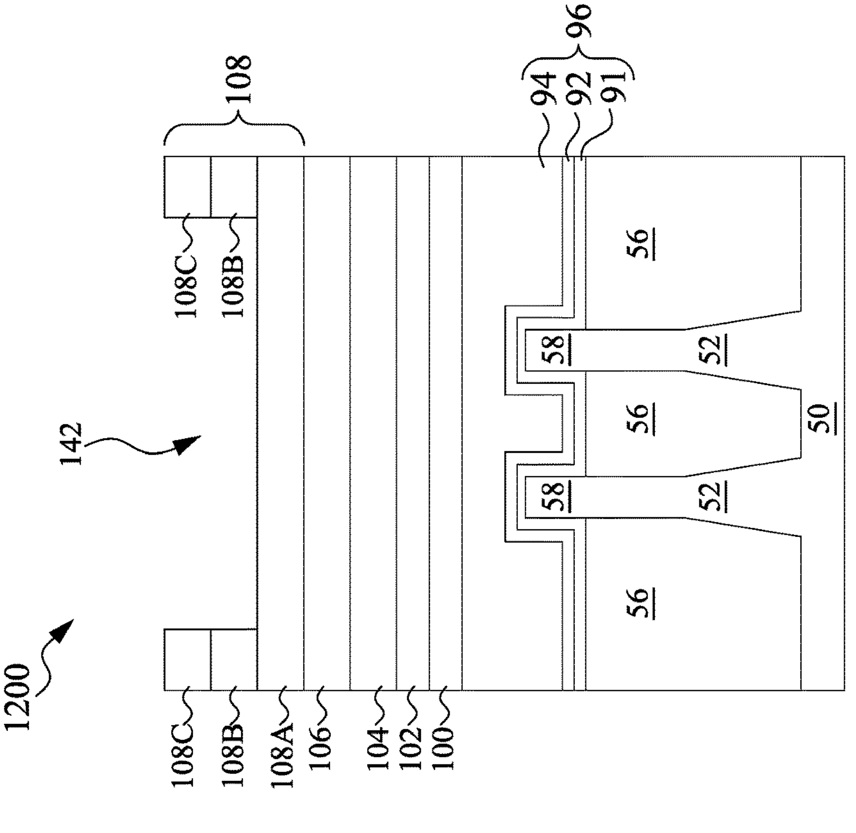
Figure 32C:
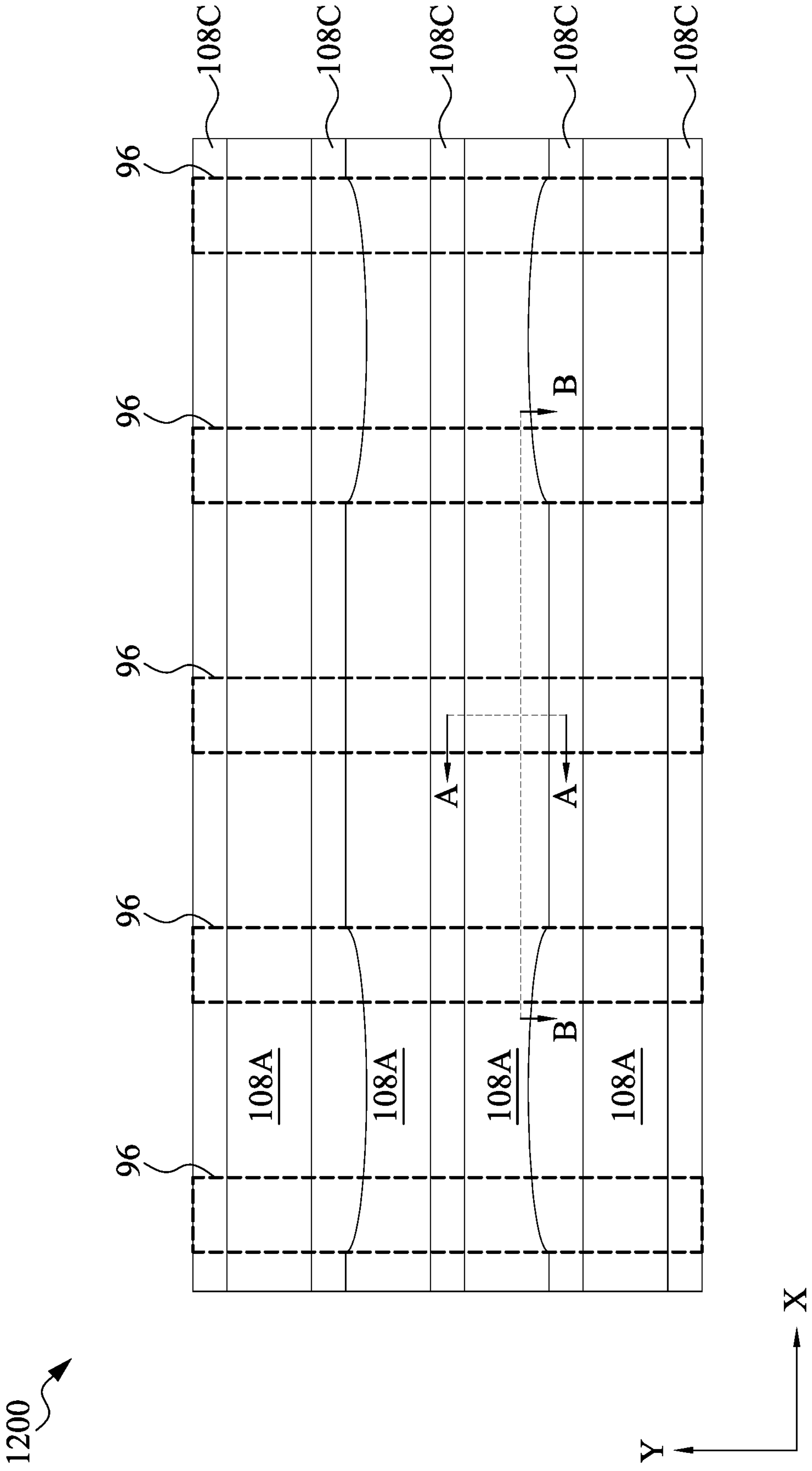

FIGS. 32A, 32B, and 32C illustrate a patterning process of the mask layer 108B. FIG. 32C illustrates a top view, FIG. 32A illustrates a cross-sectional view along a line AA in FIG. 32C, and FIG. 32B illustrates a cross-sectional view along a line BB in FIG. 32C. The patterning process forms a plurality of openings 142 in the mask layer 108B. The openings 142 expose portions of the mask layer 108A.

In some embodiments, before patterning the mask layer 108B, a patterned photoresist mask similar to the patterned mask 112 described above with reference to FIGS. 22A, 22B, and 22C is formed over the mask layer 108B and the patterned mask layer 108C. In the illustrated embodiments, a distance between elongated portions of patterned photoresist mask (see FIGS. 22A, 22B, and 22C) is greater than a width of a portion of the FinFET device 1200 illustrated in FIGS. 32A, 32B, and 32C, and the patterned photoresist mask is not shown in FIGS. 32A, 32B, and 32C.

After forming the patterned photoresist mask, the mask layer 108B is patterned using the patterned mask layer 108C and patterned photoresist mask as a combined etch mask. In some embodiments, the mask layer 108B is patterned using process steps described above with references to FIGS. 23A, 23B, and 23C, and the description is not repeated herein. After completing the patterning process of the mask layer 108B, the patterned photoresist mask is removed by an acceptable ashing process followed by a wet clean process.

Figure 33A:
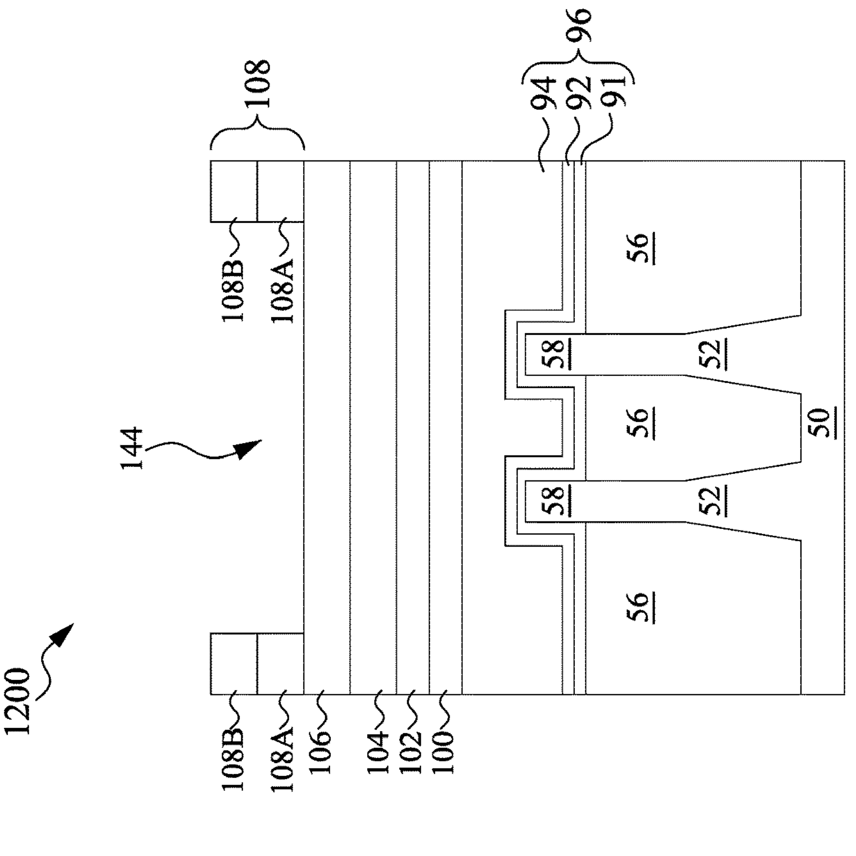
Figure 33B:
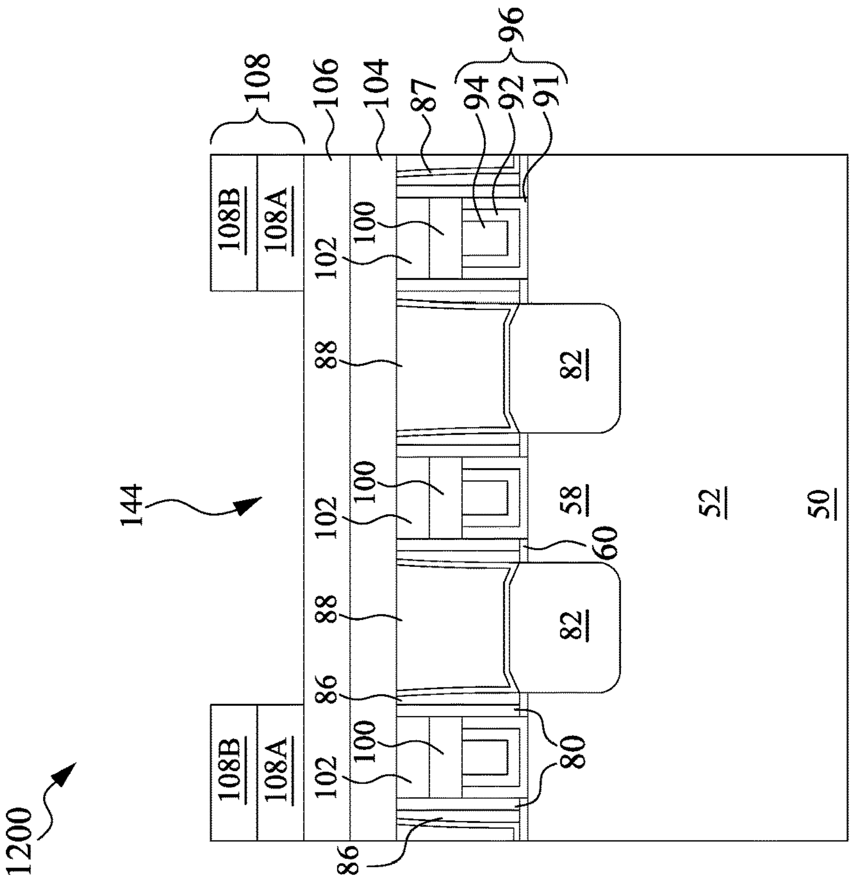
Figure 33C:
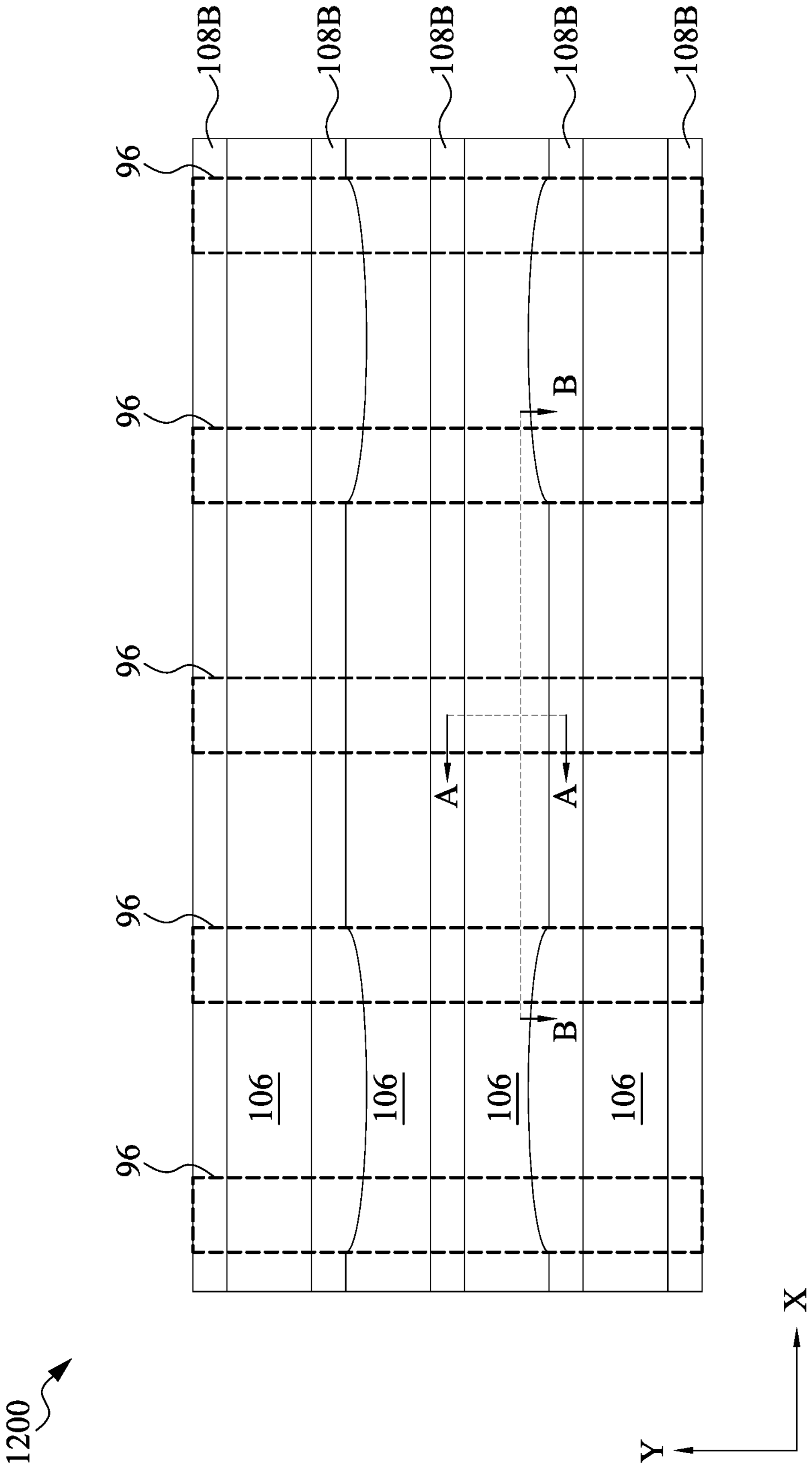

FIGS. 33A, 33B, and 33C illustrate a patterning process of the mask layer 108A. FIG. 33C illustrates a top view, FIG. 33A illustrates a cross-sectional view along a line AA in FIG. 33C, and FIG. 33B illustrates a cross-sectional view along a line BB in FIG. 33C. The patterning process forms a plurality of openings 144 in the mask layer 108A. The openings 144 expose portions of the ILD 106. In some embodiments, the mask layer 108A is patterned using process steps described above with references to FIGS. 24A, 24B, and 24C, and the description is not repeated herein.

After completing the patterning process of the mask layer 108A, the patterned mask layer 108C (see FIGS. 32A, 32B, and 32C) is removed. In some embodiments, the patterned mask layer 108C is removed using process steps described above with references to FIGS. 24A, 24B, and 24C, and the description is not repeated herein.

Figure 34B:
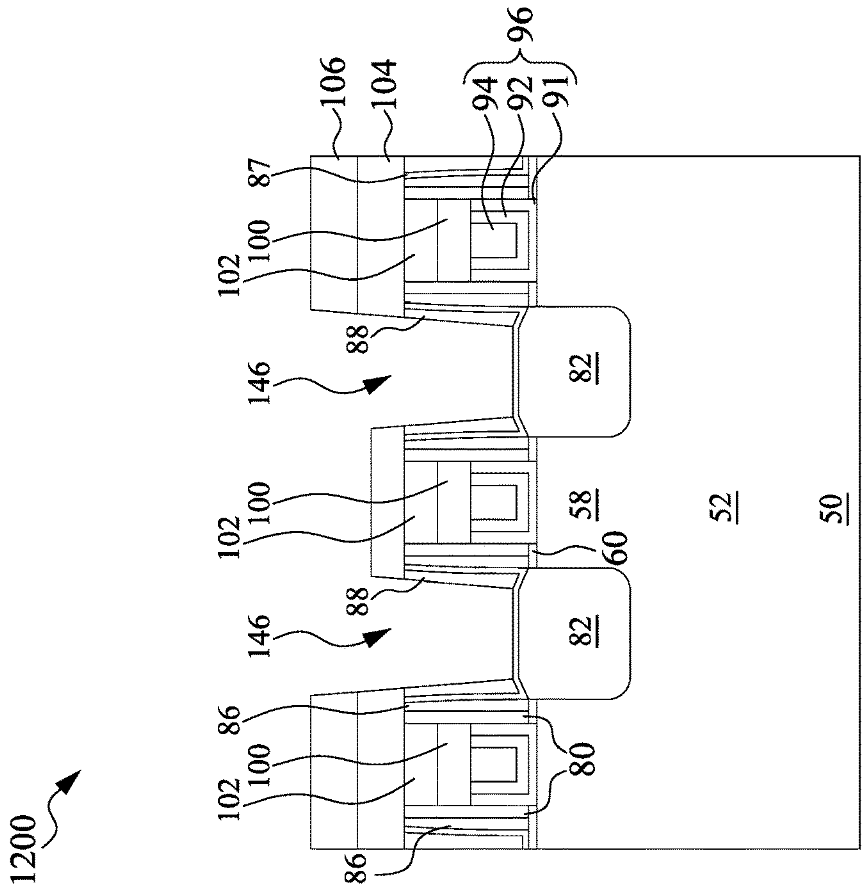
Figure 34A:
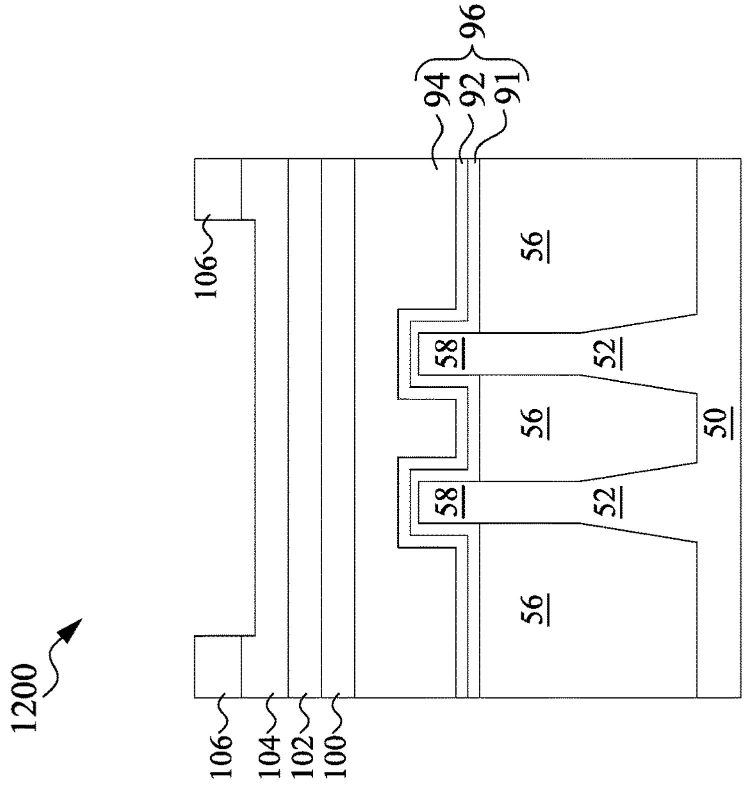
Figure 34C:
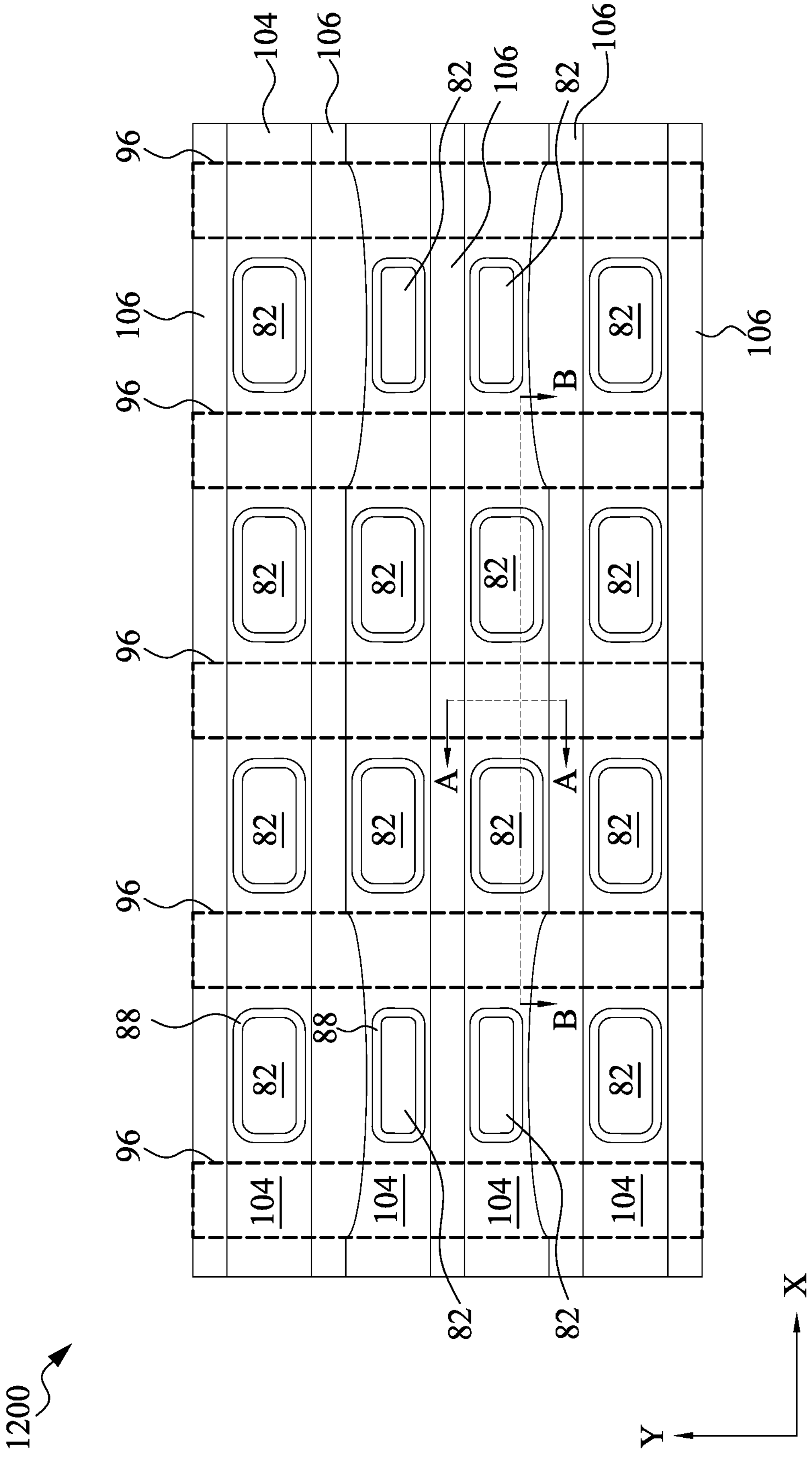

FIGS. 34A, 34B, and 34C illustrate a patterning process of the ILDs 88 and 106, the dielectric layer 104, and the CESL 87 to form openings 146. FIG. 34C illustrates a top view, FIG. 34A illustrates a cross-sectional view along a line AA in FIG. 34C, and FIG. 34B illustrates a cross-sectional view along a line BB in FIG. 34C. In some embodiments, the ILDs 88 and 106, the dielectric layer 104, and the CESL 87 are patterned using process steps described above with references to FIGS. 25A, 25B, and 25C, and the description is not repeated herein.

In some embodiments, the pattering process may fully remove the patterned mask layer 108B and may partially or fully remove the patterned mask layer 108A (see FIGS. 33A, 33B, and 33C). In some embodiments where the patterning process partially removes the patterned mask layer 108A, the remaining portion of patterned mask layer 108A is removed as described above with references to FIGS. 25A, 25B, and 25C, and the description is not repeated herein.

Figure 35B:
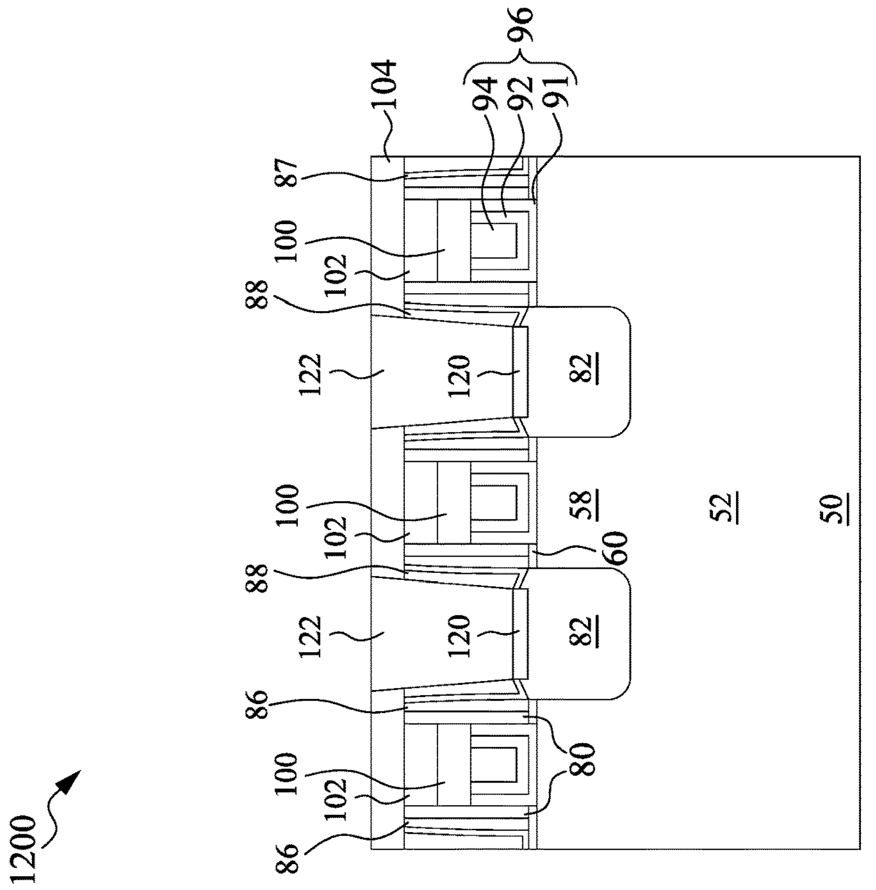
Figure 35A:
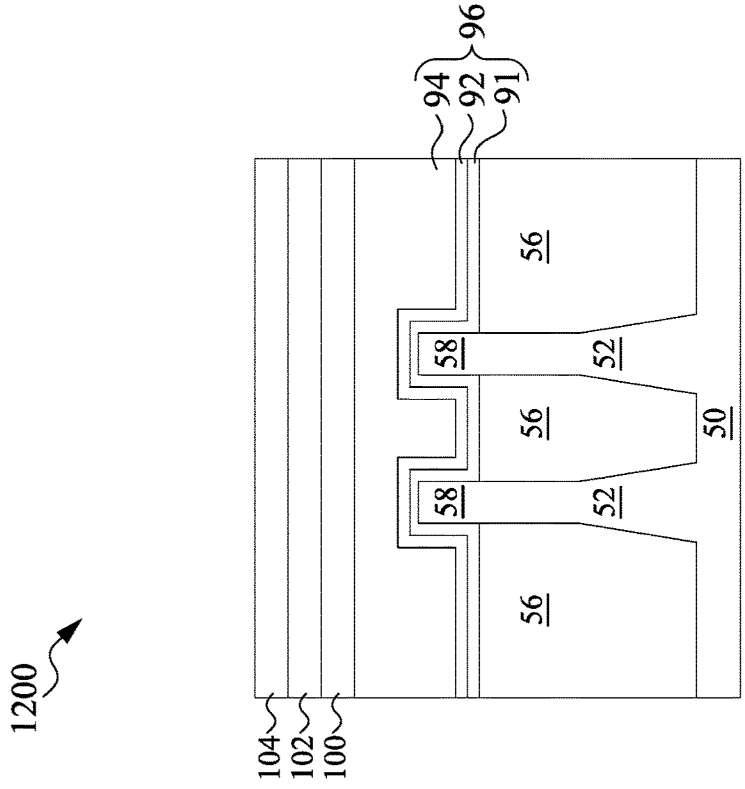

In FIGS. 35A and 35B, silicide layers 120 are formed over the epitaxial source/drain regions 82 through the openings 146 (see FIGS. 34A, 34B, and 34C) using process steps described above with reference to FIGS. 26A and 26B, and the description is not repeated herein. After forming the silicide layers 120, conductive features 122 are formed in the openings 146 using process steps described above with reference to FIGS. 26A and 26B, and the description is not repeated herein.

Figure 36A:
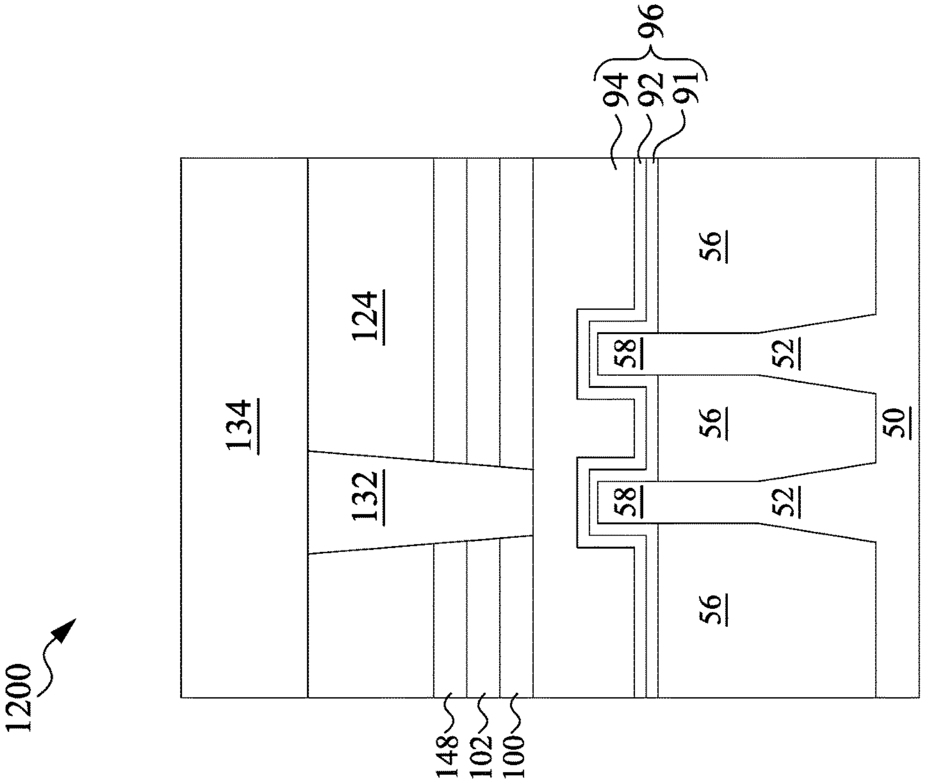
Figure 36B:
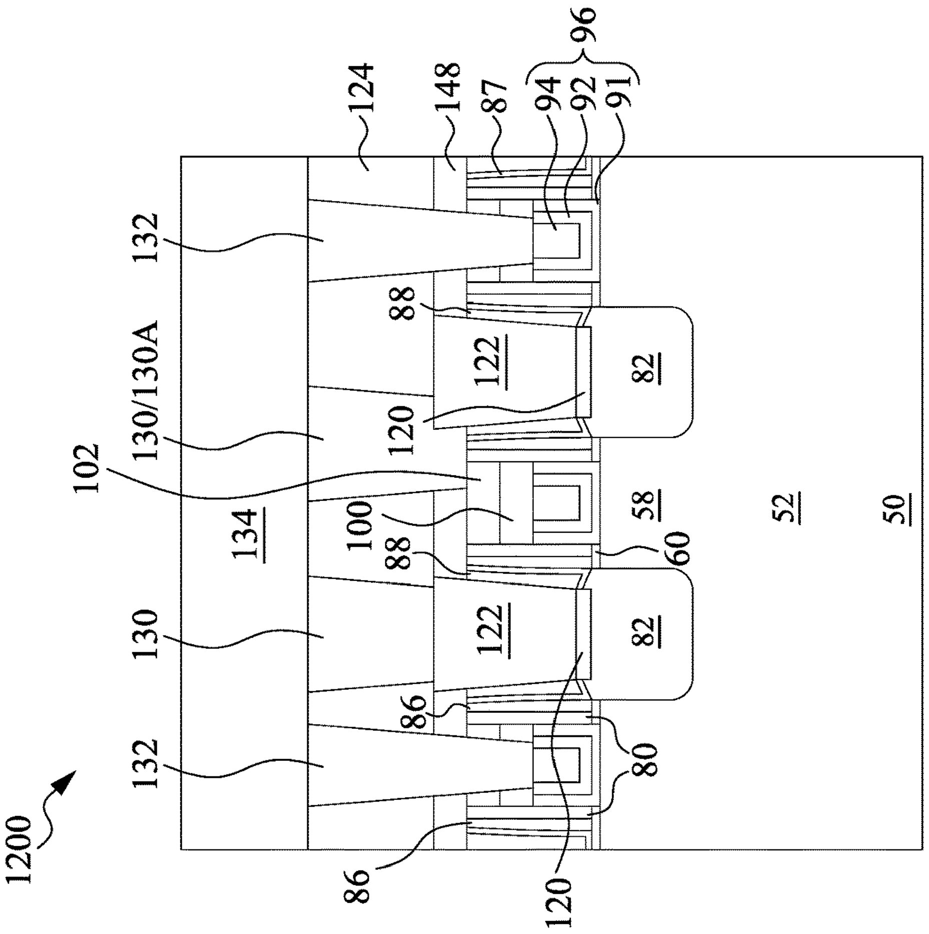

In FIGS. 36A and 36B, an ILD 124 is formed over the dielectric layer 104 and the conductive features 122 using process steps described above with reference to FIGS. 27A and 27B, and the description is not repeated herein. After forming the ILD 124, conductive features 130 and 132 are formed using process steps described above with reference to FIGS. 28A and 28B, and the description is not repeated herein. After forming the features 130 and 132, an interconnect structure 134 is formed over the conductive features 130 and 132, and the ILD 124 using process steps described above with reference to FIGS. 29A and 29B, and the description is not repeated herein.

Figure 37B:
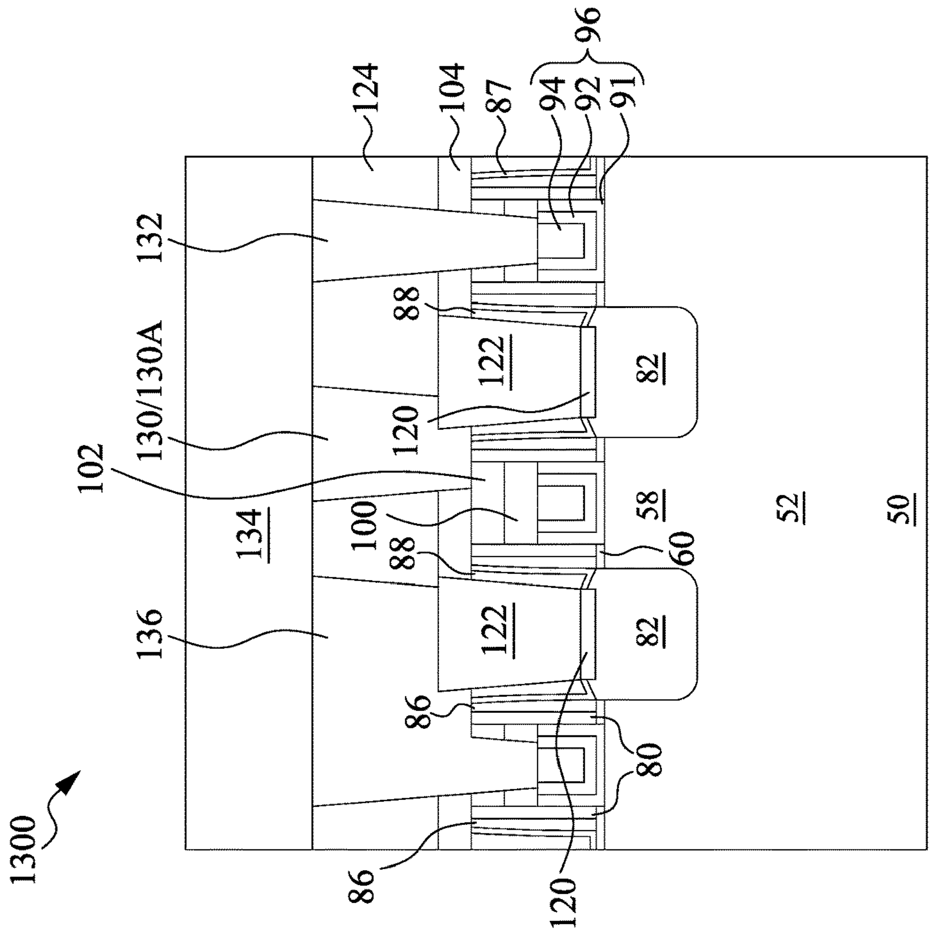
FIGS. 37A and 37B are cross-sectional views of a FinFET device in accordance with some embodiments.
Figure 37A:
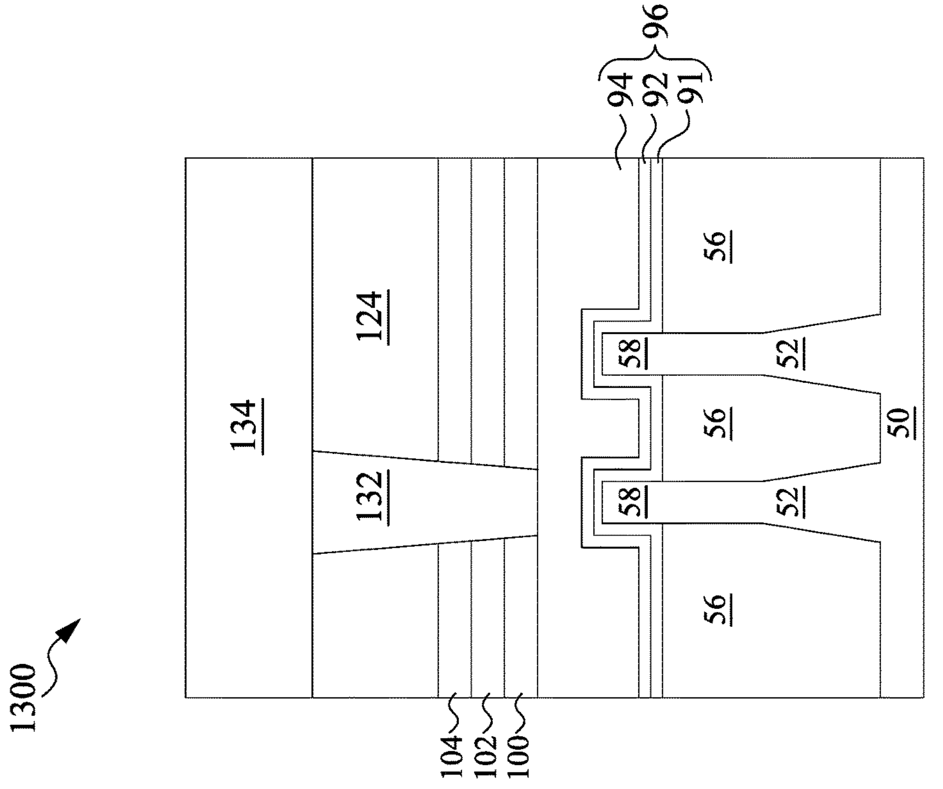

FIGS. 37A and 37B illustrate cross-sectional views of a FinFET device 1300 in accordance with some embodiments. FIG. 37A is illustrated along the reference cross-section A-A illustrated in FIG. 1, except for multiple fins/FinFETs. FIG. 37B is illustrated along the reference cross-section B-B illustrated in FIG. 1, except for multiple gates. In some embodiments, the FinFET device 1300 is similar to the FinFET device 1200 (see FIGS. 36A and 36B), with similar features being labeled by similar numerical references, and descriptions of the similar features are not repeated herein. In some embodiments, the FinFET device 1300 may be formed using process steps that are similar to the process steps described above with reference to FIGS. 31A, 31B, 31C, 32A, 32B, 32C, 33A, 33B, 33C, 34A, 34B, 34C, 35A, 35B, 36A, and 36B, and the description is not repeated herein. In contrast with the FinFET device 1200 where the conductive features 130 are electrically isolated from the conductive features 132 by the ILD 124, in the FinFET device 1300, some of the conductive features 130 and 132 may be formed such that at least one of the conductive features 130 is merged with at least one of the conductive features 132 to form a combined conductive feature 136. The conductive feature 136 electrically connects a gate stack 96 to a respective epitaxial source/drain region 82 though the conductive feature 122.

FIGS. 38A, 38B, 39A, 39B, 40A, 40B, 41A, and 41B are cross-sectional views of intermediate stages in the manufacturing of a FinFET device 1400 in accordance with some embodiments. FIGS. 38A-41A are illustrated along the reference cross-section A-A illustrated in FIG. 1, except for multiple fins/FinFETs. FIGS. 38B-41B are illustrated along the reference cross-section B-B illustrated in FIG. 1, except for multiple gates.

Figure 38B:
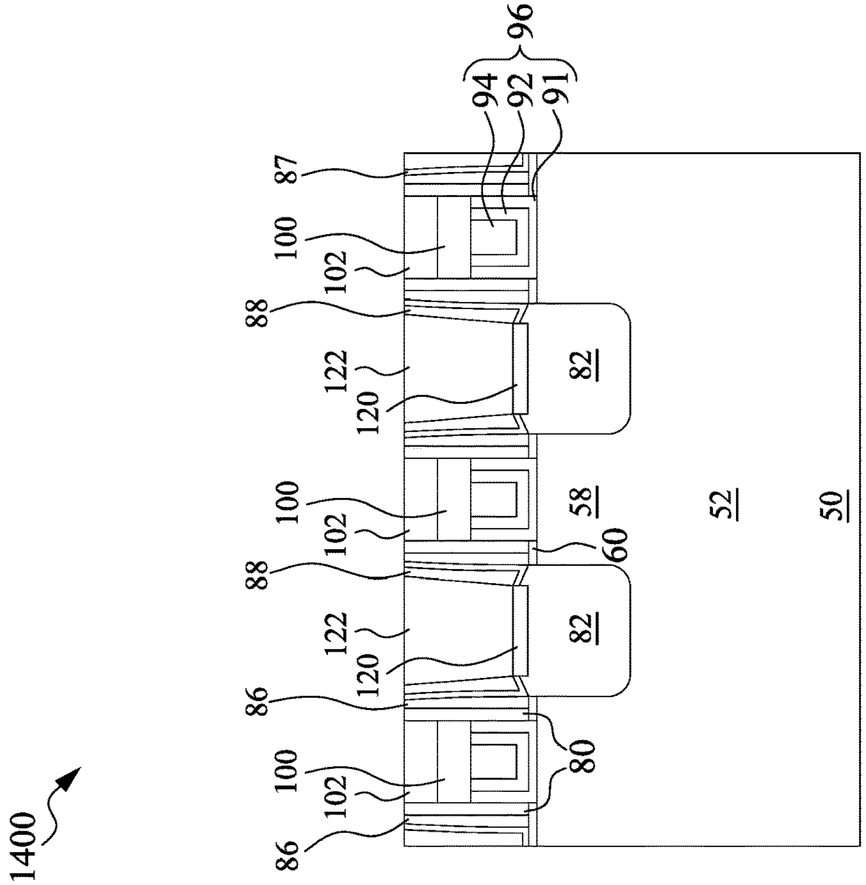
FIGS. 38A, 38B, 39A, 39B, 40A, 40B, 41A, and 41B are cross-sectional views of intermediate stages in the manufacturing of a FinFET device in accordance with some embodiments.
Figure 38A:
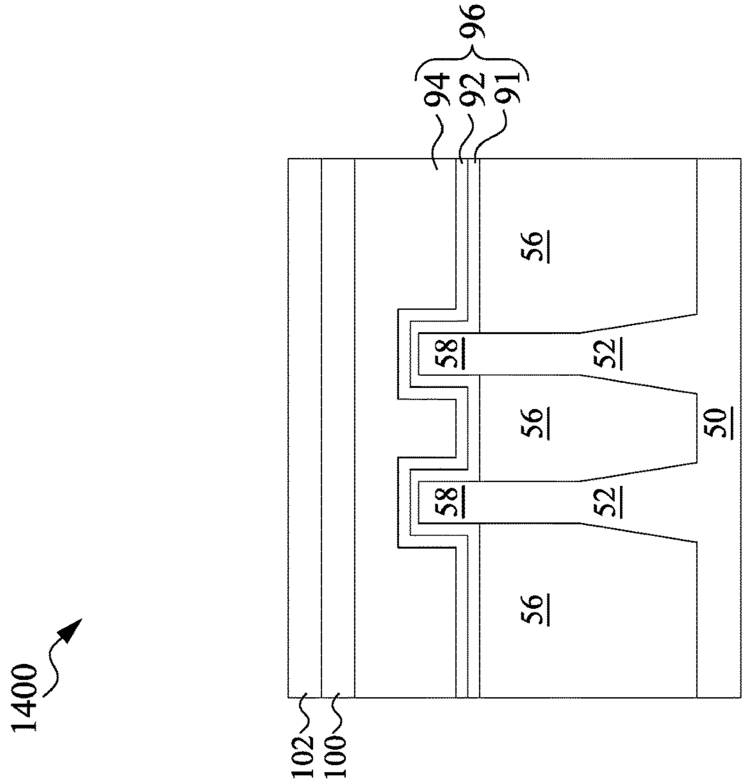

FIGS. 38A and 38B illustrates an intermediate structure of the FinFET device 1400 similar to an intermediate structure of the FinFET device 1000 illustrated in FIGS. 26A and 26B, or an intermediate structure of the FinFET device 1200 illustrated in FIGS. 35A and 35B, with similar features being labeled by similar numerical references, and descriptions of the similar features are not repeated herein. In some embodiments, the intermediate structure of the FinFET device 1400 illustrated in FIGS. 38A and 38B may be formed using process steps that are similar to the process steps described above with reference to FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15A, 15B, 16A, 16B, 17A, 17B, 18A, 18B, 19A, 19B, 20A, 20B, 21A, 21B, 21C, 22A, 22B, 22C, 23A, 23B, 23C, 24A, 24B, 24C, 25A, 25B, 25C, 26A, and 26B, and the description is not repeated herein. In other embodiments, the intermediate structure of the FinFET device 1400 illustrated in FIGS. 38A and 38B may be formed using process steps that are similar to the process steps described above with reference to FIGS. 31A, 31B, 31C, 32A, 32B, 32C, 33A, 33B, 33C, 34A, 34B, 34C, 35A, and 35B, and the description is not repeated herein. In the illustrated embodiment, the planarization process described above with reference to FIGS. 26A and 26B, or FIGS. 35A and 35B is performed such that the dielectric layer 104 is fully removed. After performing the planarization process, the top surfaces of the conductive features 122 and a top surface of the dielectric layer 102 are substantially level or coplanar within process variations of the planarization process.

Figure 39B:
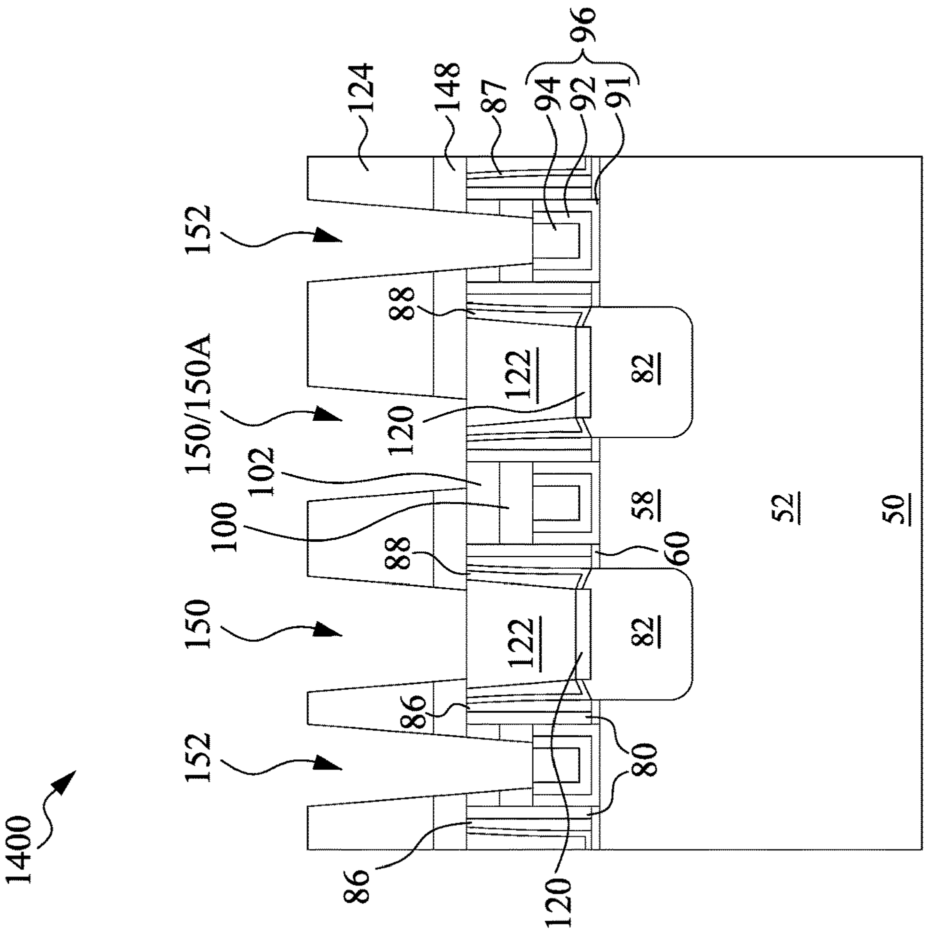
Figure 39A:
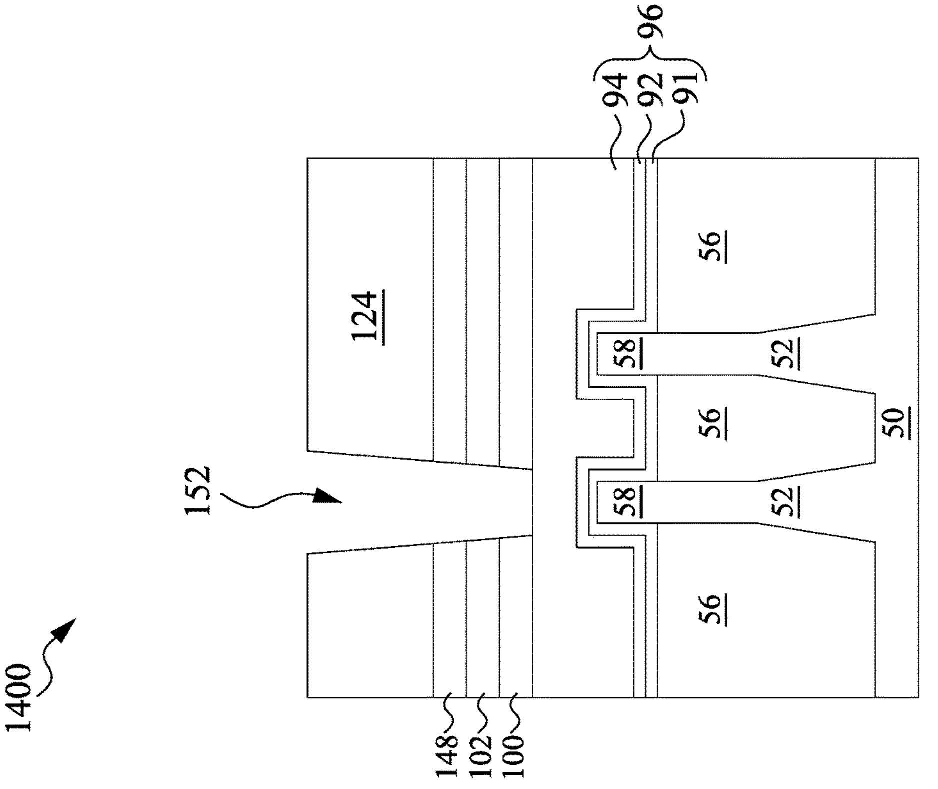

In FIGS. 39A and 39B, a dielectric layer 148 is formed over the dielectric layer 102 and the conductive features 122. In some embodiments, the dielectric layer 148 comprises materials that do not comprise oxygen. In some embodiments, the dielectric layer 148 may be formed using similar materials and methods as the dielectric layer 100 described above with reference to FIGS. 16A and 16B, and the description is not repeated herein. In some embodiments, the dielectric layer 100 and the dielectric layer 148 comprise a same material. In other embodiments, the dielectric layer 100 and the dielectric layer 148 comprise different materials.

After forming the dielectric layer 148, an ILD 124 is formed over the dielectric layer 148 using process steps described above with reference to FIGS. 27A and 27B, and the description is not repeated herein. In some embodiments, the ILD 124 and the dielectric layer 148 are patterned to form openings 150 in the ILD 124 and the dielectric layer 148. In some embodiments, the openings 150 may formed in a similar manner as the openings 126 described above with reference to FIGS. 27A and 27B, and the description is not repeated herein. The openings 150 expose respective conductive features 122. In some embodiments, some of the openings 150 (such as the opening 150A) may be laterally shifted with respect to the underlying conductive feature 122, such that a center axis of the opening 150A is laterally shifted with respect to a center axis of the underlying conductive feature 122. In some embodiments, due to the shift, the opening 150A exposes the dielectric layer 102 and does not extend below the top surface of the dielectric layer 102. In some embodiments, a material of the dielectric layer 102 is chosen such that the dielectric layer 102 acts as an etch stop layer while forming the opening 150A. In such embodiments, the opening 150A does not extend below the top surface of the dielectric layer 102. Accordingly, leakage between a conductive feature that is subsequently formed in the opening 150A and an adjacent gate stack 96 is reduced. In some embodiments, a ratio of an etch rate of the dielectric layer 148 to an etch rate of the dielectric layer 102 for the etch process for forming the openings 150 is between about 2 and about 10.

Further in FIGS. 39A and 39B, the dielectric layers 100, 102 and 148, and the ILD 124 is patterned to form openings 152 in the dielectric layers 100, 102 and 148, and the ILD 124. The openings 152 expose respective gate stacks 96. In some embodiments, the openings 152 may formed in a similar manner as the openings 128 described above with reference to FIGS. 27A and 27B, and the description is not repeated herein. In some embodiments, the openings 152 are formed after forming the openings 150. In such embodiments, the openings 150 are protected by, for example, a mask while forming the openings 152. In other embodiments, the openings 152 are formed before forming the openings 150. In such embodiments, the openings 152 are protected by, for example, a mask while forming the openings 150.

Figure 40B:
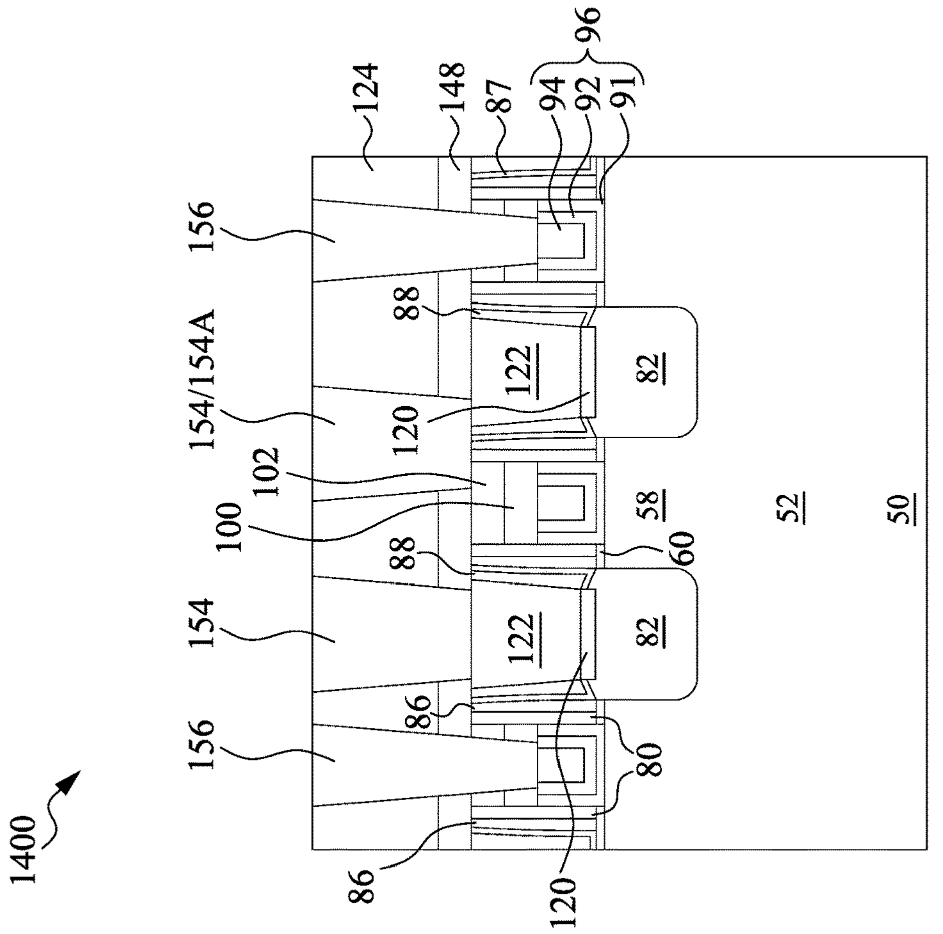
Figure 40A:
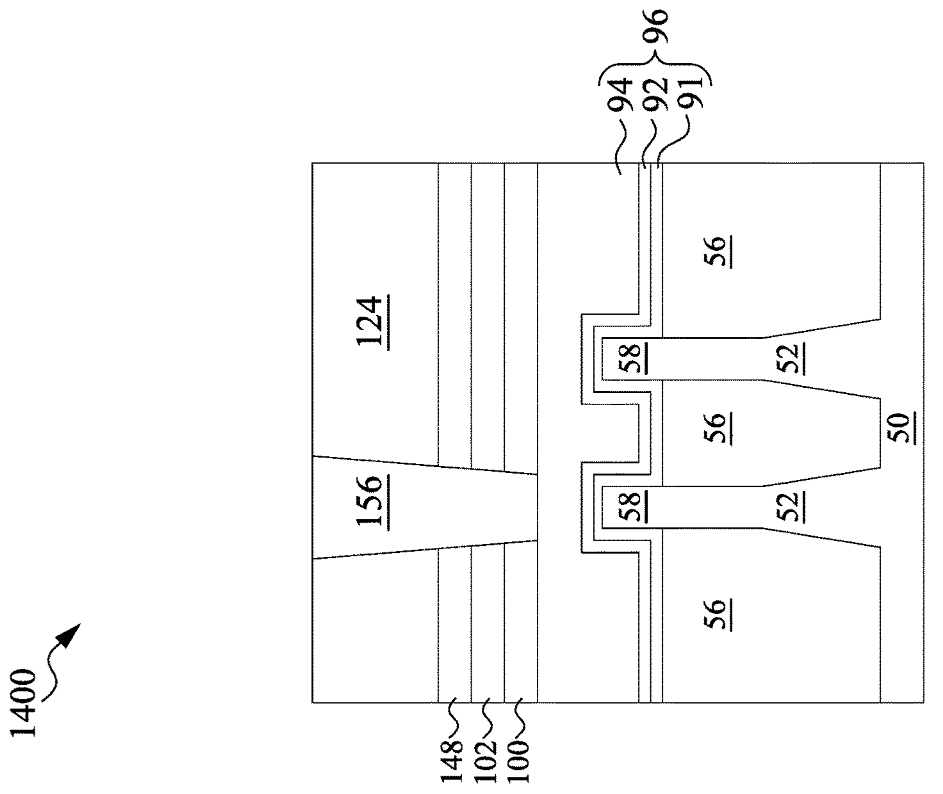

In FIGS. 40A and 40B, conductive features 154 are formed in the openings 150 (see FIGS. 39A and 39B) and conductive features 156 are formed in the openings 152 (see FIGS. 39A and 39B). The conductive features 154 and respective conductive features 122 provide electrical connections to respective epitaxial source/drain region 82. Accordingly, a combination of a conductive feature 154 and a respective conductive feature 122 may be also referred to as a source/drain contact plug. The conductive features 156 provide electrical connections to respective gate stacks 96. Accordingly, the conductive features 156 may be also referred to as gate contact plugs.

In some embodiments, the conductive features 154 and 156 may be formed using similar materials and methods as the conductive features 122 described above with reference to FIGS. 26A and 26B, and the description is not repeated herein. In some embodiments, a conductive fill material of the conductive features 154 is same as a conductive fill material of the conductive features 156. In other embodiments, the conductive fill material of the conductive features 154 is different from the conductive fill material of the conductive features 156. In some embodiments, the conductive fill material of the conductive features 154 and the conductive fill material of the conductive features 156 are same as the conductive fill material of the conductive features 122. In other embodiments, the conductive fill material of the conductive features 154 and the conductive fill material of the conductive features 156 are different from the conductive fill material of the conductive features 122. In some embodiments, top surfaces of the conductive features 154 and 156 and the top surface of the ILD 124 are substantially level or coplanar.

Further in FIGS. 40A and 40B, the conductive feature 154A that is formed in the opening 150A (see FIGS. 39A and 39B) is laterally shifted with respect to the underlying conductive feature 122, such that a center axis of the conductive feature 154A is laterally shifted with respect to a center axis of the underlying conductive feature 122. By forming the openings 150A as described above with references to FIGS. 39A and 39B, a bottommost surface of the conductive feature 154A does not extend below the top surface of the dielectric layer 102. Accordingly, leakage between a source/drain contact plug (comprising the conductive features 154A and 122) and the adjacent gate stack 96 is reduced.

Figure 41A:
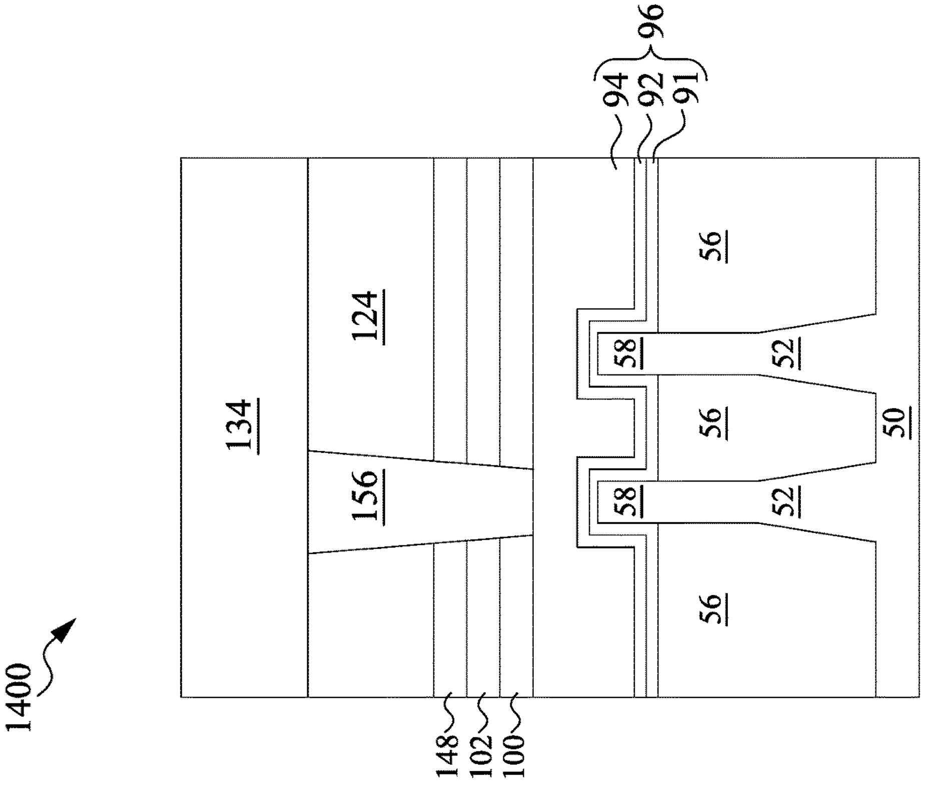
Figure 41B:
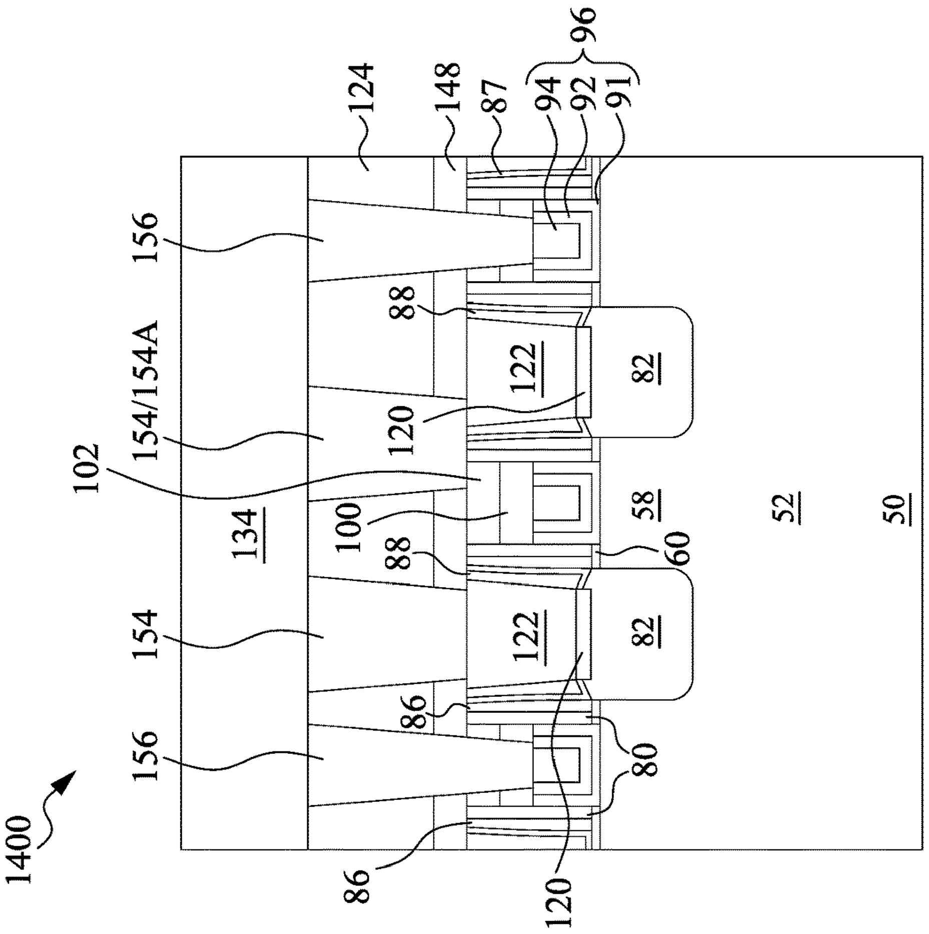

In FIGS. 41A and 41B, in some embodiments, an interconnect structure 134 is formed over the conductive features 154 and 156, and the ILD 124 using process steps described above with reference to FIGS. 29A and 29B, and the description is not repeated herein.

Figure 42B:
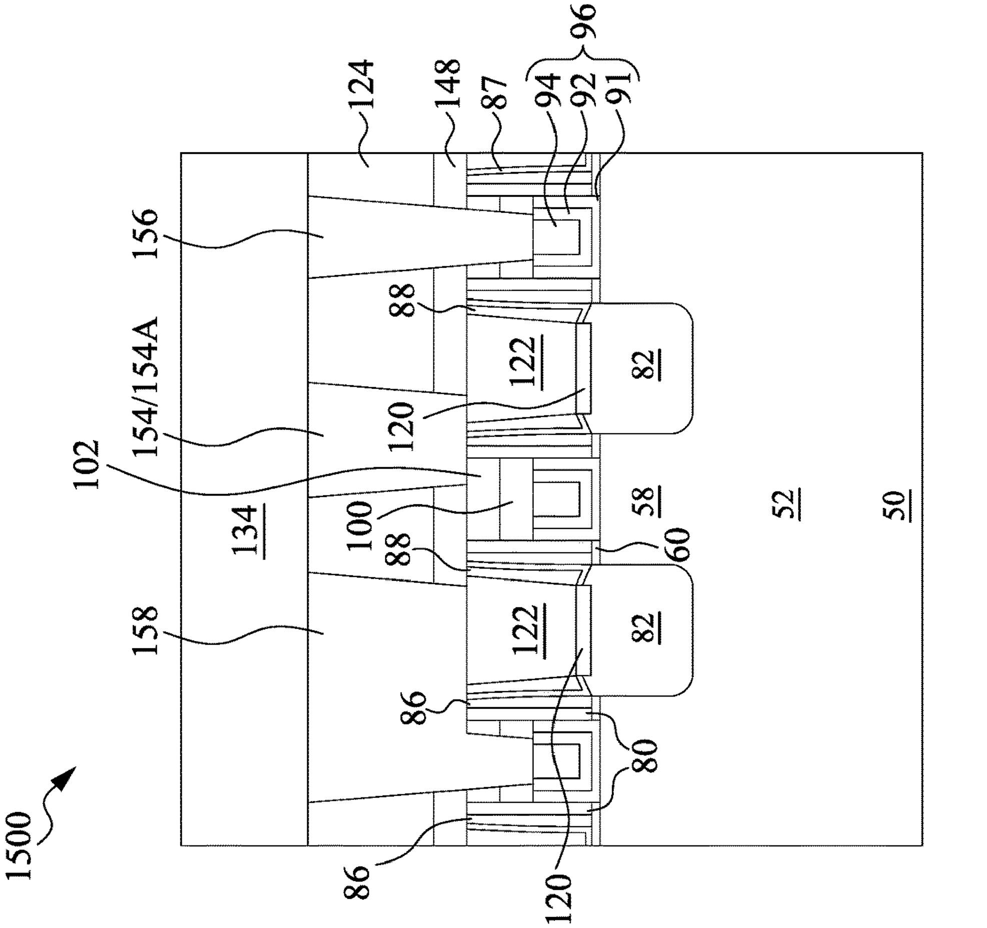
FIGS. 42A and 42B are cross-sectional views of a FinFET device in accordance with some embodiments.
Figure 42A:
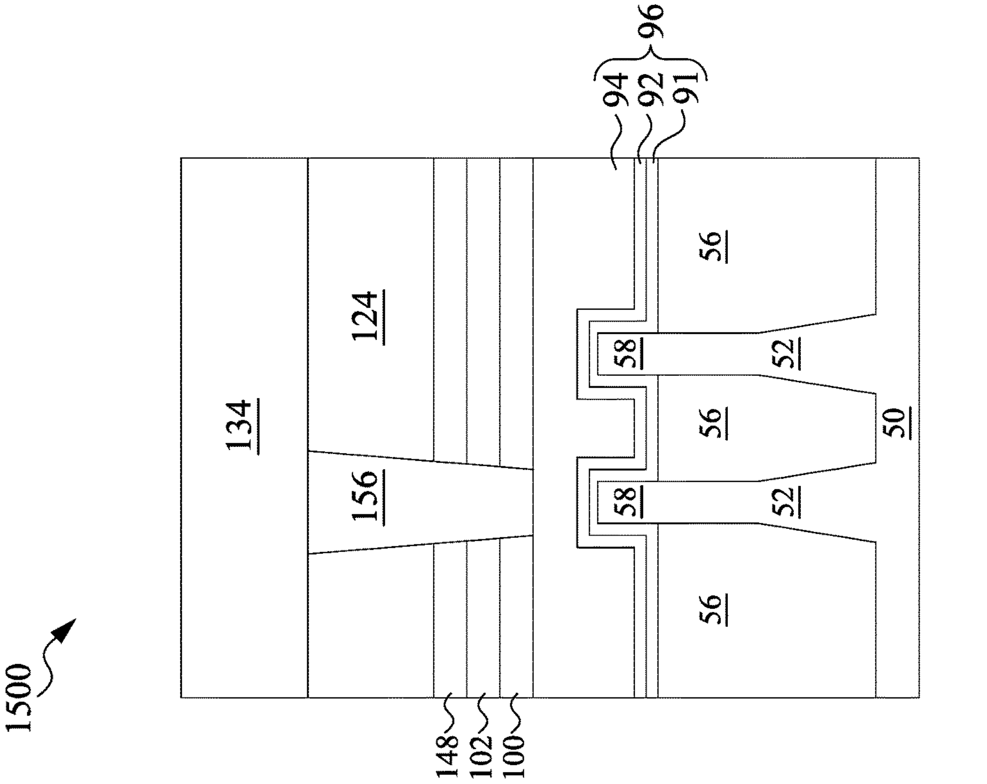

FIGS. 42A and 42B illustrate cross-sectional views of a FinFET device 1500 in accordance with some embodiments. FIG. 42A is illustrated along the reference cross-section A-A illustrated in FIG. 1, except for multiple fins/FinFETs. FIG. 42B is illustrated along the reference cross-section B-B illustrated in FIG. 1, except for multiple gates. In some embodiments, the FinFET device 1500 is similar to the FinFET device 1400 (see FIGS. 41A and 41B), with similar features being labeled by similar numerical references, and descriptions of the similar features are not repeated herein. In some embodiments, the FinFET device 1500 may be formed using process steps that are similar to the process steps described above with reference to FIGS. 38A, 38B, 39A, 39B, 40A, 40B, 41A, and 41B, and the description is not repeated herein. In contrast with the FinFET device 1400 where the conductive features 154 are electrically isolated from the conductive features 156 by the ILD 124, in the FinFET device 1500, some of the conductive features 154 and 156 may be formed such that at least one of the conductive features 154 is merged with at least one of the conductive features 156 to form a combined conductive feature 158. The conductive feature 158 electrically connects a gate stack 96 to a respective epitaxial source/drain region 82 though a respective conductive feature 122.

Figure 43B:
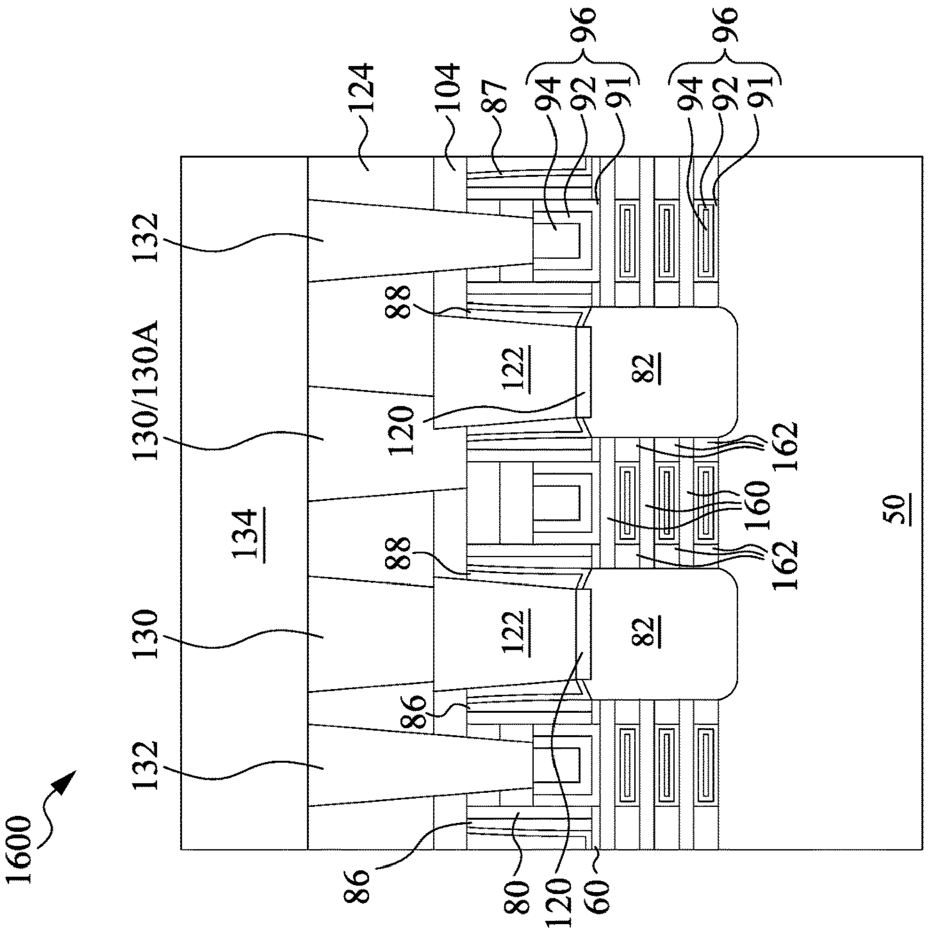
FIGS. 43A and 43B are cross-sectional views of a GAA device in accordance with some embodiments.
Figure 43A:
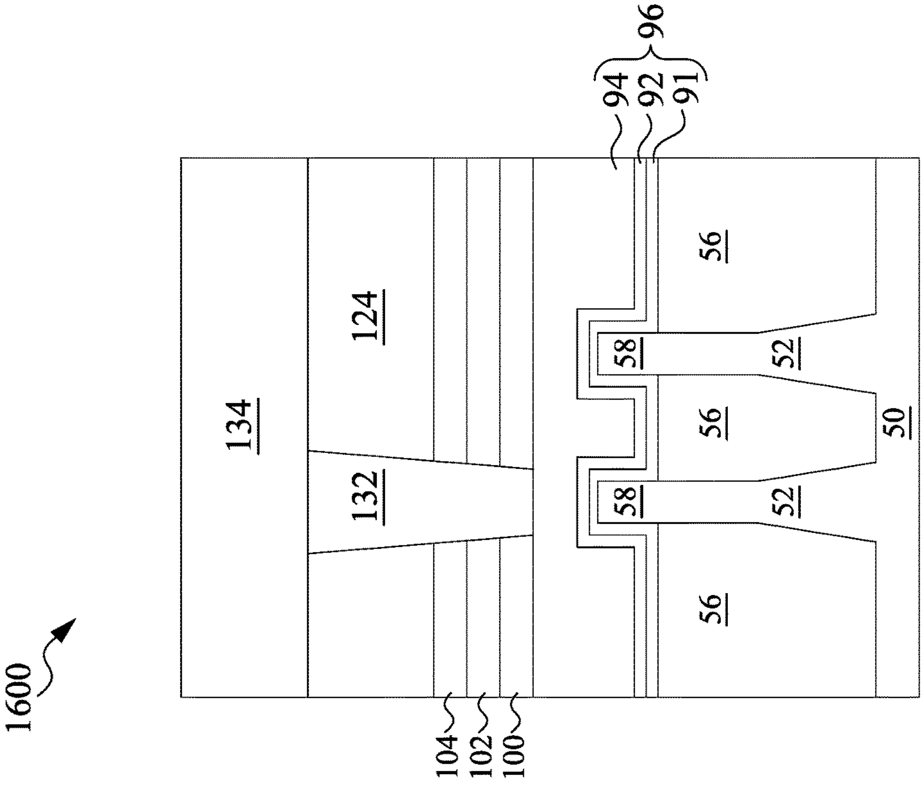

FIGS. 43A and 43B are cross-sectional views of a GAA device 1600 in accordance with some embodiments. The GAA device 1600 may be also referred to as a nano-FET device. The GAA device 1600 is similar to the FinFET device 1000 (see FIGS. 29A and 29B) or the FinFET device 1200 (see FIGS. 36A and 36B), with similar features being labeled by similar numerical references, and descriptions of the similar features are not repeated herein. In the FinFET device 1000 (see FIGS. 29A and 29B) and the FinFET device 1200 (see FIGS. 36A and 36B), active regions comprise fins 52. In the GAA device 1600, active regions comprise a plurality of nanostructures 160, such that each nanostructure 160 is surrounded by a portion of the respective gate stack 96. The nanostructures 160 may comprise nanosheets, nanowires, or the like. In some embodiments, the nanostructures 160 and the substrate 50 comprise a same semiconductor material. In other embodiments, the nanostructures 160 and the substrate 50 comprise different semiconductor materials. In some embodiments, portions of the gate stacks 96 are interposed between adjacent nanostructures 160. In some embodiments, spacers 162 are interposed between the portions of the gate stacks 96 and the epitaxial source/drain regions 82 and act as isolation features between the epitaxial source/drain regions 82 and the gate stacks 96. In some embodiments, the spacers 162 comprise a material such as silicon nitride or silicon oxynitride, although any suitable material, such as low-dielectric constant (low-k) materials having a k-value less than about 3.5, may be utilized.

Figure 44B:
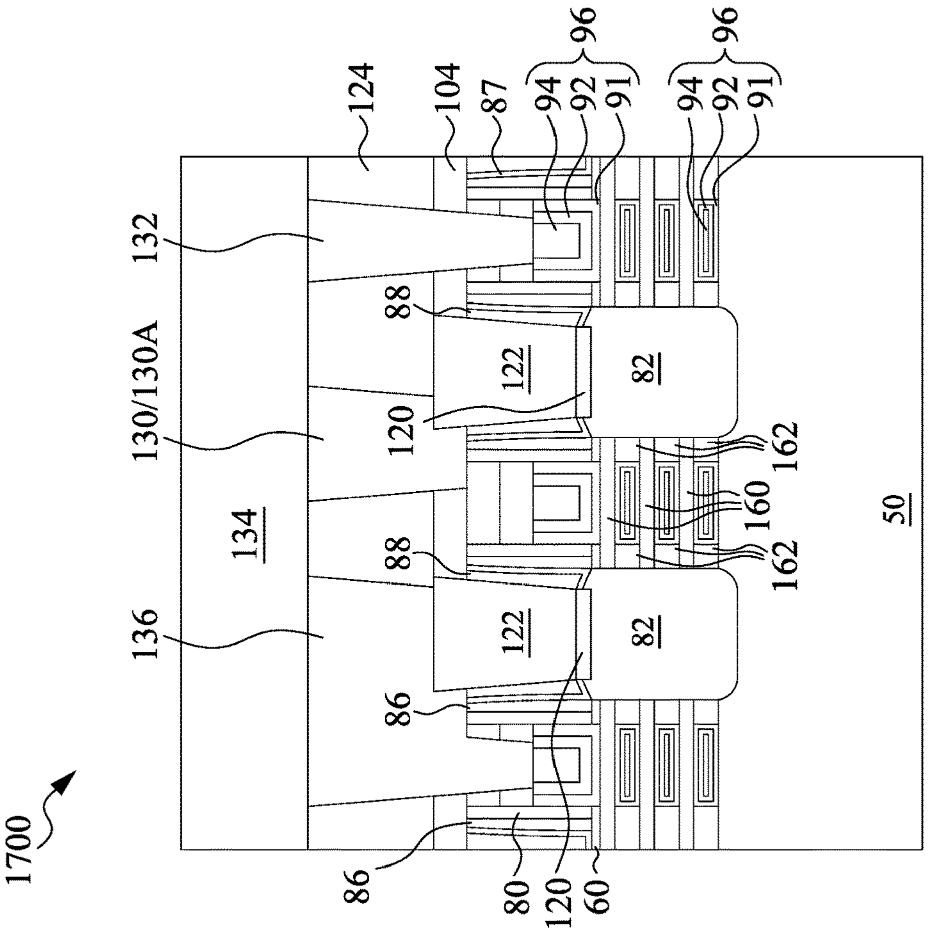
FIGS. 44A and 44B are cross-sectional views of a GAA device in accordance with some embodiments.
Figure 44A:
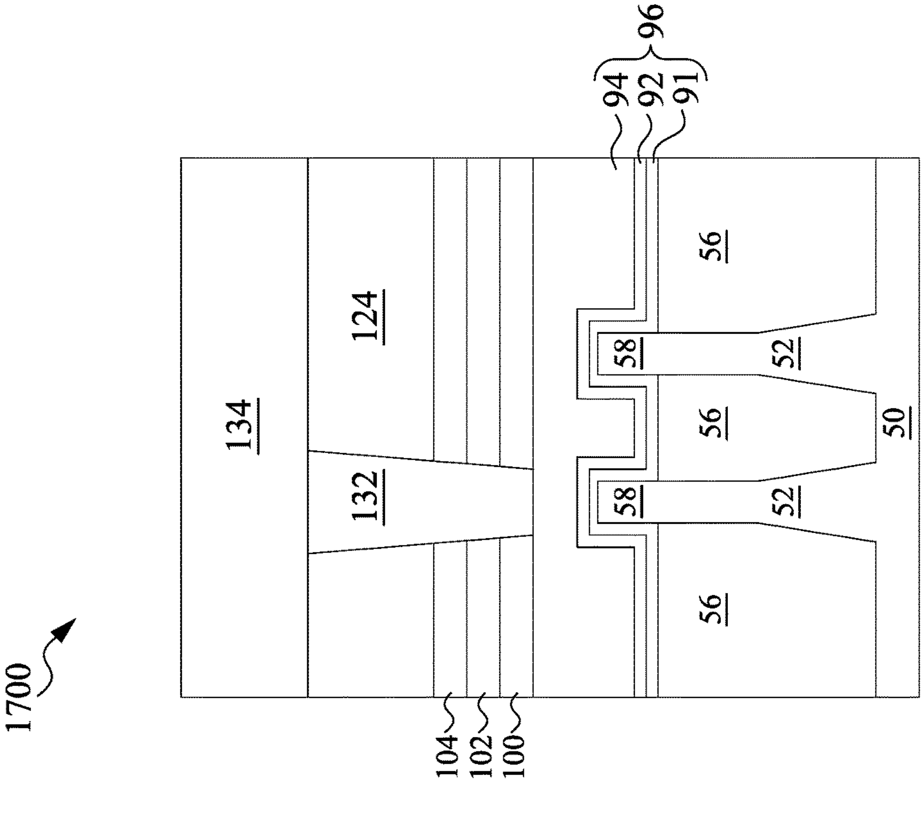

FIGS. 44A and 44B are cross-sectional views of a GAA device 1700 in accordance with some embodiments. The GAA device 1700 may be also referred to as a nano-FET device. The GAA device 1700 is similar to the FinFET device 1100 (see FIGS. 30A and 30B) or the FinFET device 1300 (see FIGS. 37A and 37B), with similar features being labeled by similar numerical references, and descriptions of the similar features are not repeated herein. In the FinFET device 1100 (see FIGS. 30A and 30B) and the FinFET device 1300 (see FIGS. 37A and 37B), active regions comprise fins 52. In the GAA device 1700, active regions comprise a plurality of nanostructures 160 such that each nanostructure 160 is surrounded by a portion of the respective gate stack 96. The nanostructures 160 may comprise nanosheets, nanowires, or the like. In some embodiments, the nanostructures 160 and the substrate 50 comprise a same semiconductor material. In other embodiments, the nanostructures 160 and the substrate 50 comprise different semiconductor materials. In some embodiments, portions of the gate stacks 96 are interposed between adjacent nanostructures 160. In some embodiments, spacers 162 are interposed between the portions of the gate stacks 96 and the epitaxial source/drain regions 82 and act as isolation features between the epitaxial source/drain regions 82 and the gate stacks 96. In some embodiments, the spacers 162 comprise a material such as silicon nitride or silicon oxynitride, although any suitable material, such as low-dielectric constant (low-k) materials having a k-value less than about 3.5, may be utilized.

Figure 45B:
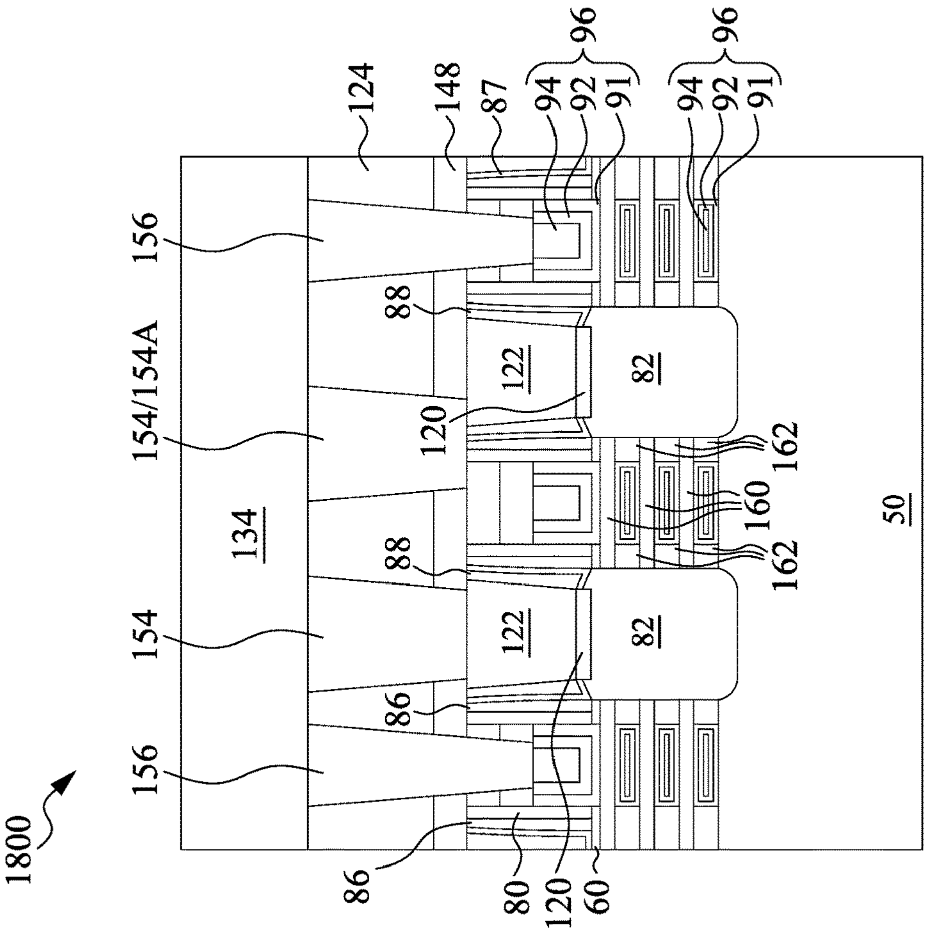
FIGS. 45A and 45B are cross-sectional views of a GAA device in accordance with some embodiments.
Figure 45A:
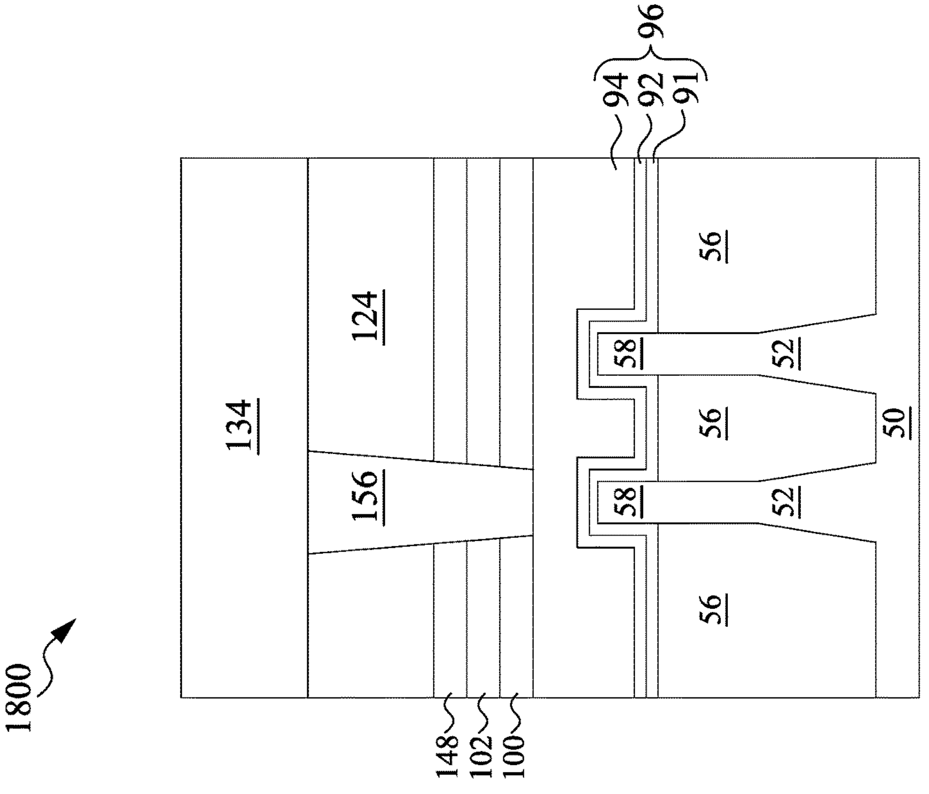

FIGS. 45A and 45B are cross-sectional views of a GAA device 1800 in accordance with some embodiments. The GAA device 1800 may be also referred to as a nano-FET device. The GAA device 1800 is similar to the FinFET device 1400 (see FIGS. 41A and 41B), with similar features being labeled by similar numerical references, and descriptions of the similar features are not repeated herein. In the FinFET device 1400 (see FIGS. 41A and 41B), active regions comprise fins 52. In the GAA device 1800, active regions comprise a plurality of nanostructures 160 such that each nanostructure 160 is surrounded by a portion of the respective gate stack 96. The nanostructures 160 may comprise nanosheets, nanowires, or the like. In some embodiments, the nanostructures 160 and the substrate 50 comprise a same semiconductor material. In other embodiments, the nanostructures 160 and the substrate 50 comprise different semiconductor materials. In some embodiments, portions of the gate stacks 96 are interposed between adjacent nanostructures 16*o*. In some embodiments, spacers 162 are interposed between the portions of the gate stacks 96 and the epitaxial source/drain regions 82 and act as isolation features between the epitaxial source/drain regions 82 and the gate stacks 96. In some embodiments, the spacers 162 comprise a material such as silicon nitride or silicon oxynitride, although any suitable material, such as low-dielectric constant (low-k) materials having a k-value less than about 3.5, may be utilized.

Figure 46B:
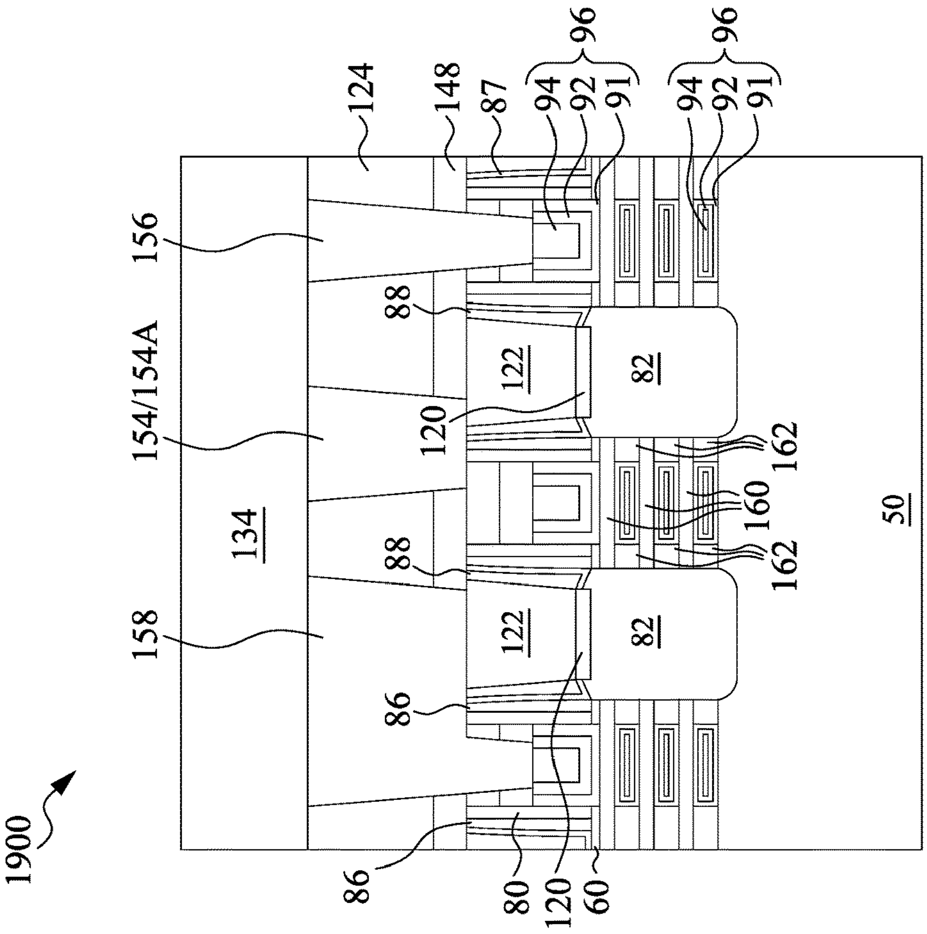
FIGS. 46A and 46B are cross-sectional views of a GAA device in accordance with some embodiments.
Figure 46A:
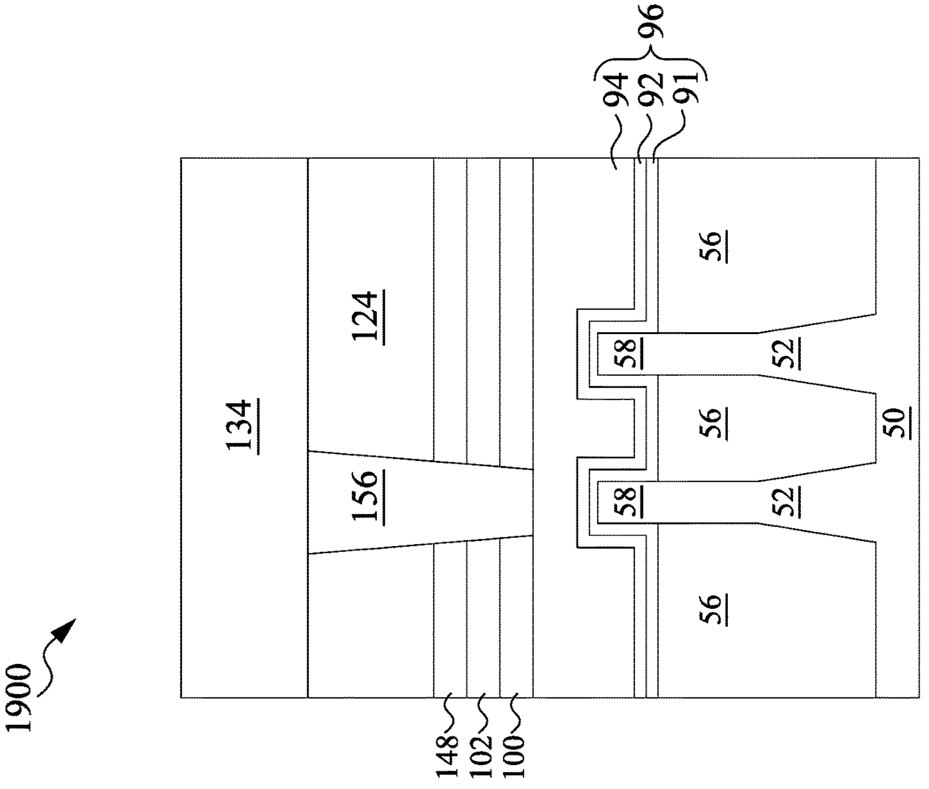

FIGS. 46A and 46B are cross-sectional views of a GAA device 1900 in accordance with some embodiments. The GAA device 1900 may be also referred to as a nano-FET device. The GAA device 1900 is similar to the FinFET device 1500 (see FIGS. 42A and 42B), with similar features being labeled by similar numerical references, and descriptions of the similar features are not repeated herein. In the FinFET device 1500 (see FIGS. 42A and 42B), active regions comprise fins 52. In the GAA device 1900, active regions comprise a plurality of nanostructures 160 such that each nanostructure 160 is surrounded by a portion of the respective gate stack 96. The nanostructures 160 may comprise nanosheets, nanowires, or the like. In some embodiments, the nanostructures 160 and the substrate 50 comprise a same semiconductor material. In other embodiments, the nanostructures 160 and the substrate 50 comprise different semiconductor materials. In some embodiments, portions of the gate stacks 96 are interposed between adjacent nanostructures 160. In some embodiments, spacers 162 are interposed between the portions of the gate stacks 96 and the epitaxial source/drain regions 82 and act as isolation features between the epitaxial source/drain regions 82 and the gate stacks 96. In some embodiments, the spacers 162 comprise a material such as silicon nitride or silicon oxynitride, although any suitable material, such as low-dielectric constant (low-k) materials having a k-value less than about 3.5, may be utilized.

Figure 47B:
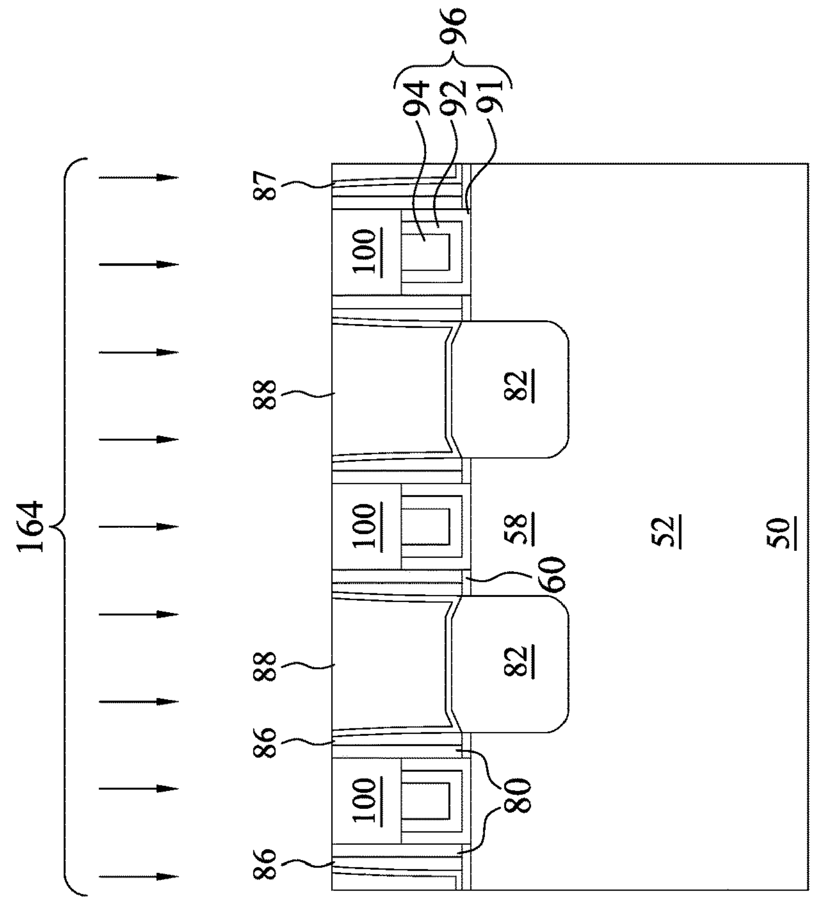
FIGS. 47A, 47B, 48A, and 48B are cross-sectional views of intermediate stages in the manufacturing of an oxygen-containing dielectric layer in accordance with some embodiments.
Figure 47A:
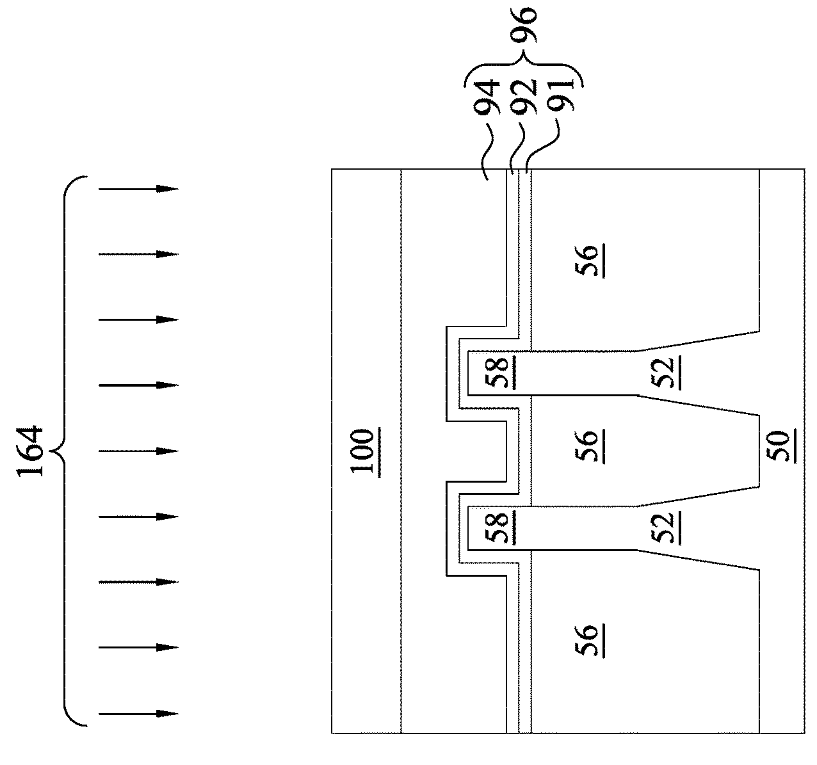
Figure 48B:
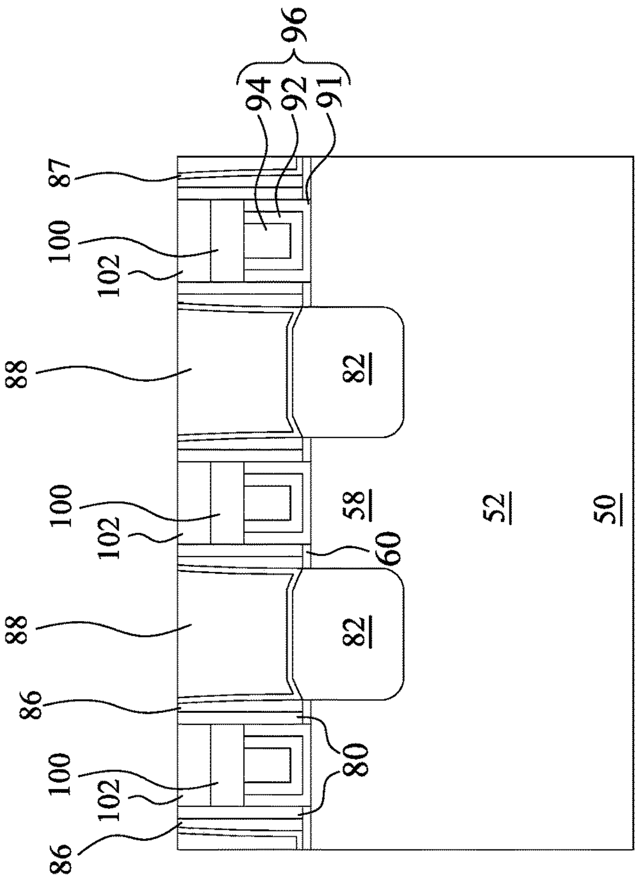
Figure 48A:
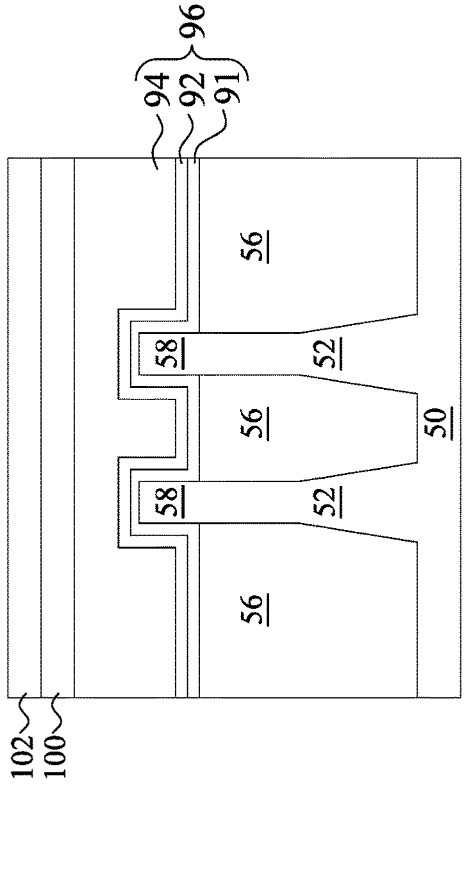

FIGS. 47A, 47B, 48A, and 48B are cross-sectional views of intermediate stages in the manufacturing of an oxygen-containing dielectric layer 102 in accordance with some embodiments. FIGS. 47A and 48A are illustrated along the reference cross-section A-A illustrated in FIG. 1, except for multiple fins/FinFETs. FIGS. 47B and 48B are illustrated along the reference cross-section B-B illustrated in FIG. 1, except for multiple gates.

In FIGS. 47A and 47B, after forming a structure of FIGS. 17A and 17B, an oxygen addition process 164 is performed on an upper portion of the dielectric layer 100. In some embodiments, the oxygen addition process 164 transforms a dielectric material of the upper portion of the dielectric layer 100 into an oxide of the dielectric material. In some embodiments, the oxygen addition process 164 comprises a plasma treatment process, a steam anneal process, an ozone anneal process, a rapid thermal oxidation process, an oxygen implantation process, a combination thereof, or the like. In some embodiments when the oxygen addition process 164 comprises a plasma treatment process, the plasma process is performed using a plasma generated from a gas mixture comprising $O_2$, $N_2O$, $CO_2$, $H_2O$, a combination thereof, or the like. In some embodiments when the oxygen addition process 164 comprises a steam anneal process, a dielectric material of the upper portion of the dielectric layer 100 is subjected to water vapor at a temperature between 400° C. about and about 600° C. In some embodiments when the oxygen addition process 164 comprises an ozone anneal process, the dielectric material of the upper portion of the dielectric layer 100 is subjected to ozone ($O_3$) or a mixture of ozone ($O_3$) and oxygen ($O_2$) at a temperature less than about 100° C. In some embodiments when the oxygen addition process 164 comprises a rapid thermal oxidation process, the rapid thermal oxidation process is performed at a temperature between about 20° C. and about 700° C. for a duration between about 1 s and about 100 s. In some embodiments when the oxygen addition process 164 comprises an oxygen implantation process, the oxygen implantation process is performed on the upper portion of the dielectric layer 100 using oxygen ions with implantation energy between about 1 keV and about 30 keV.

FIGS. 48A and 48B illustrates the structure of FIGS. 47A and 47B after performing the oxygen addition process 164. In some embodiments, the oxygen addition process 164 transforms the upper portion of the dielectric layer 100 into the oxygen-containing dielectric layer 102. In some embodiments, the oxygen-containing dielectric layer 102 comprises an oxide of the material of the dielectric layer 100. In some embodiments, the oxygen-containing dielectric layer 102 has a thickness between about 20 nm and about 100 nm. In some embodiments, the oxygen addition process 164 is performed such that a thickness of the un-oxidized portion of the dielectric layer 100 is at least 3 nm to protect the gate stack 96 from oxidizing due to the oxygen addition process 164.

Figure 49B:
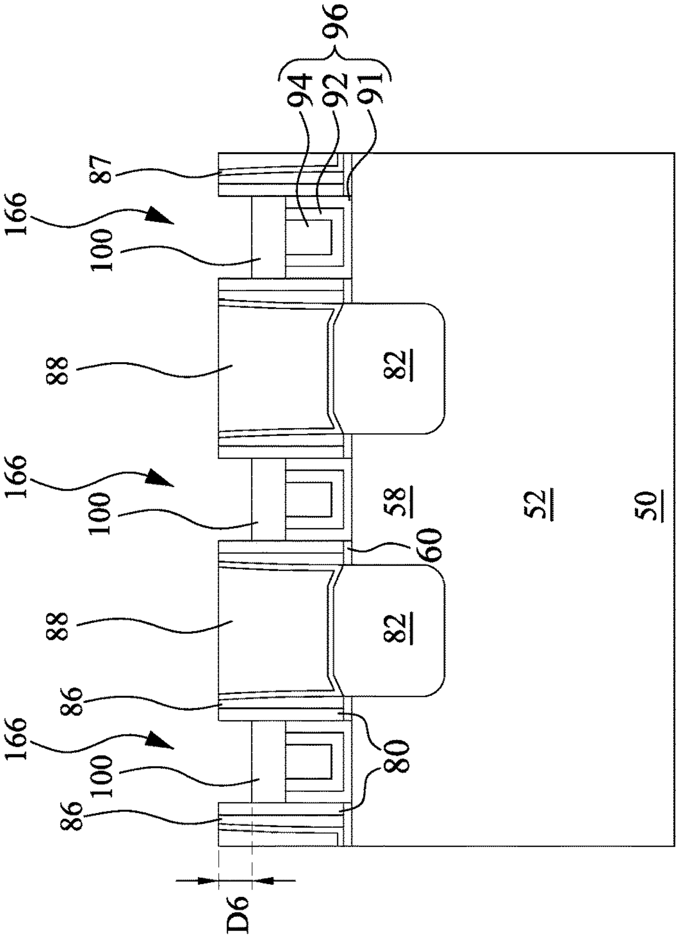
FIGS. 49A, 49B, 50A, 50B, 51A, and 51B are cross-sectional views of intermediate stages in the manufacturing of an oxygen-containing dielectric layer in accordance with some embodiments.
Figure 49A:
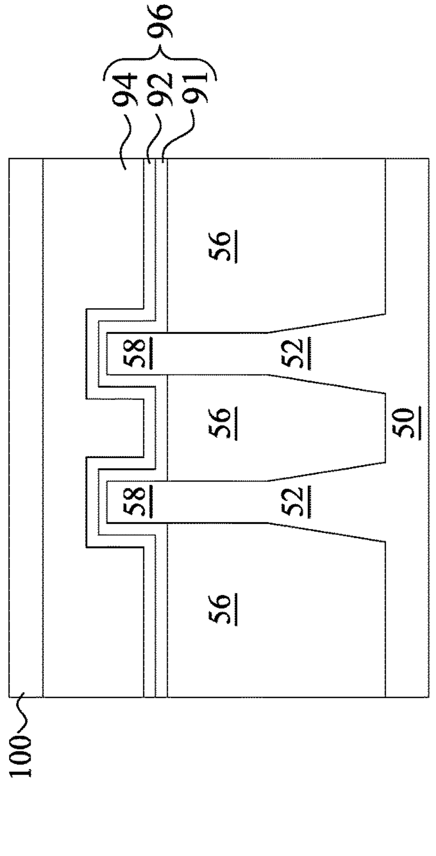
Figure 50B:
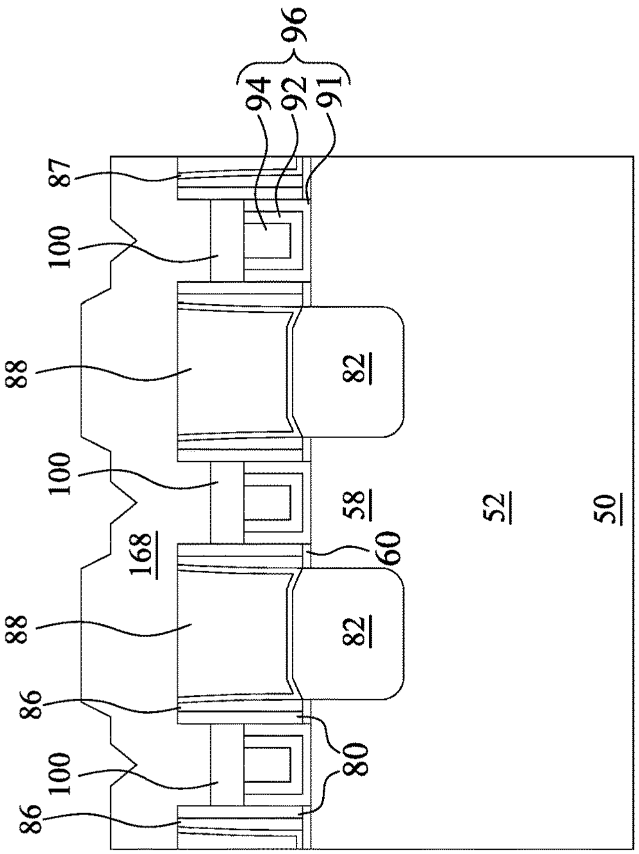
Figure 50A:
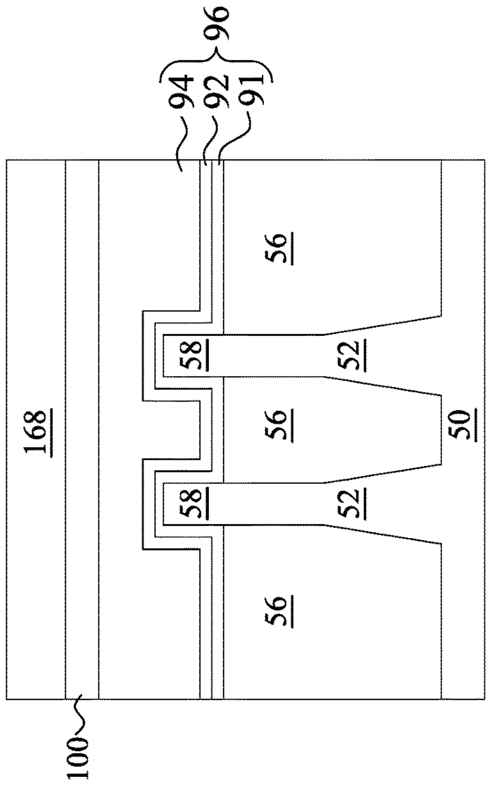
Figure 51B:
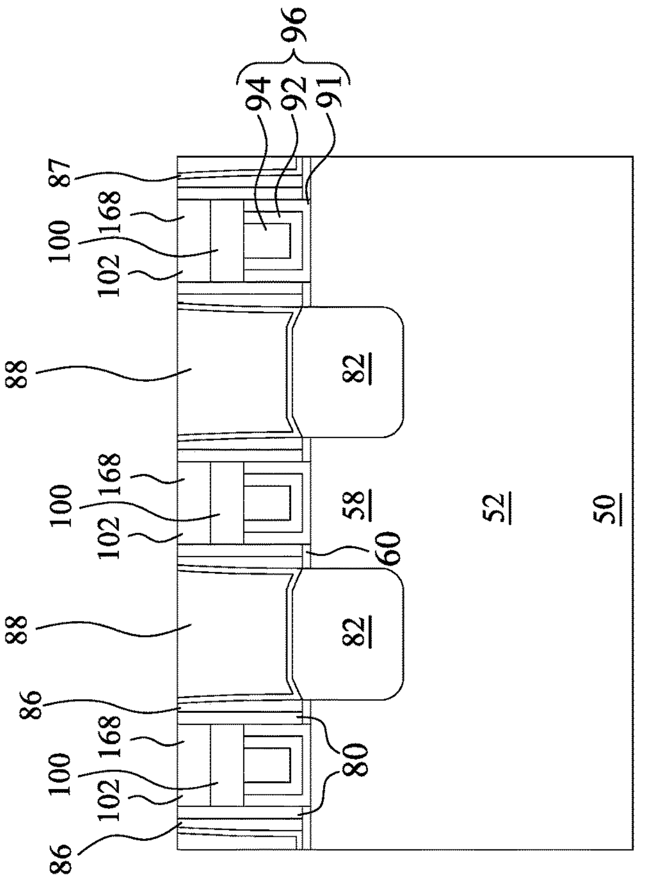
Figure 51A:
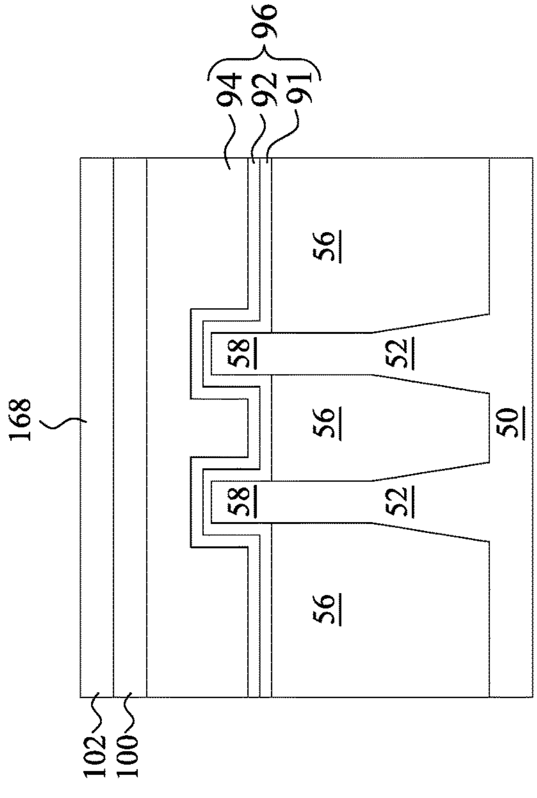

FIGS. 49A, 49B, 50A, 50B, 51A, and 51B are cross-sectional views of intermediate stages in the manufacturing of an oxygen-containing dielectric layer 102 in accordance with some embodiments. FIGS. 49A, 50A, and 51A are illustrated along the reference cross-section A-A illustrated in FIG. 1, except for multiple fins/FinFETs. FIGS. 49B, 50B, and 51B are illustrated along the reference cross-section B-B illustrated in FIG. 1, except for multiple gates.

In FIGS. 49A and 49B, after forming a structure of FIGS. 17A and 17B, the dielectric layer 100 is recessed below the top surface of the ILD 88 to a depth D6 to form recesses 166. In some embodiments, the depth D6 is between about 20 nm and about 100 nm. In some embodiments, the recessing process comprises a suitable etch process. The etch process may be selective to a material of the dielectric layer 100. The suitable etch process may comprise a dry etch process, a wet etch process, or a combination thereof. The suitable wet etch process may be performed using etchants, such as $H_3PO_4$ or the like. The suitable dry etch process may be performed using etchants, such as $CF_4$, $CHF_3$, $CH_2F_2$, $C_4F_8$, Ar, $O_2$, $N_2$, a combination thereof, or the like.

In FIGS. 50A and 50B, a dielectric material 168 is formed in the recesses 166 (see FIGS. 49A and 49B) and over the ILD 88. In some embodiments, the dielectric material 168 overfills the recesses 166. In some embodiments, the dielectric material 168 comprises oxygen-containing materials. In some embodiments, the dielectric material 168 comprises silicon oxide (SiO), silicon oxycarbide (SiOC), a combination thereof, or the like, and may be formed using ALD, CVD, a combination thereof, or the like.

In FIGS. 51A and 51B, a planarization process is performed on the dielectric material 168 to remove portions of the dielectric material 168 overfilling the recesses 166 (see FIGS. 49A and 49B). In some embodiments, the planarization process may comprise a CMP process, an etch back process, a grinding process, a combination thereof, or the like. Remaining portions of the dielectric material 168 within the recesses 166 form the dielectric layer 102. After the planarization process, a top surface of the dielectric layer 102 and the top surface of the ILD 88 are substantially level or coplanar within process variations of the planarization process.

Embodiments may achieve advantages. In some embodiments, a plurality of dielectric layers comprising different dielectric materials are formed over gate stacks of a semiconductor device. The plurality of dielectric layers allow for forming source/drain contact plugs, such that a leakage between the source/drain contact plugs and adjacent gate stacks are reduced. By using the plurality of dielectric layers during the formation of source/drain contact plugs, various embodiments discussed herein allow for improving electrical performance of a semiconductor device, choosing different schemes for the plurality of dielectric layers based on different application requirements for a semiconductor device, and enlarging etch and lithography process windows for forming the source/drain contact plugs.

In accordance with an embodiment, a device includes a gate stack over a substrate. A first dielectric layer is over the gate stack. The first dielectric layer includes a first material. A second dielectric layer is over the first dielectric layer. The second dielectric layer includes a second material different from the first material. A first conductive feature is adjacent the gate stack. A second conductive feature is over and in physical contact with a topmost surface of the first conductive feature. A bottommost surface of the second conductive feature is in physical contact with a topmost surface of the second dielectric layer.

Embodiments may include one or more of the following features. The device where the topmost surface of the first conductive feature is level with the topmost surface of the second dielectric layer. The device further including a third dielectric layer over the second dielectric layer, the third dielectric layer including a third material different from the second dielectric layer. The device where the second conductive feature extends through the third dielectric layer. The device where the topmost surface of the first conductive feature is level with a topmost surface of the third dielectric layer. The device where the first dielectric layer includes a nitride material, a carbide material, or a carbonitride material. The device where the second material comprises an oxide material.

In accordance with another embodiment, a device includes a gate stack over a substrate. An epitaxial source/drain region is in the substrate adjacent the gate stack. A first dielectric layer is over the gate stack. The first dielectric layer includes a first material. The first material is not including oxygen. A second dielectric layer is over the first dielectric layer. The second dielectric layer includes a second material. The second material is an oxygen-containing material. A third dielectric layer is over the second dielectric layer. The third dielectric layer includes a third material. The third material is not including oxygen. A first conductive feature is over and in electrical contact with the epitaxial source/drain region. A second conductive feature is over the first conductive feature. The second conductive feature extends through the third dielectric layer. The second conductive feature is in physical contact with a topmost surface of the second dielectric layer and a topmost surface of the first conductive feature.

Embodiments may include one or more of the following features. The device where the topmost surface of the first conductive feature is level with the topmost surface of the second dielectric layer. The device where the topmost surface of the first conductive feature is level with a topmost surface of the third dielectric layer. The device where the second conductive feature is laterally shifted with respect to the first conductive feature. The device further including a third conductive feature over the gate stack, where the third conductive feature extends through the first dielectric layer and the second dielectric layer, and where the third conductive feature is in physical contact with a topmost surface of the gate stack. The device where a topmost surface of the second conductive feature is level with a topmost surface of the third conductive feature.

In accordance with yet another embodiment, a method includes forming a gate stack over a substrate. The gate stack is recessed to form a first recess. A cap layer is formed over the gate stack in the first recess. The cap layer includes a first material over the gate stack and a second material over the first material. The second material is different from the first material. A first conductive feature is formed adjacent the gate stack. A second conductive feature is formed over the first conductive feature. The second conductive feature is in physical contact with a topmost surface of the cap layer and a topmost surface of the first conductive feature.

Embodiments may include one or more of the following features. The method where forming the cap layer includes: filling the first recess with the first material, recessing the first material to form a second recess, and filling the second recess with the second material. The method where forming the cap layer includes: filling the first recess with the first material, and performing an oxygen addition process on an upper portion of the first material, the oxygen addition process converting the upper portion of the first material into the second material. The method where the oxygen addition process includes a plasma treatment process, a steam anneal process, an ozone anneal process, a rapid thermal oxidation process, or an oxygen implantation process. The method where the first material includes a nitride material, a carbide material, or a carbonitride material, and where the second material includes an oxide material. The method further includes, before forming the first conductive feature, forming a dielectric layer over the cap layer, the dielectric layer including a third material different from the second material, the topmost surface of the first conductive feature being level with a topmost surface of the dielectric layer. The method further including, after forming the first conductive feature, forming a dielectric layer over the cap layer and the first conductive feature, the dielectric layer including a third material different from the second material, the topmost surface of the first conductive feature being level with the topmost surface of the cap layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
- a gate stack over a substrate;
- a first dielectric layer over the gate stack, the first dielectric layer comprising a first material;
- a second dielectric layer over the first dielectric layer, the second dielectric layer comprising a second material different from the first material;
- a first conductive feature adjacent the gate stack; and
- a second conductive feature over and in physical contact with a topmost surface of the first conductive feature, a bottommost surface of the second conductive feature being in physical contact with a topmost surface of the second dielectric layer in a cross-sectional view, wherein the topmost surface of the second dielectric layer is lower than the topmost surface of the first conductive feature.

2. The device of claim 1, further comprising a third dielectric layer over the second dielectric layer, the third dielectric layer comprising a third material different from the second material.

3. The device of claim 2, wherein the second conductive feature extends through the third dielectric layer.

4. The device of claim 2, wherein the topmost surface of the first conductive feature is level with a topmost surface of the third dielectric layer.

5. The device of claim 1, wherein the first dielectric layer comprises a nitride material, a carbide material, or a carbonitride material.

6. The device of claim 1, wherein the second material comprises an oxide material.

7. A device comprising:
- a gate stack over a substrate;
- an epitaxial source/drain region in the substrate adjacent the gate stack;
- a first dielectric layer over the gate stack, the first dielectric layer comprising a first material, the first material not comprising oxygen;
- a second dielectric layer over the first dielectric layer, the second dielectric layer comprising a second material, the second material being an oxygen-containing material;
- a third dielectric layer over the second dielectric layer, the third dielectric layer comprising a third material, the third material not comprising oxygen;
- a first conductive feature over and in electrical contact with the epitaxial source/drain region, wherein a topmost surface of the first conductive feature is level with a topmost surface of the third dielectric layer in a cross-sectional view; and a second conductive feature over the first conductive feature, the second conductive feature extending through the third dielectric layer, the second conductive feature being in physical contact with a topmost surface of the second dielectric layer and the topmost surface of the first conductive feature in the cross-sectional view.

8. The device of claim 7, wherein the second conductive feature is laterally shifted with respect to the first conductive feature.

9. The device of claim 7, further comprising a third conductive feature over the gate stack, wherein the third conductive feature extends through the first dielectric layer and the second dielectric layer, and wherein the third conductive feature is in physical contact with a topmost surface of the gate stack.

10. The device of claim 9, wherein a topmost surface of the second conductive feature is level with a topmost surface of the third conductive feature in the cross-sectional view.

11. A device comprising:

a gate stack over a substrate;

a first dielectric layer over the gate stack, the first dielectric layer comprising a first material;

a second dielectric layer over the first dielectric layer, the second dielectric layer comprising a second material different from the first material;

gate spacers along sidewalls of the gate stack, the first dielectric layer, and the second dielectric layer;

a third dielectric layer over the second dielectric layer;

a first conductive feature adjacent the gate spacers; and a second conductive feature contacting an upper surface of the first conductive feature, a bottom surface of the second conductive feature contacting an upper surface of the second dielectric layer, wherein the second conductive feature contacts a sidewall of the first conductive feature.

12. The device of claim 11, wherein the upper surface of the first conductive feature is level with an upper surface of the third dielectric layer.

13. The device of claim 11, wherein the third dielectric layer extends over the gate spacers.

14. The device of claim 11, wherein the third dielectric layer is a non-oxygen-containing material.

15. The device of claim 14, wherein the second dielectric layer is an oxygen-containing material.

16. The device of claim 15, wherein the first dielectric layer is a non-oxygen-containing material.

17. The device of claim 11, wherein the upper surface of the first conductive feature is higher than the upper surface of the second dielectric layer.

18. The device of claim 1, wherein the second conductive feature contacts a sidewall of the first conductive feature.

19. The device of claim 2, wherein the bottommost surface of the second conductive feature is level with a bottommost surface of the third dielectric layer.

20. The device of claim 7, wherein the second conductive feature contacts a sidewall of the first conductive feature.

* * * * *